(12) United States Patent
Kawashima et al.

(10) Patent No.: US 11,302,278 B2
(45) Date of Patent: Apr. 12, 2022

(54) DISPLAY DEVICE INCLUDING PIXEL AND ELECTRONIC DEVICE

(71) Applicant: SEMICONDUCTOR ENERGY LABORATORY CO., LTD., Atsugi (JP)

(72) Inventors: Susumu Kawashima, Kanagawa (JP); Koji Kusunoki, Kanagawa (JP); Kazunori Watanabe, Tokyo (JP); Kouhei Toyotaka, Kanagawa (JP); Naoto Kusumoto, Kanagawa (JP); Shunpei Yamazaki, Tokyo (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 16/644,103

(22) PCT Filed: Sep. 4, 2018

(86) PCT No.: PCT/IB2018/056715
§ 371 (c)(1),
(2) Date: Mar. 3, 2020

(87) PCT Pub. No.: WO2019/053549
PCT Pub. Date: Mar. 21, 2019

(65) Prior Publication Data
US 2020/0193928 A1 Jun. 18, 2020

(30) Foreign Application Priority Data
Sep. 15, 2017 (JP) .............................. JP2017-177462
Oct. 13, 2017 (JP) .............................. JP2017-199264
(Continued)

(51) Int. Cl.
G09G 3/36 (2006.01)
G02F 1/1362 (2006.01)
(Continued)

(52) U.S. Cl.
CPC ......... *G09G 3/3685* (2013.01); *G02F 1/1368* (2013.01); *G02F 1/13624* (2013.01);
(Continued)

(58) Field of Classification Search
CPC ........... G02F 1/13338; G02F 1/136213; G02F 1/13624; G02F 1/1368; G02F 2001/13685;
(Continued)

(56) References Cited

U.S. PATENT DOCUMENTS 6,563,480 B1    5/2003    Nakamura
7,224,339 B2    5/2007    Koyama et al.
(Continued)

FOREIGN PATENT DOCUMENTS

CN    101446723 A    6/2009
CN    102737586 A    10/2012
(Continued)

OTHER PUBLICATIONS

International Search Report (Application No. PCT/IB2018/056715) dated Dec. 18, 2018.
(Continued)

*Primary Examiner* — Chun-Nan Lin
(74) *Attorney, Agent, or Firm* — Fish & Richardson P.C.

(57) ABSTRACT

A display device capable of performing image processing is provided. A memory node is provided in each pixel included in the display device. An intended correction data is held in the memory node. The correction data is calculated by an external device and written into each pixel. The correction data is added to image data by capacitive coupling, and the resulting data is supplied to a display element. Thus, the display element can display a corrected image. The correction enables image upconversion, for example.

15 Claims, 24 Drawing Sheets

(30) Foreign Application Priority Data

Feb. 22, 2018 (JP) .............................. JP2018-029287
Apr. 11, 2018 (JP) .............................. JP2018-075819

(51) Int. Cl.

| | |
|---|---|
| G02F 1/1368 | (2006.01) |
| H01L 27/105 | (2006.01) |
| H01L 27/12 | (2006.01) |
| H01L 29/24 | (2006.01) |
| H01L 29/786 | (2006.01) |

(52) U.S. Cl.
CPC ........ *H01L 27/1052* (2013.01); *H01L 27/124* (2013.01); *H01L 27/1207* (2013.01); *H01L 27/1225* (2013.01); *H01L 27/1255* (2013.01); *H01L 29/24* (2013.01); *H01L 29/7869* (2013.01); *H01L 29/78633* (2013.01); *H01L 29/78648* (2013.01); *G02F 1/13685* (2021.01); *G09G 2300/0842* (2013.01); *G09G 2320/02* (2013.01)

(58) Field of Classification Search
CPC .......... G06F 1/1652; G09G 2300/0426; G09G 2300/0842; G09G 2300/0852; G09G 2310/08; G09G 2320/02; G09G 2340/0414; G09G 2340/0421; G09G 2340/0428; G09G 3/3659; G09G 3/3677; G09G 3/3685; G09G 3/3688; H01L 27/0688; H01L 27/1052; H01L 27/1207; H01L 27/1225; H01L 27/124; H01L 27/1255; H01L 29/24; H01L 29/78633; H01L 29/78645; H01L 29/78648; H01L 29/7869

See application file for complete search history.

(56) References Cited

U.S. PATENT DOCUMENTS

| | | | |
|---|---|---|---|
| 7,674,650 B2 | 3/2010 | Akimoto et al. | |
| 8,860,108 B2 | 10/2014 | Yamazaki et al. | |
| 8,884,852 B2 | 11/2014 | Yamamoto et al. | |
| 8,976,090 B2 | 3/2015 | Yamamoto et al. | |
| 9,842,546 B2* | 12/2017 | Kim | G09G 3/3233 |
| 10,140,940 B2* | 11/2018 | Aoki | H01L 27/1251 |
| 10,411,102 B2* | 9/2019 | Yamazaki | H01L 29/7869 |
| 2003/0057895 A1 | 3/2003 | Kimura | |
| 2006/0001614 A1 | 1/2006 | Hsueh et al. | |
| 2007/0072439 A1* | 3/2007 | Akimoto | H01L 21/02266 438/795 |
| 2007/0128583 A1* | 6/2007 | Miyazawa | G09G 3/3266 434/433 |
| 2009/0135323 A1* | 5/2009 | Yang | G09G 3/3659 349/37 |
| 2009/0141204 A1* | 6/2009 | Numao | G09G 3/3233 349/39 |
| 2010/0301326 A1 | 12/2010 | Miyairi et al. | |
| 2011/0164071 A1* | 7/2011 | Chung | G09G 3/3233 345/690 |
| 2012/0249509 A1* | 10/2012 | Kim | G09G 3/3659 345/211 |
| 2013/0057532 A1 | 3/2013 | Lee et al. | |
| 2013/0082906 A1 | 4/2013 | Toyomura et al. | |
| 2013/0127497 A1* | 5/2013 | Koyama | G06F 1/206 326/102 |
| 2013/0321248 A1 | 12/2013 | Kimura | |
| 2014/0326969 A1 | 11/2014 | Kim | |
| 2014/0340436 A1* | 11/2014 | Kumeta | G09G 3/3291 345/691 |
| 2015/0060847 A1 | 3/2015 | Miyake | |
| 2016/0064424 A1 | 3/2016 | Umezaki | |
| 2017/0045787 A1* | 2/2017 | Kita | G02F 1/134363 |
| 2020/0175358 A1 | 6/2020 | Kato et al. | |

FOREIGN PATENT DOCUMENTS

| | | |
|---|---|---|
| CN | 106462020 A | 2/2017 |
| EP | 2506247 A | 10/2012 |
| JP | 2007-096055 A | 4/2007 |
| JP | 2007-123861 A | 5/2007 |
| JP | 2009-128900 A | 6/2009 |
| JP | 2011-119674 A | 6/2011 |
| JP | 2012-058335 A | 3/2012 |
| JP | 2017-027012 A | 2/2017 |
| JP | 2019-045613 A | 3/2019 |
| JP | 2019-045614 A | 3/2019 |
| KR | 2009-0054300 A | 5/2009 |
| KR | 2012-0110387 A | 10/2012 |
| WO | WO-2015/163255 | 10/2015 |
| WO | WO-2019/030595 | 2/2019 |
| WO | WO-2019/043483 | 3/2019 |

OTHER PUBLICATIONS

Written Opinion (Application No. PCT/IB2018/056715) dated Dec. 18, 2018.

\* cited by examiner

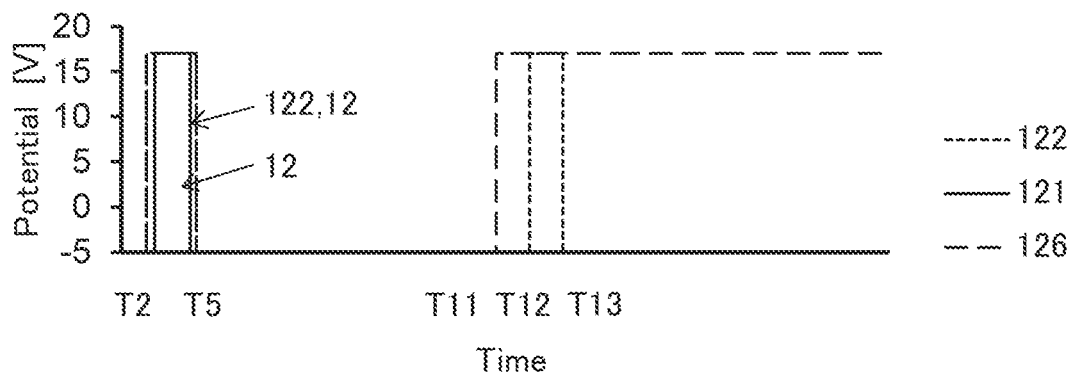
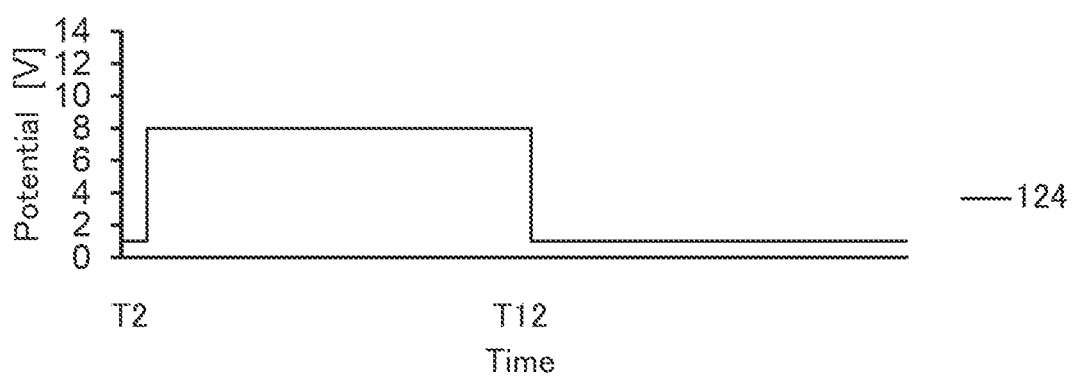
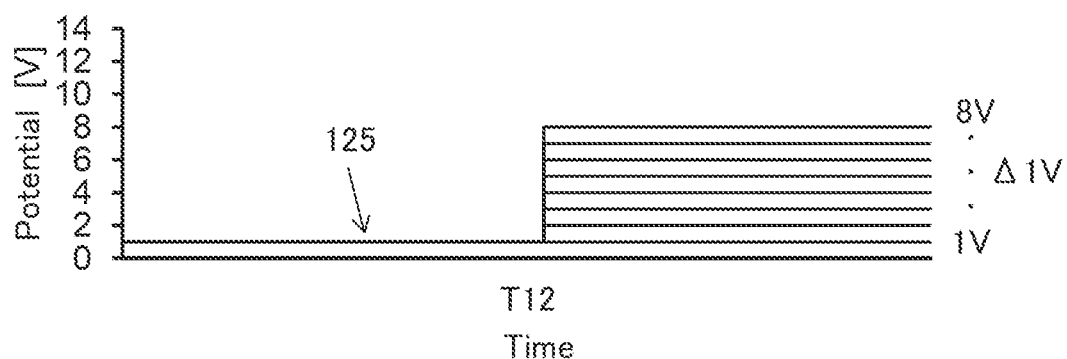
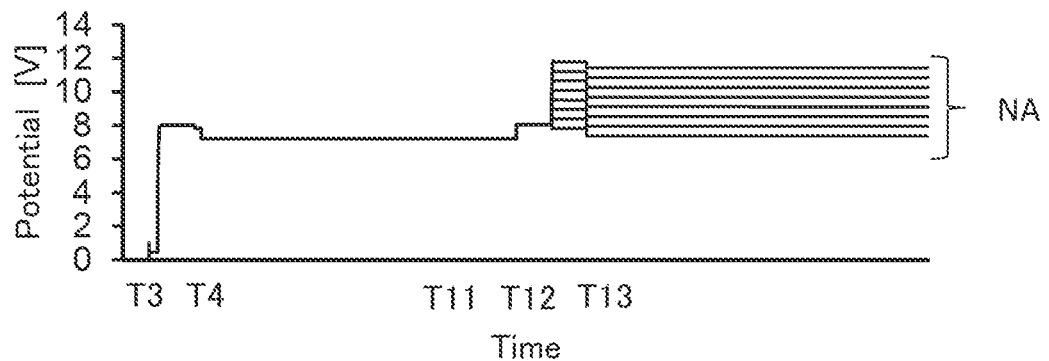

FIG. 16A1
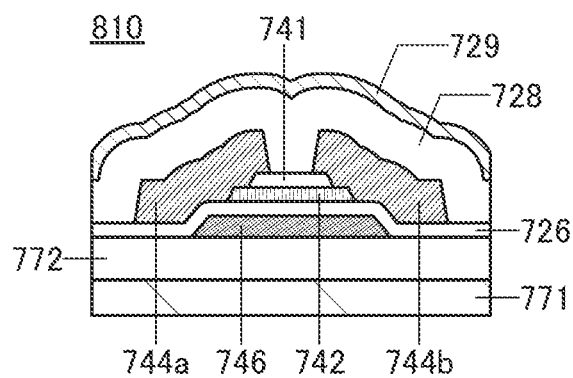
FIG. 16A2
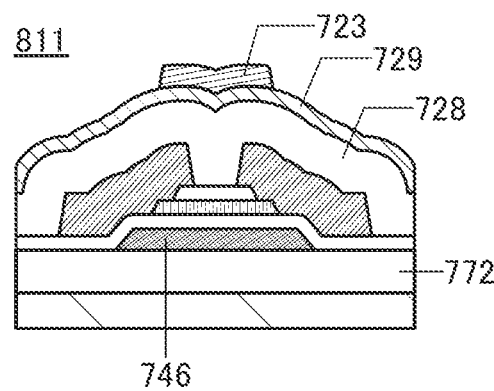
FIG. 16B1
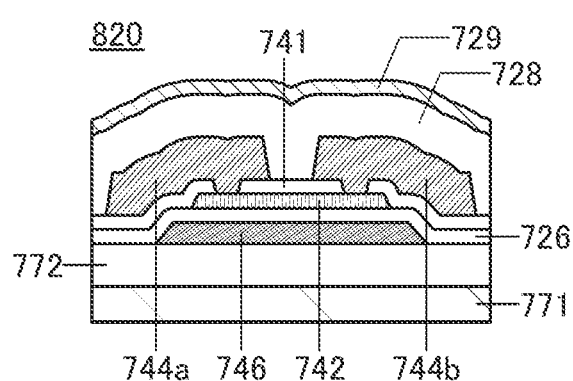
FIG. 16B2
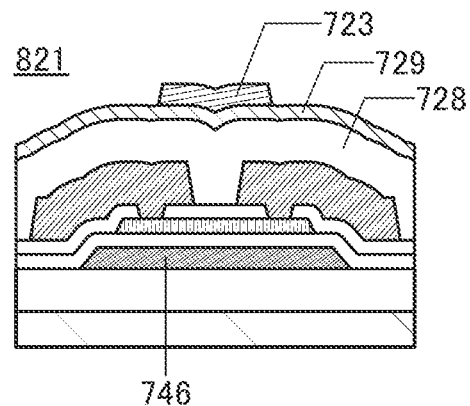
FIG. 16C1
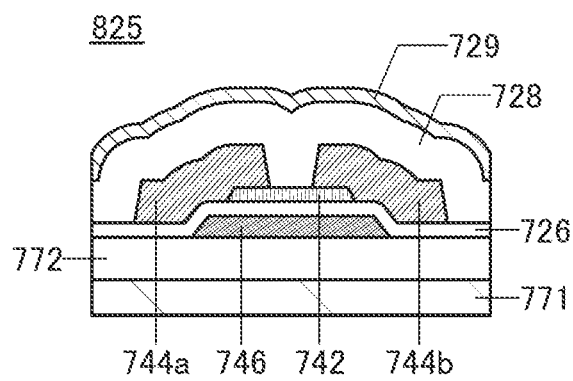
FIG. 16C2
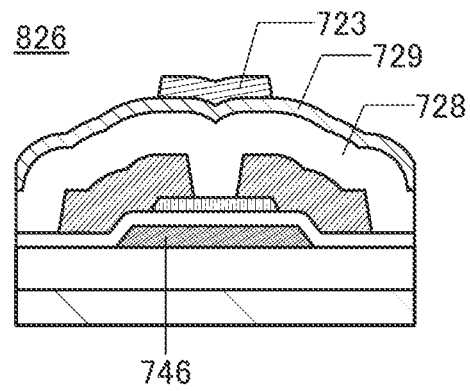

FIG. 17A1
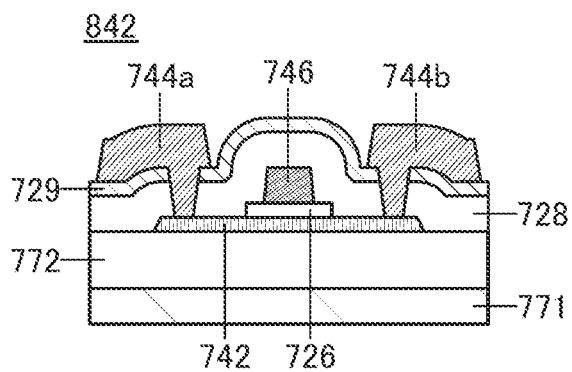
FIG. 17A2
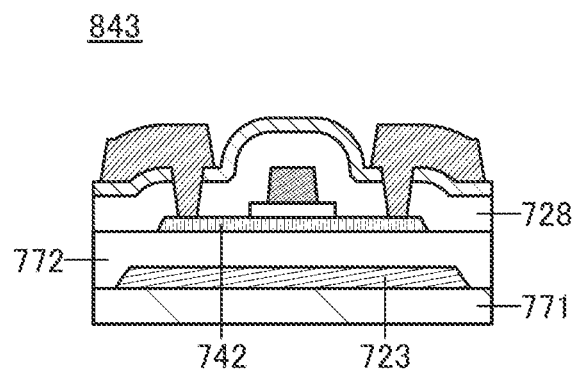
FIG. 17A3
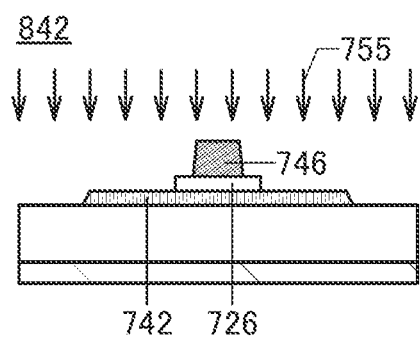
FIG. 17B1
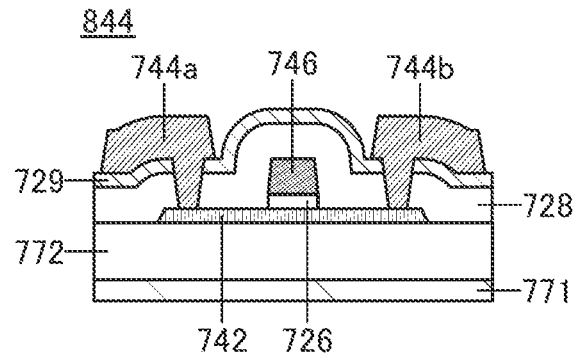
FIG. 17B2
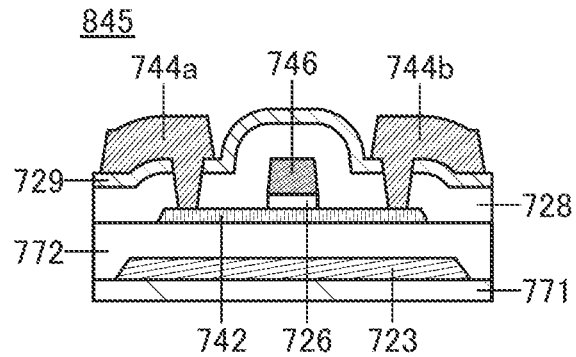
FIG. 17C1
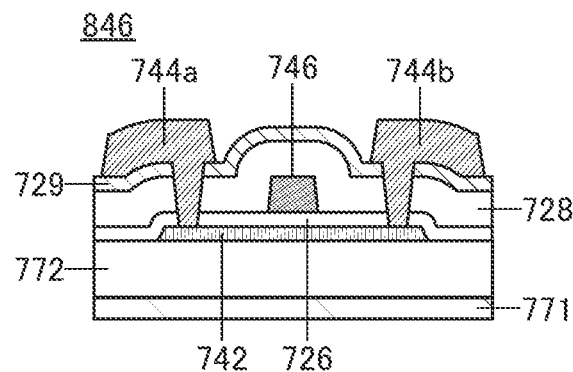
FIG. 17C2
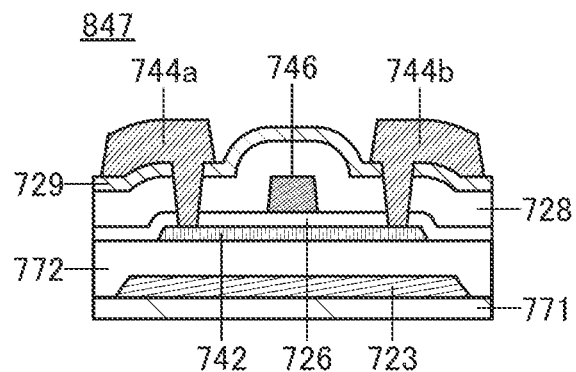

DISPLAY DEVICE INCLUDING PIXEL AND ELECTRONIC DEVICE

CROSS REFERENCE TO RELATED APPLICATIONS

This application is a U.S. National Phase Application under 35 U.S.C. § 371 of International Application PCT/IB2018/056715, filed on Sep. 4, 2018, which claims the benefit of foreign priority applications filed in Japan on Sep. 15, 2017, as Application No. 2017-177462, on Oct. 13, 2017, as Application No. 2017-199264, on Feb. 22, 2018, as Application No. 2018-029287, and on Apr. 11, 2018, and as Application No. 2018-075819, all of which are incorporated by reference

TECHNICAL FIELD

One embodiment of the present invention relates to a display device.

Note that one embodiment of the present invention is not limited to the above technical field. The technical field of one embodiment of the invention disclosed in this specification and the like relates to an object, a method, or a manufacturing method. Furthermore, one embodiment of the present invention relates to a process, a machine, manufacture, or a composition of matter. Specific examples of the technical field of one embodiment of the present invention disclosed in this specification include a semiconductor device, a display device, a liquid crystal display device, a light-emitting device, a lighting device, a power storage device, a memory device, an imaging device, a method for driving any of them, and a method for manufacturing any of them.

In this specification and the like, a semiconductor device generally means a device that can function by utilizing semiconductor characteristics. A transistor and a semiconductor circuit are embodiments of semiconductor devices. In some cases, a memory device, a display device, an imaging device, or an electronic device includes a semiconductor device.

BACKGROUND ART

A technique for fabricating a transistor with the use of a metal oxide formed over a substrate has been attracting attention. For example, Patent Documents 1 and 2 each disclose that a transistor containing zinc oxide or In—Ga—Zn-based oxide is used for a switching element or the like of a pixel in a display device.

Patent Document 3 discloses a memory device in which a transistor with an ultralow off-state current is used in a memory cell.

PATENT DOCUMENTS

Patent Document 1: Japanese Published Patent Application No. 2007-123861
Patent Document 2: Japanese Published Patent Application No. 2007-096055
Patent Document 3: Japanese Published Patent Application No. 2011-119674

DISCLOSURE OF INVENTION

With the increase in display resolution, hardware capable of displaying images with 8K4K resolution (7680×4320 pixels) or higher is being developed. Meanwhile, an enormous amount of data is required for high-resolution images; thus, technologies for peripherals such as an imaging device, a memory device, and a communication device need to be developed as well in order to make high-resolution display devices widely available.

One of techniques for producing high-resolution image data is image correction such as upconversion. With image correction, a low-resolution image can be converted into a pseudo higher-resolution image. Data for image correction is produced by peripheral equipment of a display device; the equipment dealing with original image data can employ a conventional technique.

Equipment performing image correction analyzes an enormous amount of image data and produces new image data; thus, the circuit scale and power consumption of the equipment are increased. Moreover, the amount of processing is sometimes too much to handle in real time, causing a delay in displaying images.

Although image correction presents such problems, the problems associated with power consumption and delay are possibly alleviated, for example, when functions related to the image correction are distributed among a plurality of devices.

In a display device, variations in characteristics of transistors included in pixels sometimes contribute to a reduction in display quality. Methods for compensating for variations in transistor characteristics are internal correction in which image data is corrected with a circuit included in a pixel, and external correction in which a correction value per pixel is obtained and then corrected image data is supplied to each pixel.

Although internal correction can be performed frame by frame, a shorter horizontal selection period in a higher-resolution display device makes it difficult to take sufficient time for the correction. External correction can be employed in a high-resolution display device but puts a large load on an external device because all image data needs to be subjected to the correction. Ideally, a high-resolution display device is preferably operated without correction; however, it is extremely difficult to eliminate variations in transistor characteristics, leading to a demand for a novel correction method.

In light of the above, an object of one embodiment of the present invention is to provide a display device capable of performing image processing. Another object is to provide a display device capable of performing upconversion operation. Another object is to provide a display device capable of correcting image data.

Another object is to provide a display device with low power consumption. Another object is to provide a highly reliable display device. Another object is to provide a novel display device or the like. Another object is to provide a method for driving any of the above display devices. Another object is to provide a novel semiconductor device or the like.

Note that the description of these objects does not preclude the existence of other objects. In one embodiment of the present invention, there is no need to achieve all these objects. Other objects will be apparent from and can be derived from the description of the specification, the drawings, the claims, and the like.

One embodiment of the present invention relates to a display device capable of performing image processing or a display device capable of correcting image data.

One embodiment of the present invention is a display device including a first transistor, a second transistor, a first capacitor, and a display element. One of a source and a drain of the first transistor is electrically connected to one electrode of the first capacitor. The other electrode of the first capacitor is electrically connected to one of a source and a drain of the second transistor. The one of the source and the drain of the second transistor is electrically connected to one electrode of the display element.

The display device may also include a second capacitor. One electrode of the second capacitor may be electrically connected to the one electrode of the display element.

The display device may also include a third transistor. One of a source and a drain of the third transistor may be electrically connected to the one of the source and the drain of the second transistor. The other of the source and the drain of the third transistor may be electrically connected to the one electrode of the display element.

The display device may also include a fourth transistor. One of a source and a drain of the fourth transistor may be electrically connected to the one electrode of the display element. The other of the source and the drain of the fourth transistor may be electrically connected to a wiring that supplies a constant potential.

It is preferred that at least the second transistor and the third transistor contain a metal oxide in their channel formation regions, and that the metal oxide contain In, Zn, and M (Al, Ti, Ga, Sn, Y, Zr, La, Ce, Nd, or Hf).

As the display element, a liquid crystal element can be used.

According to one embodiment of the present invention, it is possible to provide a display device capable of performing image processing, a display device capable of performing upconversion operation, or a display device capable of correcting image data.

Alternatively, it is possible to provide a display device with low power consumption, a highly reliable display device, a novel display device or the like, a method for driving any of the above display devices, or a novel semiconductor device or the like.

BRIEF DESCRIPTION OF DRAWINGS

In the accompanying drawings:
FIGS. 8A to 8D show pixel simulation results;
FIGS. 16A1, 16A2, 16B1, 16B2, 16C1, and 16C2 illustrate transistors;
FIGS. 17A1 to 17A3, 17B1, 17B2, 17C1, and 17C2 illustrate transistors;

BEST MODE FOR CARRYING OUT THE INVENTION

Figure 1:
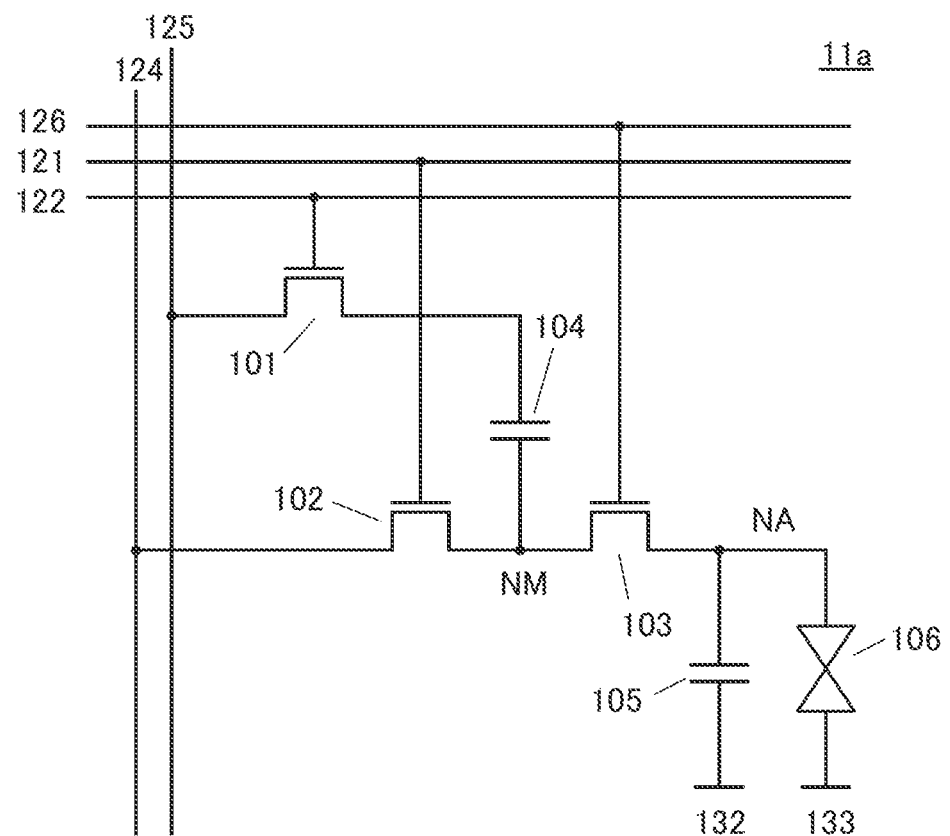
FIG. 1 illustrates a pixel circuit.

Embodiments will be described in detail with reference to the drawings. Note that the present invention is not limited to the following description, and it will be readily appreciated by those skilled in the art that modes and details can be modified in various ways without departing from the spirit and scope of the present invention. Therefore, the present invention should not be interpreted as being limited to the following description of the embodiments. In structures of the invention described below, the same portions or portions having similar functions may be denoted by the same reference numerals in different drawings, and description thereof is not repeated in some cases. Note that the same components may be denoted by different hatching patterns or shown without a hatching pattern in different drawings.

Embodiment 1

In this embodiment, a display device that is one embodiment of the present invention will be described with reference to drawings.

One embodiment of the present invention is a display device having a function of adding correction data to image data. A memory node is provided in each pixel, and intended correction data is held in the memory node. The correction data is produced in an external device and written into each pixel.

The correction data is added to image data owing to capacitive coupling, and the resulting data is supplied to a display element. Thus, a corrected image can be displayed with the display element. The correction performed in this manner enables image upconversion, for example, or can compensate for an image quality reduction due to characteristics variations of transistors included in the pixels.

FIG. 1 illustrates a pixel 11a that can be used for the display device of one embodiment of the present invention. The pixel 11a includes a transistor 101, a transistor 102, a transistor 103, a capacitor 104, a capacitor 105, and a liquid crystal element 106.

One of a source and a drain of the transistor 101 is electrically connected to one electrode of the capacitor 104. The other electrode of the capacitor 104 is electrically connected to one of a source and a drain of the transistor 102. The one of the source and the drain of the transistor 102 is electrically connected to one of a source and a drain of the transistor 103. The other of the source and the drain of the transistor 103 is electrically connected to one electrode of the capacitor 105. The one electrode of the capacitor 105 is electrically connected to one electrode of the liquid crystal element 106.

Here, a wiring to which the other electrode of the capacitor 104, the one of the source and the drain of the transistor 102, and the one of the source and the drain of the transistor 103 are connected is referred to as a node NM. A wiring to which the other of the source and the drain of the transistor 103, the one electrode of the capacitor 105, and the one electrode of the liquid crystal element 106 are connected is referred to as a node NA.

A gate of the transistor 101 is electrically connected to a wiring 122. A gate of the transistor 102 is electrically connected to a wiring 121. A gate of the transistor 103 is electrically connected to a wiring 126. The other of the source and the drain of the transistor 101 is electrically connected to a wiring 125. The other of the source and the drain of the transistor 102 is electrically connected to a wiring 124.

The other electrode of the capacitor 105 is electrically connected to a common wiring 132. The other electrode of the liquid crystal element 106 is electrically connected to a common wiring 133. Note that a given potential can be supplied to each of the common wirings 132 and 133, and the common wirings 132 and 133 may be electrically connected to each other.

The wirings 121, 122, and 126 can function as a signal line for controlling the operation of the corresponding transistor. The wiring 125 can function as a signal line for supplying image data. The wiring 124 can function as a signal line for writing data into the node NM.

The node NM is a memory node; a signal supplied to the wiring 124 can be written into the node NM when the transistor 102 is turned on and the transistor 103 is turned off. The use of a transistor with an ultralow off-state current as the transistors 102 and 103 enables the potential of the node NM to be held for a long time. As the transistor with an ultralow off-state current, a transistor containing a metal oxide in its channel formation region (hereinafter referred to as an OS transistor) can be used, for example.

Note that an OS transistor may also be used as the other transistor included in the pixel. Alternatively, as the transistors in the pixel, a transistor containing Si in its channel formation region (hereinafter referred to as a Si transistor) may be used, or both an OS transistor and a Si transistor may be used. Examples of a Si transistor include a transistor containing amorphous silicon and a transistor containing crystalline silicon (typically, low-temperature polysilicon or single crystal silicon).

When the display element is a reflective liquid crystal element, a silicon substrate can be used; thus, a Si transistor and an OS transistor can be formed to overlap each other at least partly. Consequently, the pixel density can be increased even with a comparatively large number of transistors.

As a semiconductor material used for an OS transistor, a metal oxide having an energy gap of 2 eV or more, preferably 2.5 eV or more, further preferably 3 eV or more can be used. A typical example is an oxide semiconductor containing indium, and a CAAC-OS or a CAC-OS described later can be used, for example. The CAAC-OS is suitable for a transistor required to have high reliability, for example, because of the stability of atoms composing crystals therein. The CAC-OS exhibits high mobility and thus is suitable for a transistor that is driven at high speed, for example.

An OS transistor exhibits ultralow off-state current characteristics because of a large energy gap. Unlike in a Si transistor, impact ionization, avalanche breakdown, short-channel effects, and the like do not occur in an OS transistor; accordingly, OS transistors can configure a highly reliable circuit. Moreover, variations in electrical characteristics due to crystallinity unevenness, which are caused in Si transistors, are less likely to occur in OS transistors.

A semiconductor layer included in an OS transistor can be, for example, a film of an In-M-Zn-based oxide that contains indium, zinc, and M (a metal such as aluminum, titanium, gallium, germanium, yttrium, zirconium, lanthanum, cerium, tin, neodymium, or hafnium).

In the case where an oxide semiconductor contained in the semiconductor layer is an In-M-Zn-based oxide, the atomic ratio of the metal elements of a sputtering target used to deposit the In-M-Zn oxide preferably satisfy In M and Zn M The atomic ratio of the metal elements (In:M:Zn) of such a sputtering target is preferably 1:1:1, 1:1:1.2, 3:1:2, 4:2:3, 4:2:4.1, 5:1:6, 5:1:7, or 5:1:8, for example. Note that the atomic ratio of the metal elements in the formed semiconductor layer may vary from the above atomic ratios of the metal elements of the sputtering target in a range of ±40%.

An oxide semiconductor with a low carrier density is used for the semiconductor layer. For example, the semiconductor layer can be formed using an oxide semiconductor whose carrier density is lower than or equal to $1 \times 10^{17}/cm^3$, preferably lower than or equal to $1 \times 10^{15}/cm^3$, further preferably lower than or equal to $1 \times 10^{13}/cm^3$, still further preferably lower than or equal to $1 \times 10^{11}/cm^3$, even further preferably lower than $1 \times 10^{10}/cm^3$ and is higher than or equal to $1 \times 10^{-9}/cm^3$. Such an oxide semiconductor is referred to as a highly purified intrinsic or substantially highly purified intrinsic oxide semiconductor. Such an oxide semiconductor has a low density of defect states and can thus be regarded as having stable characteristics.

Note that without limitation to the above examples, a material with an appropriate composition can be used depending on required semiconductor characteristics and electrical characteristics (e.g., field-effect mobility and threshold voltage) of the transistor. To obtain the required semiconductor characteristics of the transistor, the carrier density, impurity concentration, defect density, atomic ratio of a metal element to oxygen, interatomic distance, density, and the like of the semiconductor layer are preferably set to appropriate values.

When the oxide semiconductor contained in the semiconductor layer includes silicon or carbon, which are elements belonging to Group 14, oxygen vacancies are increased in the semiconductor layer and the semiconductor layer becomes n-type. Thus, the concentration of silicon or carbon (measured by secondary ion mass spectrometry) in the semiconductor layer is lower than or equal to $2 \times 10^{18}$ atoms/$cm^3$, preferably lower than or equal to $2 \times 10^{17}$ atoms/$cm^3$.

Alkali metal and alkaline earth metal may generate carriers when bonded to an oxide semiconductor, in which case the off-state current of the transistor might be increased. For that reason, the concentration of alkali metal or alkaline earth metal (measured by secondary ion mass spectrometry) in the semiconductor layer is lower than or equal to $1 \times 10^{18}$ atoms/$cm^3$, preferably lower than or equal to $2 \times 10^{16}$ atoms/$cm^3$.

When the oxide semiconductor contained in the semiconductor layer includes nitrogen, electrons serving as carriers are generated and the carrier density increases, so that the semiconductor layer easily becomes n-type. Consequently, a transistor including an oxide semiconductor that contains nitrogen is likely to have normally-on characteristics. Thus, the concentration of nitrogen (measured by secondary ion mass spectrometry) in the semiconductor layer is preferably lower than or equal to $5 \times 10^{18}$ atoms/$cm^3$.

The semiconductor layer may have a non-single-crystal structure, for example. Examples of the non-single-crystal structure include a CAAC-OS (c-axis-aligned crystalline oxide semiconductor) including c-axis-aligned crystals, a polycrystalline structure, a microcrystalline structure, and an amorphous structure. Among the non-single-crystal structure, an amorphous structure has the highest density of defect states, whereas the CAAC-OS has the lowest density of defect states.

An oxide semiconductor film with an amorphous structure has, for example, disordered atomic arrangement and no crystalline component. Alternatively, an oxide film with an amorphous structure has, for example, an absolutely amorphous structure and no crystal part.

Note that the semiconductor layer may be a mixed film including two or more of the following: a region with an amorphous structure, a region with a microcrystalline structure, a region with a polycrystalline structure, a CAAC-OS region, and a region with a single crystal structure. The mixed film has, for example, a single-layer structure or a stacked-layer structure including two or more of the above regions in some cases.

A structure of a cloud-aligned composite oxide semiconductor (CAC-OS), which is one embodiment of a non-single-crystal semiconductor layer, is described below.

The CAC-OS is, for example, an oxide semiconductor material with a composition in which elements are unevenly distributed in regions each having a size of greater than or equal to 0.5 nm and less than or equal to 10 nm, preferably greater than or equal to 1 nm and less than or equal to 2 nm, or a similar size. Note that in the following description of an oxide semiconductor, a state in which one or more metal elements are unevenly distributed and regions that include the metal element(s) and have a size of 0.5 nm to 10 nm, preferably 1 nm to 2 nm, or a similar size are mixed is referred to as a mosaic pattern or a patch-like pattern.

Note that an oxide semiconductor preferably contains at least indium, and particularly preferably contains indium and zinc. In addition, an oxide semiconductor may contain one or more of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like.

For example, of the CAC-OS, an In—Ga—Zn oxide with the CAC composition (such an In—Ga—Zn oxide may be particularly referred to as CAC-IGZO) has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0) or gallium zinc oxide ($Ga_{X4}Zn_{Y4}O_{Z4}$, where X4, Y4, and Z4 are real numbers greater than 0), and a mosaic pattern is formed. In the film, $InO_{X1}$ or $In_{X2}Zn_{Y2}O_{Z2}$ forming the mosaic pattern is evenly distributed. This composition is also referred to as a cloud-like composition.

That is, the CAC-OS is a composite oxide semiconductor with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to the element M in a second region, the first region has a higher In concentration than the second region.

Note that a compound containing In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of an oxide semiconductor. In part of the material composition of a CAC-OS containing In, Ga, Zn, and O, nanoparticle regions including Ga as a main component and nanoparticle regions including In as a main component are observed. These nanoparticle regions are randomly dispersed to form a mosaic pattern. Therefore, the crystal structure is a secondary element for the CAC-OS.

Note that in the CAC-OS, a stacked-layer structure including two or more films with different compositions is not included. For example, a two-layer structure of a film including In as a main component and a film including Ga as a main component is not included.

Note that a boundary between the region including $GaO_{X3}$ as a main component and the region including $In_{X2}Zn_{Y2}O_{Z2}$ or $InO_{X1}$ as a main component is not clearly observed in some cases.

When one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected metal element(s) as a main component(s) and nanoparticle regions including In as a main component are partly observed in the CAC-OS, and these nanoparticle regions are randomly dispersed to form a mosaic pattern in the CAC-OS.

The CAC-OS can be formed by a sputtering method under conditions where a substrate is not heated intentionally, for example. In the case of forming the CAC-OS by a sputtering method, one or more of an inert gas (typically, argon), an oxygen gas, and a nitrogen gas are used as a deposition gas. The ratio of the flow rate of an oxygen gas to the total flow rate of the deposition gas at the time of deposition is preferably as low as possible, and for example, the flow ratio of an oxygen gas is preferably higher than or equal to 0% and lower than 30%, further preferably higher than or equal to 0% and lower than or equal to 10%.

The CAC-OS is characterized in that no clear peak is observed in measurement using θ/2θ scan by an out-of-plane method, which is an X-ray diffraction (XRD) measurement method. That is, X-ray diffraction shows no alignment in the a-b plane direction and the c-axis direction in a measured region of the CAC-OS.

In an electron diffraction pattern of the CAC-OS that is obtained by irradiation with an electron beam with a probe diameter of 1 nm (also referred to as a nanometer-sized electron beam), a ring-like region with high luminance and a plurality of bright spots in the ring-like region are observed. The electron diffraction pattern thus indicates that the crystal structure of the CAC-OS includes a nanocrystal (nc) structure with no alignment in the plan-view and cross-sectional directions.

For example, an energy dispersive X-ray spectroscopy (EDX) mapping image confirms that regions including $GaO_{X3}$ as a main component and regions including $In_{X2}Zn_{Y2}O_{Z2}$ or $InO_{X1}$ as a main component are unevenly distributed and mixed in an In—Ga—Zn oxide with the CAC composition.

The CAC-OS has a structure different from that of an IGZO compound in which the metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor is exhibited. Accordingly, when regions including $In_{X2}Zn_{Y2}O_{Z2}$ or $InO_{X1}$ as a main component are distributed in an oxide semiconductor like a cloud, high field-effect mobility ($\mu$) can be achieved.

By contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be reduced and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current (Ion) and high field-effect mobility ($\mu$) can be achieved.

A semiconductor element including a CAC-OS has high reliability; thus, the CAC-OS is suitably used as a material for a variety of semiconductor devices.

In the pixel 11a, correction data written into the node NM is capacitively coupled with image data supplied from the wiring 125, and the resulting data can be output to the node NA. Note that the transistor 101 can have a function of selecting a pixel and supplying image data. The transistor 103 can function as a switch for controlling the operation of the liquid crystal element 106.

For example, if the level of a signal written into the node NM from the wiring 124 is higher than the threshold voltage of the transistor 102, the transistor 102 is sometimes turned on and thus the liquid crystal element 106 operates before image data is written. For that reason, it is preferred that the transistor 103 be provided and that the transistor 103 be turned on to operate the liquid crystal element 106 after the potential of the node NM is fixed.

In other words, when intended correction data is stored in the node NM in advance, the correction data can be added to the supplied image data. Note that correction data is sometimes attenuated by a component on the transmission path; hence, the data is preferably produced in consideration of the attenuation.

Figure 2A:
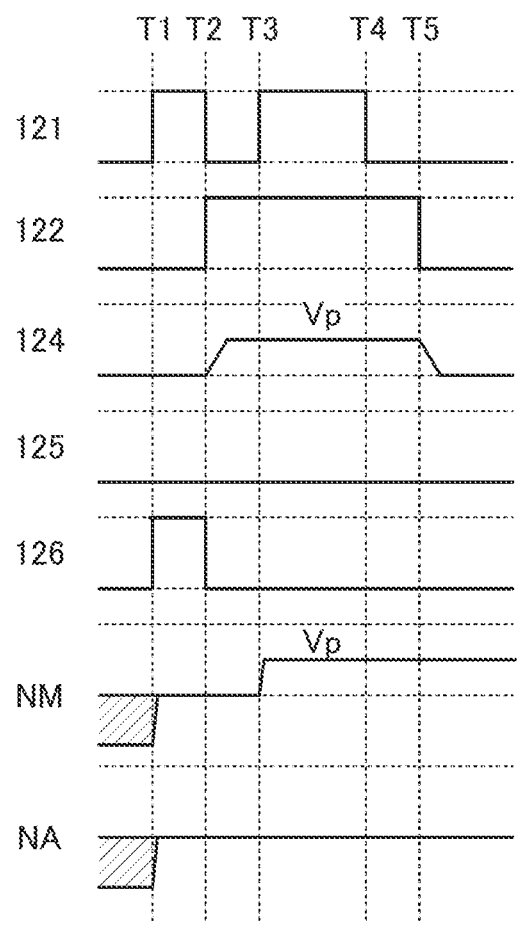
FIGS. 2A and 2B are timing charts each illustrating operation of a pixel circuit.
Figure 2B:
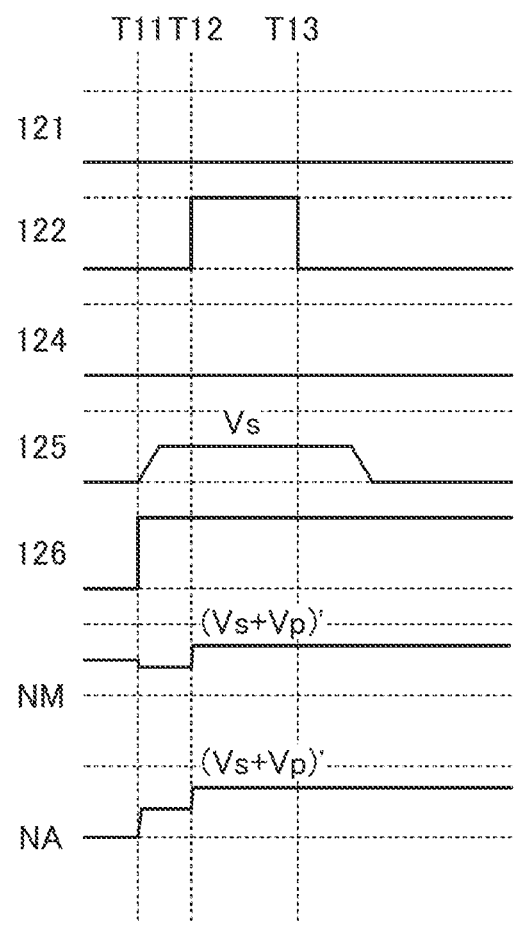

The details of the operation of the pixel 11a are described using timing charts shown in FIGS. 2A and 2B. Although a given positive or negative signal can be used as correction data (Vp) supplied to the wiring 124, the case where a positive signal is supplied is described here. In the following description, "H" represents a high potential and "L" represents a low potential.

First, the operation of writing the correction data (Vp) into the node NM is described with reference to FIG. 2A. This operation is preferably performed frame by frame for the purpose of image data correction such as upconversion.

Note that here, detailed potential changes caused by the circuit configuration, operation timing, or the like are not considered in potential sharing, coupling, or loss. A potential change due to capacitive coupling depends on the ratio of the capacitance of the potential supplier to that of the potential receiver; however, for simplicity, the capacitances of the node NM and the node NA are assumed to be sufficiently small.

At Time T1, the potential of the wiring 121 is set to "H", the potential of the wiring 122 is set to "L", the potential of the wiring 125 is set to "L", and the potential of the wiring 126 is set to "H"; thus, the transistor 102 and the transistor 103 are turned on, and the potential of the node NA becomes the potential of the wiring 124. At this time, the potential of the wiring 124 is set to a reset potential (e.g., a reference potential such as 0 V), whereby the operation of the liquid crystal element 106 can be reset.

Note that before Time T1, the display operation of the liquid crystal element 106 in the previous frame is performed.

At Time T2, the potential of the wiring 121 is set to "L", the potential of the wiring 122 is set to "H", the potential of the wiring 125 is set to "L", and the potential of the wiring 126 is set to "L"; thus, the transistor 101 is turned on, and the potential of the other electrode of the capacitor 104 becomes "L". This operation is reset operation for performing subsequent capacitive coupling operation.

At Time T3, the potential of the wiring 121 is set to "H", the potential of the wiring 122 is set to "H", the potential of the wiring 125 is set to "L", and the potential of the wiring 126 is set to "L"; hence, the transistor 102 is turned on, and the potential of the wiring 124 (the correction data (Vp)) is written into the node NM. Note that the potential of the wiring 124 is preferably fixed at the intended value (the correction data (Vp)) after Time T2 before Time T3.

At Time T4, the potential of the wiring 121 is set to "L", the potential of the wiring 122 is set to "H", the potential of the wiring 125 is set to "L", and the potential of the wiring 126 is set to "L"; thus, the transistor 102 is turned off, and the correction data (Vp) is held in the node NM.

At Time T5, the potential of the wiring 121 is set to "L", the potential of the wiring 122 is set to "L", the potential of the wiring 125 is set to "L", and the potential of the wiring 126 is set to "L"; accordingly, the transistor 101 is turned off, and the operation of writing the correction data (Vp) is completed.

Next, the operation of correcting image data (Vs) and the display operation of the liquid crystal element 106 are described with reference to FIG. 2B.

At Time T11, the potential of the wiring 121 is set to "L", the potential of the wiring 122 is set to "L", the potential of the wiring 124 is set to "L", and the potential of the wiring 126 is set to "H"; hence, the transistor 103 is turned on, and the potential of the node NM is shared with the node NA. Note that the correction data (Vp) held in the node NM is preferably set in consideration of potential sharing with the node NA.

At Time T12, the potential of the wiring 121 is set to "L", the potential of the wiring 122 is set to "H", the potential of the wiring 124 is set to "L", and the potential of the wiring 126 is set to "H"; thus, the transistor 101 is turned on, and the potential of the wiring 125 is added to the potential of the node NA by capacitive coupling through the capacitor 104. That is, the potential of the node NA becomes a potential (Vs+Vp)' obtained by addition of the shared potential of the correction data (Vp) to the image data (Vs). Note that the potential (Vs+Vp)' includes a potential variation due to capacitive coupling between wirings, for example.

At Time T13, the potential of the wiring 121 is set to "L", the potential of the wiring 122 is set to "L", the potential of the wiring 124 is set to "L", and the potential of the wiring 126 is set to "H"; accordingly, the transistor 101 is turned off, and the potential (Vs+Vp)' is held in the node NA. Then, the display operation based on the potential is performed by the liquid crystal element 106.

The above is the description for the operation of correcting the image data (Vs) and the display operation of the liquid crystal element 106. Note that the aforementioned operation of writing the correction data (Vp) and the operation of inputting the image data (Vs) may be concurrently performed; however, it is preferable to perform the operation of inputting the image data (Vs) after the correction data (Vp) is written into all pixels. As described in detail below, the same image data can be supplied to a plurality of pixels at the same time in one embodiment of the present invention; thus, writing the correction data (Vp) into all the pixels first achieves higher operating speed.

Note that when upconversion or the like is not performed, the display operation of the liquid crystal element 106 may be performed by supplying image data to the wiring 124 and controlling the on/off states of the transistors 102 and 103. In that case, the transistor 101 is off all the time.

The configuration and operation of the pixel 11a described above are effective in upconverting images. Upconversion using the pixel 11a is described with reference to FIGS. 3A and 3B.

For example, the pixel count of an 8K4K display device is four times that of a 4K2K display device (3840×2160 pixels). That is, when an 8K4K display device is to simply display image data that is intended to be displayed on one pixel of a 4K2K display device, four pixels in the horizontal and vertical directions display the same image data.

Figure 3A:
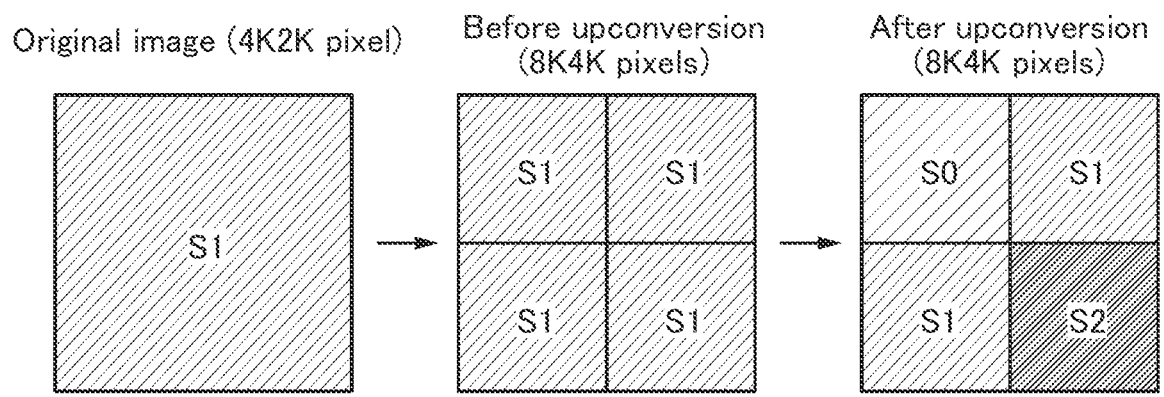
FIGS. 3A and 3B are diagrams illustrating upconversion.

FIG. 3A illustrates an image with and without upconversion. From the left, FIG. 3A illustrates a state where an original image (image data S1) is displayed on one pixel in a 4K2K display device, a state where the image data S1 without upconversion is displayed on four pixels in an 8K4K display device, and a state where upconverted image data S0 to S2 are displayed on the four pixels in the 8K4K display device.

As illustrated in FIG. 3A, the image data S1 is displayed on all the four pixels before upconversion, whereas the image data S0 to S2 are applied to the pixels after upconversion, resulting in higher resolution.

Figure 3B:
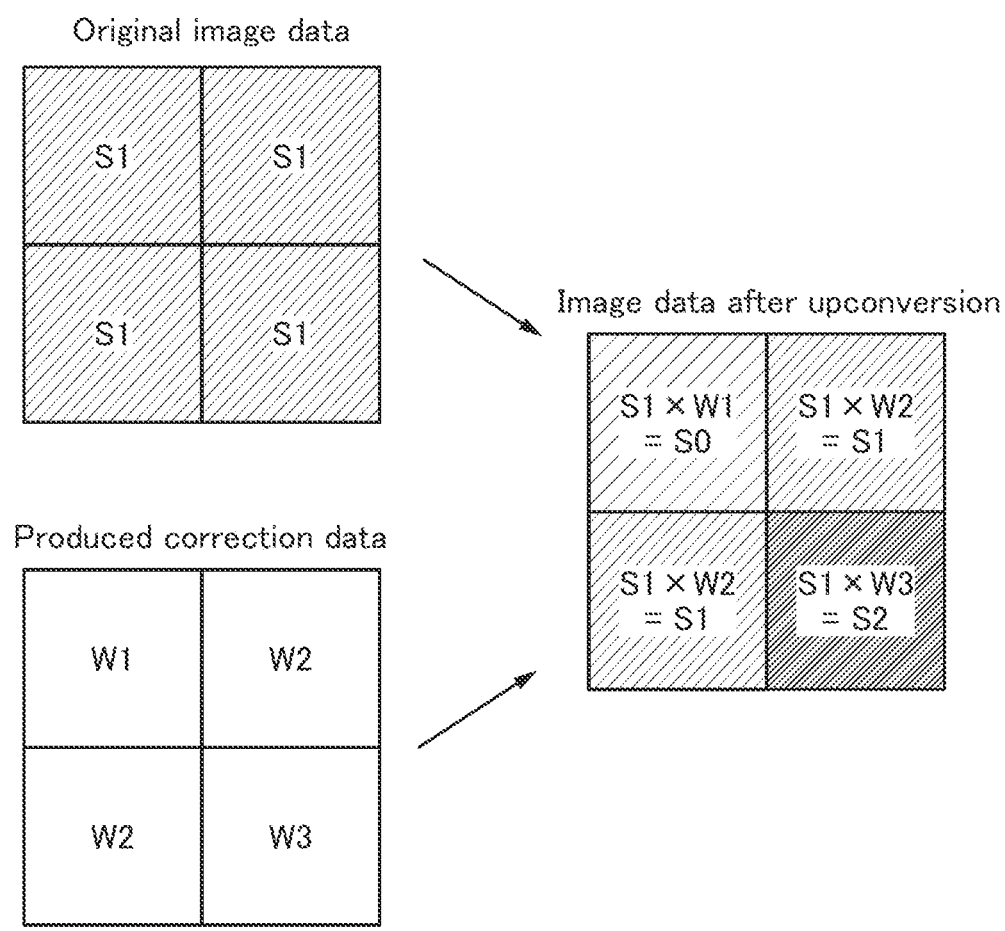

FIG. 3B illustrates the upconversion operation in the pixel 11a. Since given correction data can be added to image data in the pixel 11a as described above, the image data S1, which corresponds to the original image, is supplied to each pixel without change.

Moreover, correction data W1 to W3 are supplied to the pixels. Here, there is no particular limitation on a method for producing the correction data W1 to W3. The correction data may be produced in real time with an external device, or correction data stored in a memory medium may be read out and synchronized with the image data S1.

Then, the aforementioned operation of the pixel 11a is performed, whereby each correction data is added to the image data and thus the new image data S0 to S2 are generated. Consequently, display with the data obtained by upconversion of the original image data can be performed.

In conventional upconversion with external correction, an external device is put under a heavy load to produce new image data itself. By contrast, in one embodiment of the present invention described above, image data to be supplied is not changed, and new image data is produced in a pixel supplied with correction data; thus, the load on an external device can be small. Moreover, the operation for producing new image data in a pixel can be executed with a small number of steps; hence, one embodiment of the present invention is applicable even to a display device that has a large number of pixels and a short horizontal period.

Figure 4A:
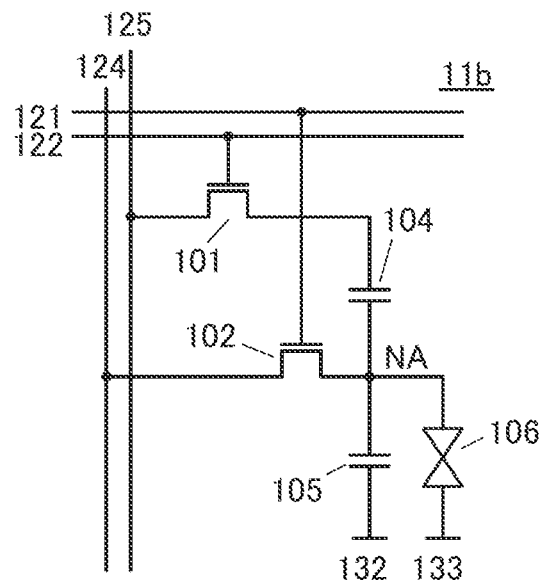
FIGS. 4A and 4B illustrate pixel circuits.

The pixel of one embodiment of the present invention can also have a configuration of a pixel 11b illustrated in FIG. 4A. The pixel 11b has a configuration in which the transistor 103 and the wiring 126 are omitted from the pixel 11a.

The transistor 103 in the pixel 11a is a switch for avoiding accidental operation of the liquid crystal element 106 accompanied by supply of the correction data (Vp); the transistor 103 can be omitted when such unintentional operation of the liquid crystal element 106 can be prevented from being recognized if it ever happens. For example, backlight can be turned off while the correction data (Vp) is supplied.

Figure 4B:
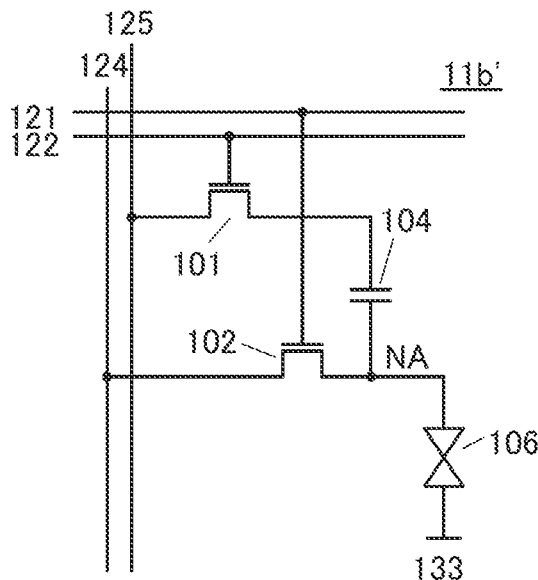

Alternatively, the capacitor 105 may be omitted as in a pixel 11b' illustrated in FIG. 4B. As described above, an OS transistor can be used as the transistors connected to the node NM. Since the leakage current of the OS transistor is extremely low, image data can be held for a comparatively long time even when the capacitor 105 functioning as a storage capacitor is omitted.

This configuration is also effective when the frame frequency is high and a period for holding image data is relatively short (e.g., field sequential driving). Omitting the capacitor 105 can increase the aperture ratio or the transmittance of the pixel. Note that the capacitor 105 may be omitted in the configuration of any other pixel circuit shown in this specification.

Figure 4C:
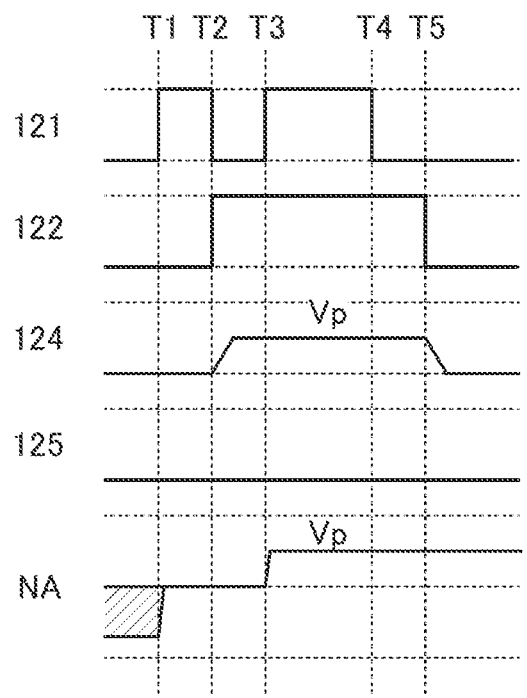
FIGS. 4C and 4D are timing charts.
Figure 4D:
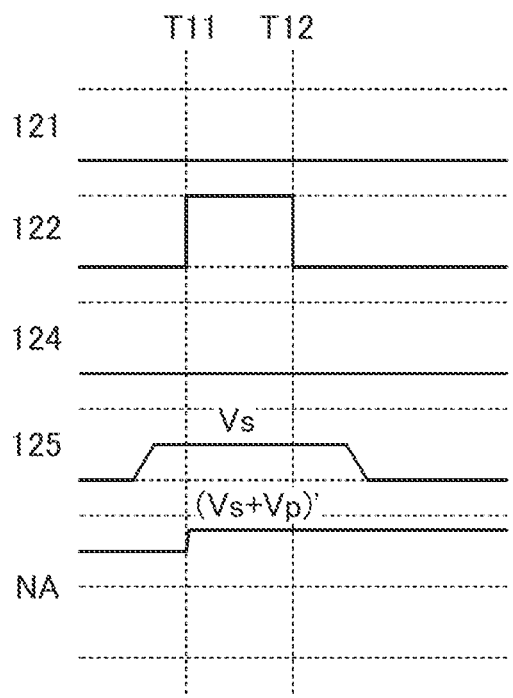

The operation of correcting the image data (Vs) and the display operation of the liquid crystal element 106 are described with reference to FIGS. 4C and 4D.

At Time T1, the potential of the wiring 121 is set to "H", the potential of the wiring 122 is set to "L", the potential of the wiring 124 is set to "L", and the potential of the wiring 125 is set to "L"; thus, the transistor 102 is turned on, and the potential of the node NA becomes the potential of the wiring 124. At this time, the potential of the wiring 124 is set to a reset potential (e.g., "L"), whereby the operation of the liquid crystal element 106 can be reset.

Note that before Time T1, the display operation of the liquid crystal element 106 in the previous frame is performed.

At Time T2, the potential of the wiring 121 is set to "L", the potential of the wiring 122 is set to "H", the potential of the wiring 124 is set to "Vp", and the potential of the wiring 125 is set to "L"; thus, the transistor 101 is turned on, and the potential of the other electrode of the capacitor 104 becomes "L". This operation is reset operation for performing subsequent capacitive coupling operation.

At Time T3, the potential of the wiring 121 is set to "H", the potential of the wiring 122 is set to "H", the potential of the wiring 124 is set to "Vp", and the potential of the wiring 125 is set to "L"; hence, the potential of the wiring 124 (the correction data (Vp)) is written into the node NA.

At Time T4, the potential of the wiring 121 is set to "L", the potential of the wiring 122 is set to "H", the potential of the wiring 124 is set to "Vp", and the potential of the wiring 125 is set to "L"; thus, the transistor 102 is turned off, and the correction data (Vp) is held in the node NA.

At Time T5, the potential of the wiring 121 is set to "L", the potential of the wiring 122 is set to "L", and the potential of the wiring 125 is set to "L"; accordingly, the transistor 101 is turned off, and the operation of writing the correction data (Vp) is completed.

Next, the operation of correcting the image data (Vs) and the display operation of the liquid crystal element 106 are described. Note that an intended potential is supplied to the wiring 125 at an appropriate timing.

At Time T11, the potential of the wiring 121 is set to "L", the potential of the wiring 122 is set to "H", and the potential of the wiring 124 is set to "L"; thus, the transistor 101 is turned on, and the potential of the wiring 125 is added to the potential of the node NA by capacitive coupling through the capacitor 104. That is, the potential of the node NA becomes the potential (Vs+Vp)' obtained by adding the correction data (Vp) to the image data (Vs). Note that the potential (Vs+Vp)' also includes a potential variation due to capacitive coupling between wirings, for example.

At Time T12, the potential of the wiring 121 is set to "L", the potential of the wiring 122 is set to "L", and the potential of the wiring 124 is set to "L"; accordingly, the transistor 101 is turned off, and the potential (Vs+Vp)' is held in the node NA. Then, the display operation based on the potential is performed by the liquid crystal element 106.

Figure 5A:
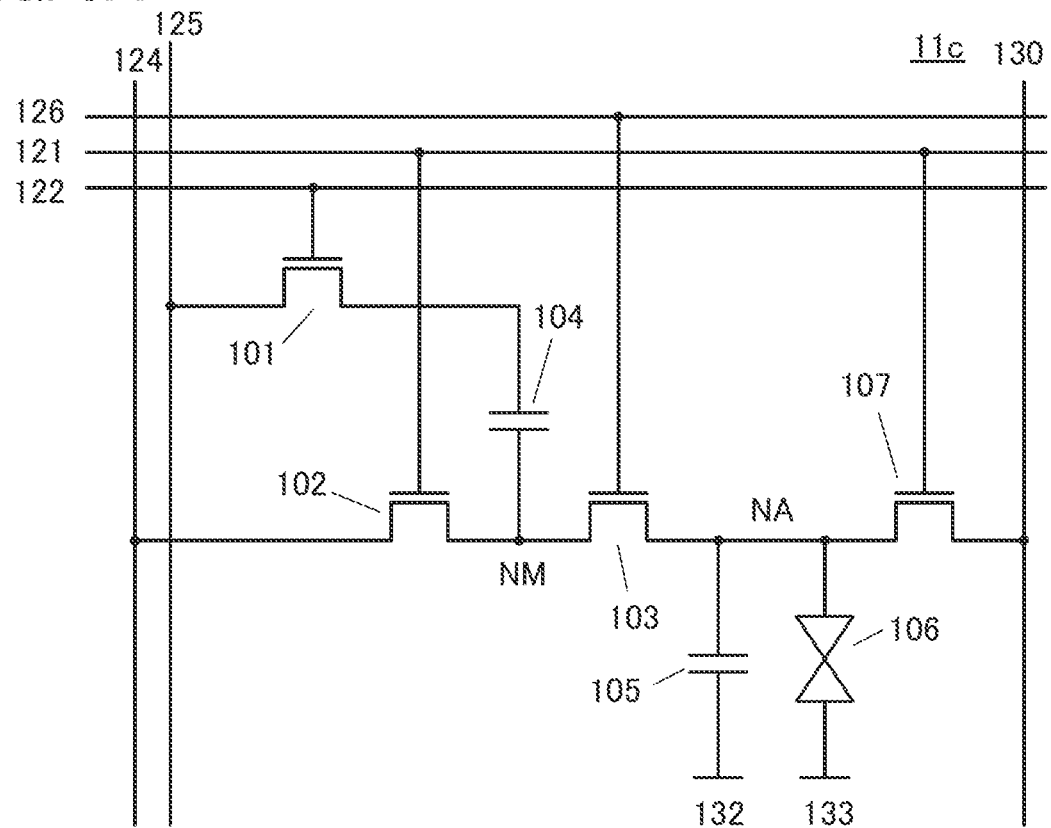
FIGS. 5A and 5B illustrate pixel circuits.

Alternatively, the pixel of one embodiment of the present invention can have a configuration of a pixel 11c illustrated in FIG. 5A. The pixel 11c has a configuration in which a transistor 107 and a wiring 130 are added to the pixel 11a.

In the pixel 11c, a reset potential is supplied to the wiring 130 to turn on the transistor 107, whereby the operation of resetting the liquid crystal element 106 can be performed. With the configuration, the operations of rewriting potentials of the node NM and the node NA can be controlled independently, and thus a period for the display operation of the liquid crystal element 106 can be lengthened.

In the case where the operation of correcting an image is not performed, the display operation of the liquid crystal element 106 may be performed in such a manner that image data is supplied from the wiring 130 to control the on/off states of the transistor 107. In that case, the transistor 103 is off all the time.

Figure 5B:
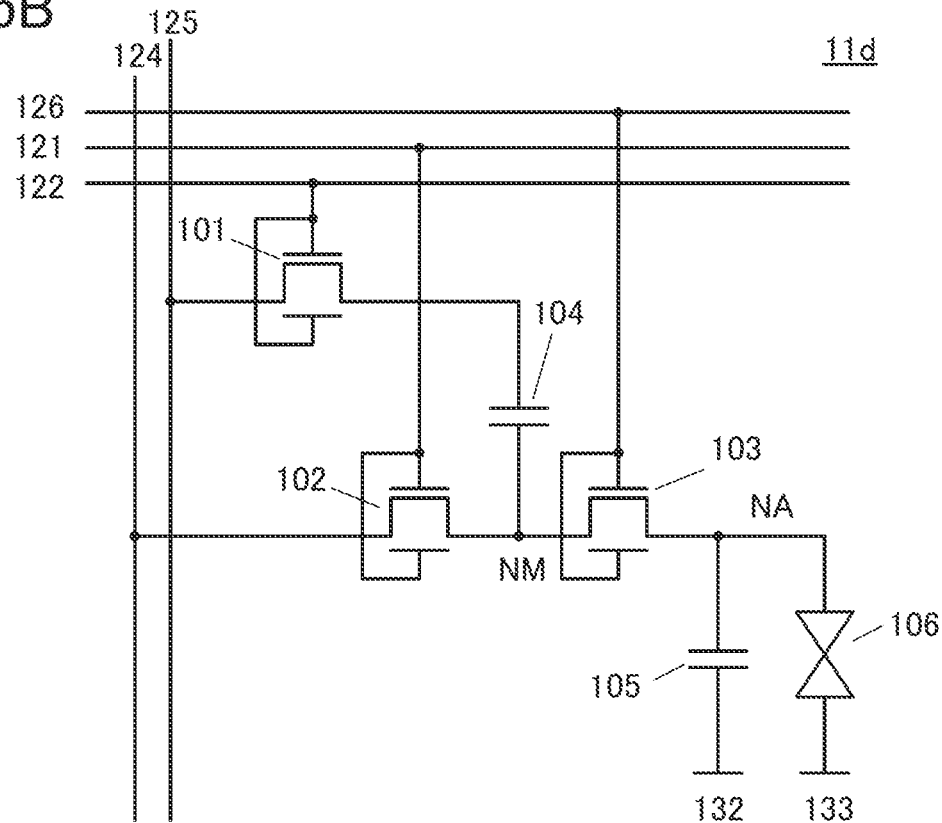

Alternatively, the pixel of one embodiment of the present invention can have a configuration of a pixel 11d illustrated in FIG. 5B. The pixel 11d has a structure in which each transistor is provided with a back gate. The back gate is electrically connected to a corresponding front gate and has an effect of increasing on-state current. Alternatively, different fixed potentials may be supplied to the back gate and the front gate. Such a structure enables control of the threshold voltages of the transistors. Although all of the transistors have a back gate in FIG. 5B, a transistor not provided with a back gate may also be included. The transistor including a back gate is also effective for the other pixel circuits in this embodiment.

In the liquid crystal element 106 used in a display device of one embodiment of the present invention, alternating-current driving in which the polarity is inverted every frame is preferably performed in order to prevent burn-in. In the case where the same image is displayed in consecutive frames, for example, the operation shown in Table 1 or Table 2 is performed. Note that a and b in Table 1 and Table 2 each represent a specific potential.

Table 1 shows an example of a case where operation using a positive signal is performed in an N-th frame (N is an integer of 1 or more). In an (N+1)th frame, operation using a negative signal shown in Mode A, B, or C is performed, and the correction data (Vp) and/or the image data (Vs) is adjusted and supplied such that the absolute value of the potential of the node NA in the (N+1)th frame becomes equal to that in the N-th frame. Table 2 shows an example of a case where operation using a negative signal is performed in the N-th frame. In the (N+1)th frame, operation is performed such that the absolute value of the potential of the node NA in the N+1 frame becomes equal to that in the N-th frame. Note that a common potential is fixed to be constant in the operations.

Note that in the case where the operation is performed in Mode B, the image data (Vs) is adjusted, and thus a still image or the like can be displayed without rewriting the correction data (Vp) between the frames.

TABLE 1

| Frame | N | N + 1 | | |
|---|---|---|---|---|
| Mode | | A | B | C |
| Image data (Vs) | +a | −a | −a − 2b | +a |
| Correction data (Vp) | +b | −b | +b | −2a − b |
| Node NA | +a + b | −a − b | −a − b | −a − b |

TABLE 2

| Frame | N | N + 1 | | |
|---|---|---|---|---|
| Mode | | A | B | C |
| Image data (Vs) | −a | +a | +a + 2b | −a |
| Correction data (Vp) | −b | +b | −b | +2a + b |
| Node NA | −a − b | +a + b | +a + b | +a + b |

Figure 6A:
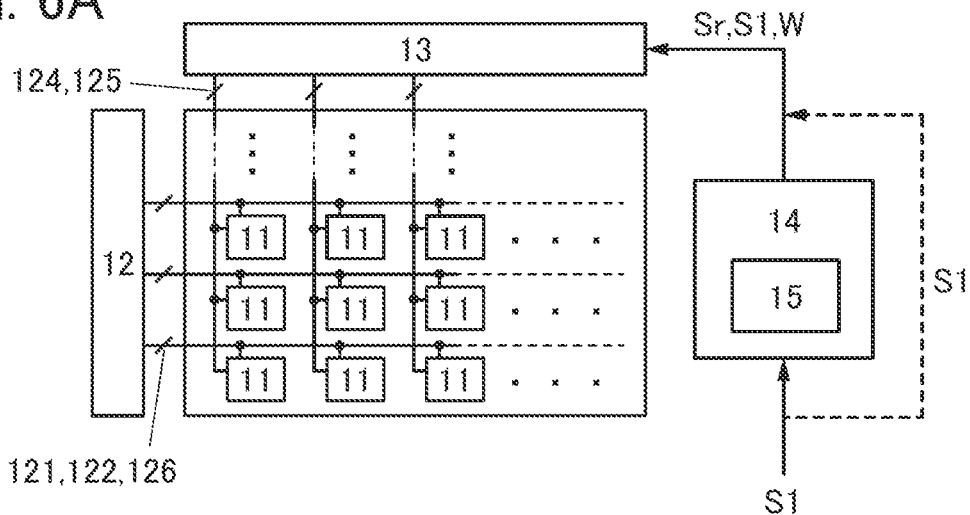
FIGS. 6A to 6C are block diagrams each illustrating a display device.
Figure 6B:
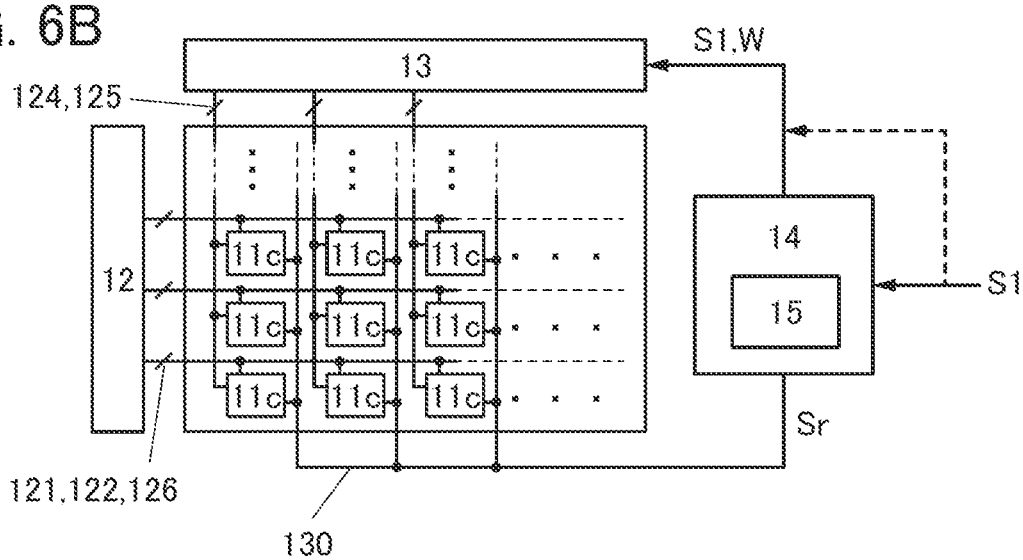
Figure 6C:
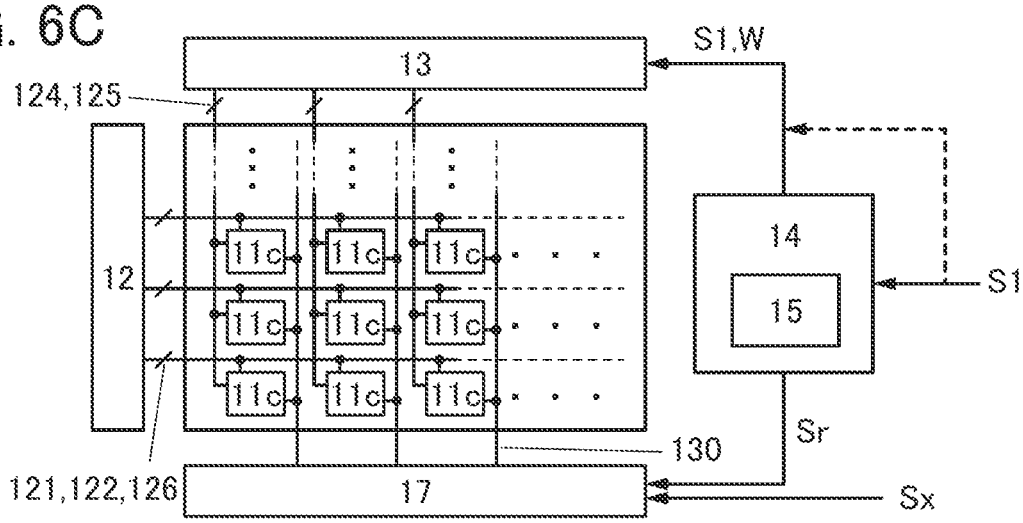

FIGS. 6A to 6C are block diagrams each illustrating a display device in which the pixel 11a, the pixel 11b, or the pixel 11c can be used. Each display device is described below. Note that repeated description of the same components between the figures is omitted.

FIG. 6A illustrates an example of a display device including a pixel array provided with the pixels 11 in a matrix, a row driver 12, a column driver 13, a circuit 14, and a circuit 15. The wirings 121, 122, 126, and the like are electrically connected to the row driver 12. The wirings 124, 125, and the like are electrically connected to the column driver 13. The pixel 11a or the pixel 11b can be used as the pixel 11.

For the row driver 12 and the column driver 13, a shift register circuit can be used, for example. The circuit 14 has a function of generating correction data. Note that the circuit 14 can also be referred to as an external device that generates correction data. The circuit 15 can supply, to the column driver 13, a reset potential Sr that resets the operation of the liquid crystal element 106.

The image data S1 described with reference to FIGS. 3A and 3B is input to the circuit 14, and the circuit 14 outputs the image data S1 and the generated correction data W to the column driver 13. Note that the image data S1 may be input to the column driver 13 without through the circuit 14.

The circuit 14 may include a neural network. When a deep neural network that has learned an enormous number of images as teacher data is used, for example, the correction data W with high accuracy can be generated.

FIG. 6B illustrates an example of a display device including a pixel array provided with the pixels 11c in a matrix, the row driver 12, the column driver 13, the circuit 14, and the circuit 15. The circuit 15 can supply the reset potential Sr to the wiring 130.

FIG. 6C illustrates an example of a display device including a pixel array provided with the pixels 11c in a matrix, the row driver 12, the column driver 13, a column driver 17, the circuit 14, and the circuit 15. The wiring 130 is electrically connected to the column driver 17.

For the column driver 17, a shift register circuit can be used, for example. The circuit 15 can supply the reset potential Sr to the column driver 17. In the case where the operation of correcting an image is not performed, image data Sx is supplied to the column driver 17, and thus the display operation of the liquid crystal element 106 can be performed.

Note that although FIGS. 6A to 6C each exemplify the structure including the circuits 14 and 15, one circuit may serve as both of the circuits.

The display device of one embodiment of the present invention can generate an upconverted image in the pixel as illustrated in FIGS. 3A and 3B. Therefore, image data supplied to the pixel is low-resolution image data, and the same image data is supplied to a plurality of pixels. In the example illustrated in FIGS. 3A and 3B, the same image data is supplied to four pixels in the horizontal and perpendicular directions. Although the same image data may be supplied to each of signal lines connected to the pixels in this case, when the signal lines to which the same image data is supplied are electrically connected to each other, the operation of writing the image data can be performed at higher speed.

Figure 7:
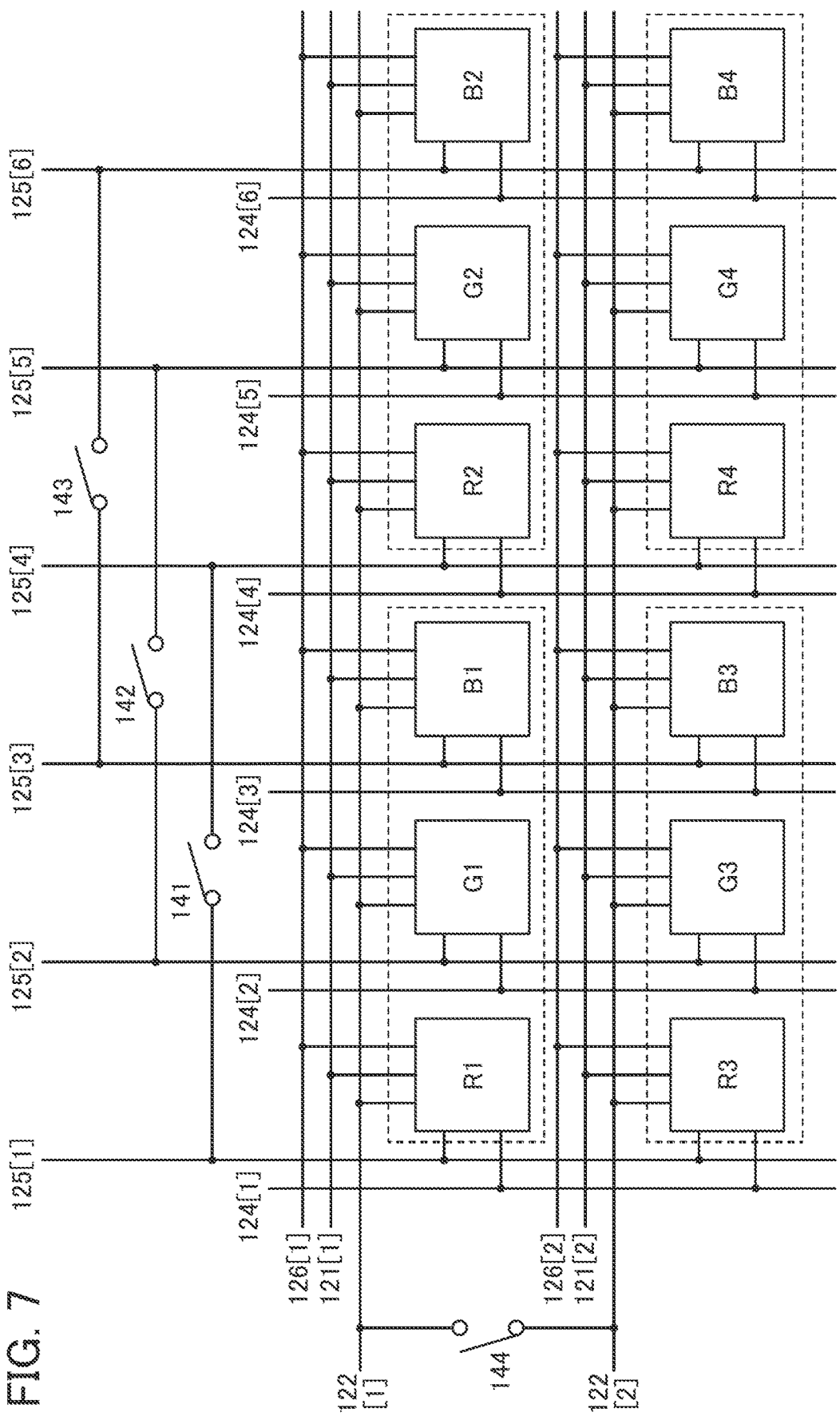
FIG. 7 illustrates a pixel array.

FIG. 7 is a diagram illustrating part of a pixel array in a display device capable of color display and illustrates a configuration in which signal lines to which the same image data is supplied can be electrically connected to each other through switches. In general, a pixel in a display device capable of color display includes a combination of subpixels that emit light of red (R), green (G), and blue (B). In FIG. 7, three subpixels of R, G, and B that are arranged in the horizontal direction form one pixel, and four pixels are illustrated in the horizontal and perpendicular directions.

Here, as illustrated in FIGS. 3A and 3B, the same image data is input to the four pixels in the horizontal and perpendicular directions. In FIG. 7, the same image data is input to subpixels R1 to R4. For example, the same image data is supplied to a wiring 125[1] and a wiring 125[4] that are electrically connected to the subpixels R1 to R4 and serve as signal lines, and signals are sequentially input to a wiring 122[1] and a wiring 122[2] serving as scan lines, whereby the same image data can be input to the four subpixels. Note that this method is not very efficient.

In one embodiment of the present invention, two signal lines are electrically connected to each other by a switch provided between the signal lines, and two scan lines are electrically connected to each other by a switch provided between the scan lines, whereby writing into the four subpixels can be performed at a time.

When a switch 141 provided between the wirings 125[1] and 125[4] is turned on in FIG. 7, image data supplied to one of the wirings 125[1] and 125[4] can be written into the subpixels.

R1 and R2 at the same time. When a switch 144 provided between the wirings 122[1] and 122[2] is on at this time, the data can also be written into the subpixels R3 and R4 at the same time. That is, writing into the four subpixels can be performed at the same time.

Similarly, when a switch 142 provided between wirings 125[2] and 125[5] and a switch 143 provided between wirings 125[3] and 125[6] are turned on as necessary, writing into four subpixels with a different color can also be performed at a time. As the switches 141 to 144, a transistor can be used, for example.

Since writing into the four subpixels can be performed at a time, the writing time can be shortened, and the frame frequency can be increased.

Next, simulation results of the pixel 11a illustrated in FIG. 1 and the pixel 11b illustrated in FIG. 4A are described. The common parameters are as follows: the size of each transistor was L/W=4 μm/4 μm, the capacitance of the capacitor 104 was 100 fF, the capacitance of the capacitor 105 was 50 fF, the capacitance of the liquid crystal element 106 was 20 fF, and the potential of each of the common wirings 132 and 133 was 0 V. Note that SPICE was used for circuit simulation software.

FIGS. 8A to 8C show operation parameters for simulation of the pixel 11a. The vertical axis represents the potential of each wiring, and the horizontal axis represents the time corresponding to the timing charts shown in FIGS. 2A and 2B.

FIG. 8A shows the potentials of the wirings connected to the gates of the transistors. Operation from Time T2 to Time T5 corresponds to the operation of writing the correction data (Vp). Operation from Time T11 to Time T13 corresponds to the operation of adding the image data (Vs) to the correction data (Vp).

FIG. 8B shows the potential of the wiring 124 to which the correction data (Vp) is supplied, and Vp=8V here. Note that the correction data (Vp) should be supplied to the wiring 124 between Time T2 and Time T5.

FIG. 8C shows the potential of the wiring 125 to which the image data (Vs) is supplied, and conditions where the potential is changed from 1 V to 8 V in increments of 1 V are used. Note that a voltage of 1 V is supplied to the wiring 125 as the potential "L" when the correction data (Vp) is written.

FIG. 8D shows a simulation result showing a change in the potential of the node NA when the above operation parameters are used. The potential shown after Time T13 is a potential applied to the node NA, and the result demonstrates that the potential is higher than that of the image data (Vs). Note that the potential of the node NA is affected by a decrease in the potential caused when the correction data (Vp) of the node NM is shared with the node NA, the capacitance ratio at the time of capacitive coupling, capacitance between wirings, or the like as described above and thus does not become an intended potential in some cases.

Figure 9A:
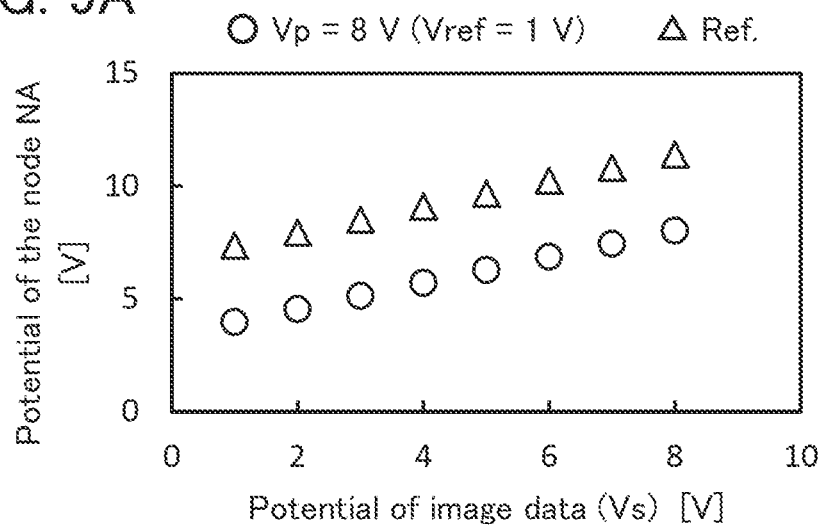
FIGS. 9A to 9C show pixel simulation results.

FIG. 9A is a graph showing a relation between the potential of the image data (Vs) and the potential of the node NA when the above parameters are used. A circle (o) shows a simulation result with a voltage of 8 V input as the correction data (Vp). Note that Vref (the potential of the wiring 125 in writing) is 1 V, and Vp−Vref=7 V. A triangle (△) shows a simulation result caused when the correction data (Vp) is directly written into the node NA. As shown in the graph, there is a rather large difference between these potentials, and in the case where there is a limitation on the design or the operating conditions, correction cannot be sufficiently performed in some cases.

Figure 9B:
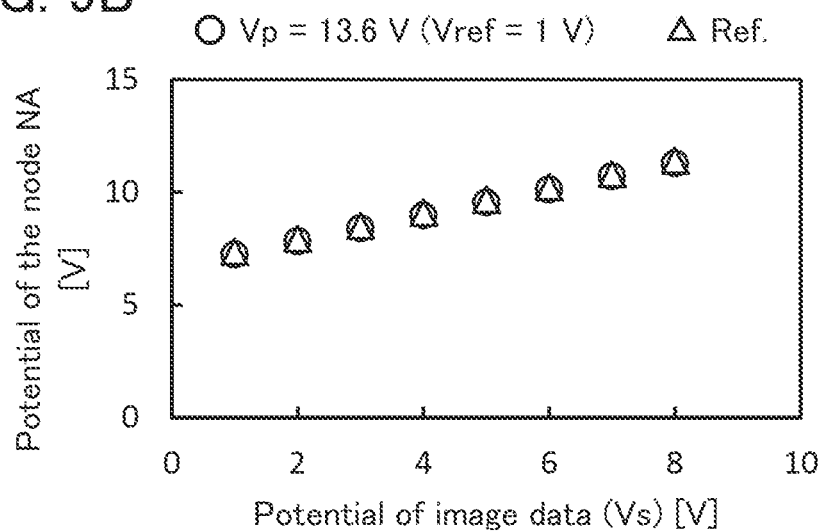

FIG. 9B shows a result of simulation in which whether the above difference can be reduced or not by adding a potential with an amount corresponding to the loss to the correction data (Vp) in advance was examined in view of the result of FIG. 9A. When a potential of +5.6 V is added to the correction data (Vp) in the case of using the above parameters, the potential of the node NA can have an intended value.

Figure 9C:
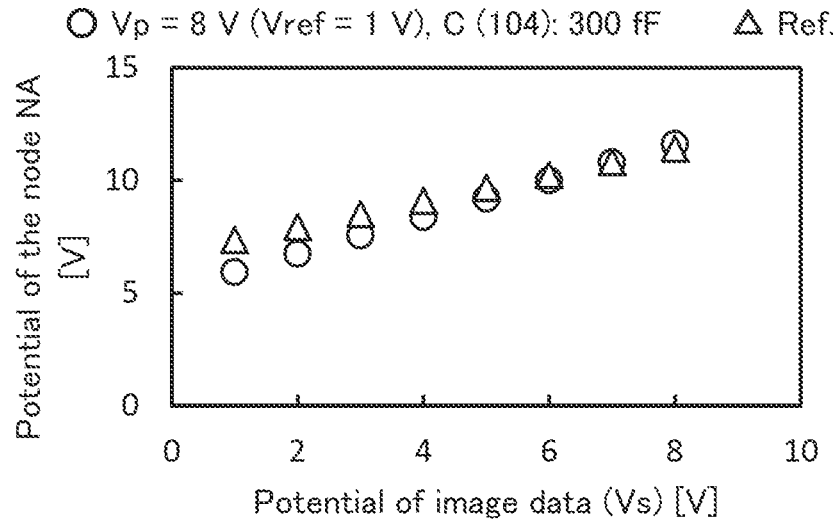

FIG. 9C shows a result of simulation in the case where the capacitance of the capacitor 104 is changed from 100 fF to 300 fF for a similar purpose. Although there is a slight difference when the potential of the image data (Vs) is low, the potential of the node NA can have an almost intended value.

That is, the results demonstrate that the correction data (Vp) or the capacitance of the capacitor 104 is set properly, whereby the potential of the node NA can have an intended value.

Figure 10A:
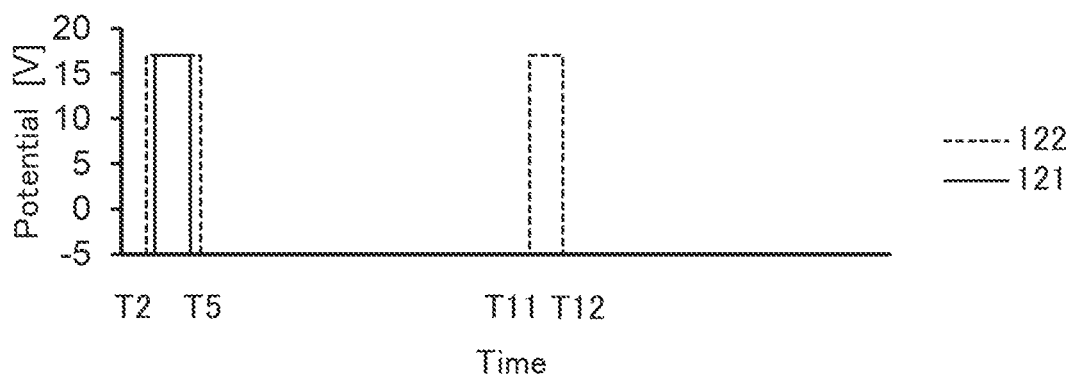
FIGS. 10A to 10D show pixel simulation results.
Figure 10B:
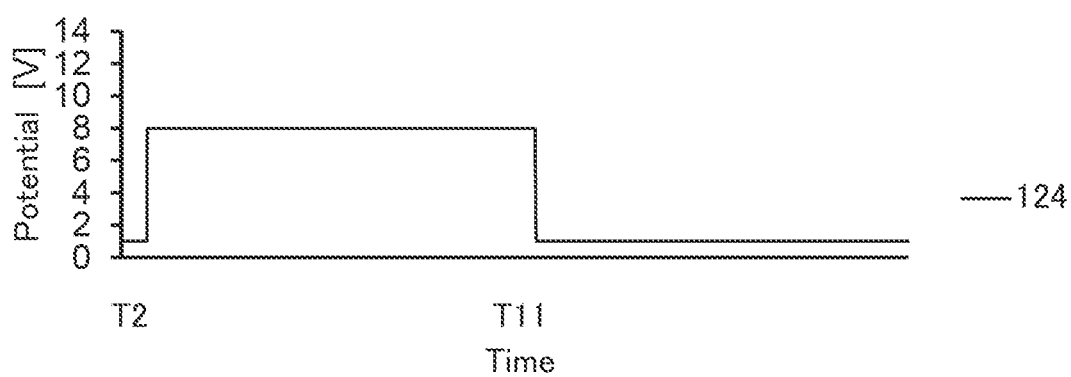
Figure 10C:
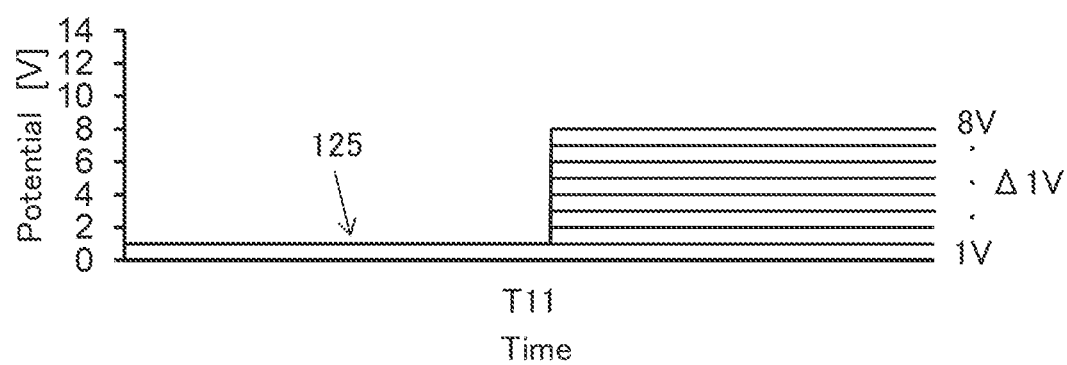

FIGS. 10A to 10C show operation parameters for simulation of the pixel 11b. The vertical axis represents the potential of each wiring, and the horizontal axis represents the time corresponding to the timing chart of FIGS. 4C and 4D. Since the transistor 103 is not included in the pixel 11b, the signal of the wiring 126 is not shown in FIG. 10A. FIGS. 10B and 10C are the same as FIGS. 8B and 8C.

Figure 10D:
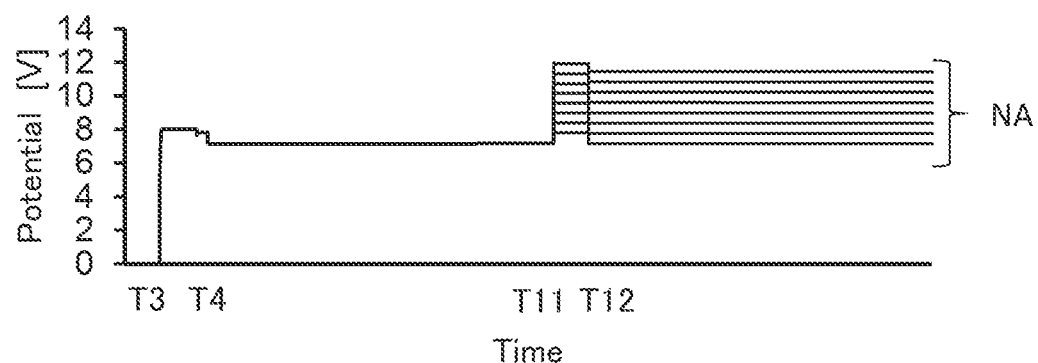
Figure 11:
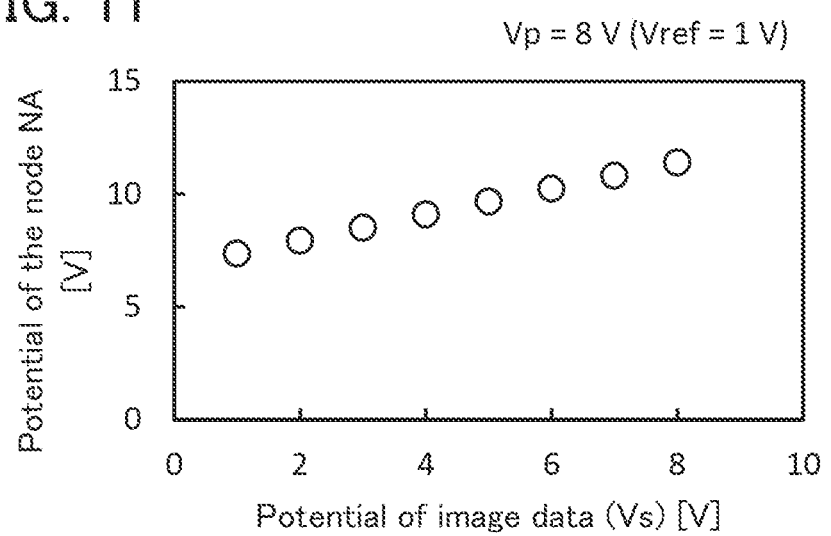
FIG. 11 shows pixel simulation results.

FIG. 10D shows a simulation result showing a change in the potential of the node NA when the above operation parameters are used. FIG. 11 shows a relation between the potential of the image data (Vs) and the potential of the node NA when the above parameters are used. The pixel 11b is not affected by a decrease in the potential due to sharing of the correction data (Vp), and thus the above addition of the correction data (Vp) is not necessary. Moreover, the capacitance of the capacitor 104 can be smaller, and thus the design flexibility can be increased.

Figure 12A:
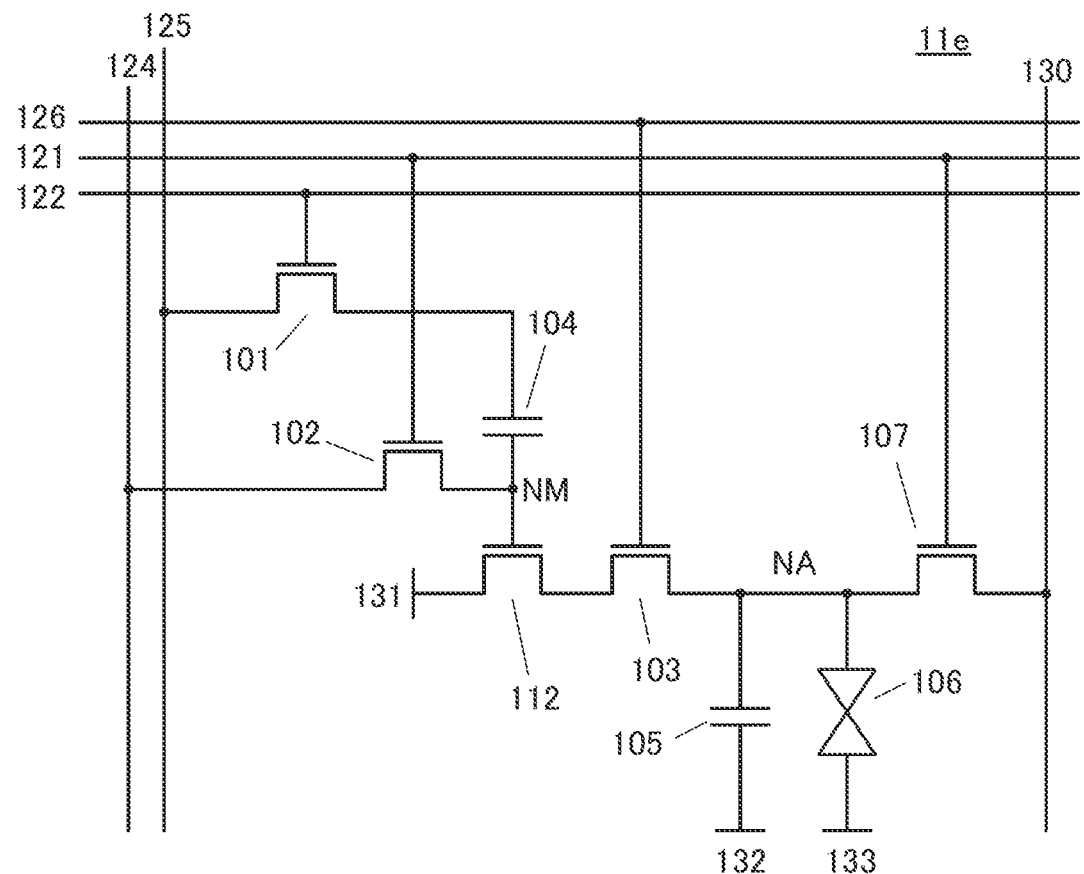
FIG. 12A illustrates a pixel circuit.

The display device of one embodiment of the present invention may employ a configuration of a pixel 11e illustrated in FIG. 12A. The pixel 11e has a configuration in which a transistor 112 is added to the pixel 11c illustrated in FIG. 5A. Like the other transistors, the transistor 112 can be an OS transistor, for example.

A gate of the transistor 112 is electrically connected to the one of the source and the drain of the transistor 102 and the other electrode of the capacitor 104. One of a source and a drain of the transistor 112 is electrically connected to the one of the source and the drain of the transistor 103. The other of the source and the drain of the transistor 112 is electrically connected to a power supply line 131 (at a high potential).

In the pixel 11e, a wiring to which the other electrode of the capacitor 104, the one of the source and the drain of the transistor 102, and the gate of the transistor 112 are connected is referred to as the node NM.

The wiring 130 electrically connected to the pixel 11e can have a function of a signal line that supplies a constant potential (a low potential) for resetting image data. The wiring 124 can have a function of a signal line for writing data into the node NM to be described below.

In the pixel 11e, the data written into the node NM can be capacitively coupled to the image data supplied from the wiring 125, and the resulting data can be output to the node NA.

In other words, in the case where intended correction data is stored in the node NM in advance, the correction data can be added to the supplied image data. Note that the correction data is sometimes attenuated because of a component on a transmission path; accordingly, the correction data is preferably generated in consideration of the attenuation.

Figure 12B:
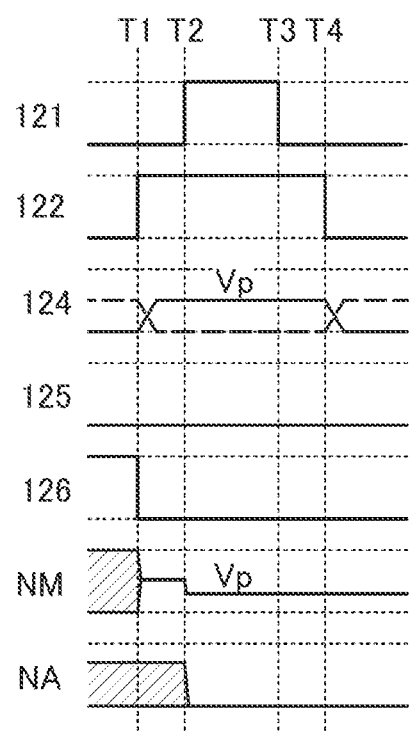
FIGS. 12B and 12C are timing charts each illustrating operation of the pixel circuit.
Figure 12C:
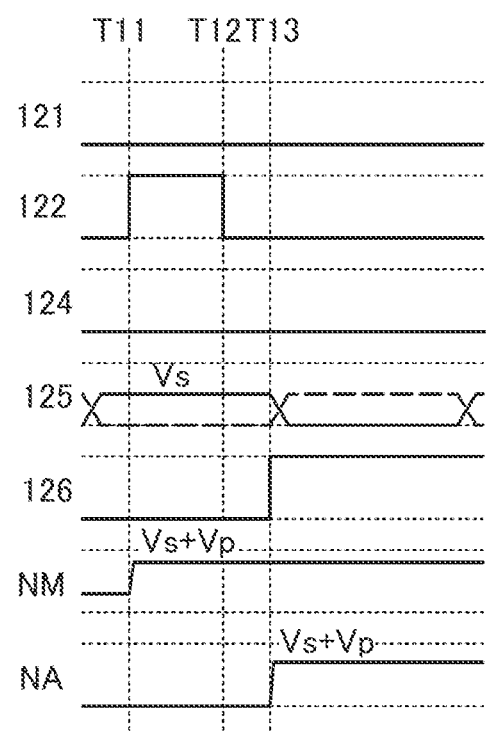

The details of the operation of the pixel 11e are described using timing charts shown in FIGS. 12B and 12C. Note that although a given positive or negative signal can be used as the correction data (Vp) supplied to the wiring 124, the case where a positive signal is supplied is described here. A reset potential (a low potential) is supplied to the wiring 130. In the following description, "H" represents a high potential and "L" represents a low potential.

First, the operation of writing the correction data (Vp) into the node NM is described with reference to FIG. 12B. Note that in the case where the purpose is image correction, it is usually preferred that the operation be performed frame by frame.

At Time T1, the potential of the wiring 121 is set to "L", the potential of the wiring 122 is set to "H", the potential of the wiring 125 is set to "L", and the potential of the wiring 126 is set to "L"; thus, the transistor 101 is turned on, and the potential of the one electrode of the capacitor 104 becomes "L". The operation is reset operation for performing subsequent capacitive coupling operation.

At Time T2, the potential of the wiring 121 is set to "H", the potential of the wiring 122 is set to "H", the potential of the wiring 125 is set to "L", and the potential of the wiring 126 is set to "L"; thus, the transistor 102 is turned on, and the potential of the wiring 124 (the correction data (Vp)) is written into the node NM.

Before Time T2, the display operation of the liquid crystal element 106 in the previous frame is performed; by turning on the transistor 107, the potential of the node NA is set to the reset potential to reset the display operation of the liquid crystal element 106.

At Time T3, the potential of the wiring 121 is set to "L", the potential of the wiring 122 is set to "H", the potential of the wiring 125 is set to "L", and the potential of the wiring 126 is set to "L"; thus, the transistor 102 is turned off, and the correction data (Vp) is held in the node NM.

At Time T4, the potential of the wiring 121 is set to "L", the potential of the wiring 122 is set to "L", the potential of the wiring 125 is set to "L", and the potential of the wiring 126 is set to "L"; thus, the transistor 101 is turned off, and the operation of writing the correction data (Vp) is completed.

Next, the operation of correcting the image data (Vs) and the display operation of the liquid crystal element 106 are described with reference to FIG. 12C.

At Time T11, the potential of the wiring 121 is set to "L", the potential of the wiring 122 is set to "H", the potential of the wiring 124 is set to "L", and the potential of the wiring 126 is set to "L"; thus, the transistor 101 is turned on, and the potential of the wiring 125 is added to the potential of the node NM by capacitive coupling of the capacitor 104. That is, the potential of the node NM becomes a potential (Vs+Vp) obtained by adding the correction data (Vp) to the image data (Vs).

At Time T12, the potential of the wiring 121 is set to "L", the potential of the wiring 122 is set to "L", the potential of the wiring 124 is set to "L", and the potential of the wiring 126 is set to "L"; thus, the transistor 101 is turned off, and the potential of the node NM is fixed to Vs+Vp.

At Time T13, the potential of the wiring 121 is set to "L", the potential of the wiring 122 is set to "L", the potential of the wiring 124 is set to "L", and the potential of the wiring 126 is set to "H"; thus, the transistor 103 is turned on, the potential of the node NA becomes Vs+Vp, and the display operation of the liquid crystal element 106 is performed. Strictly speaking, the potential of the node NA is lower than Vs+Vp by the threshold voltage (Vth) of the transistor 112; here, Vth is adequately low and negligible.

The above is the description of the operation of correcting the image data (Vs) and the display operation of the liquid crystal element 106. Note that the operation of writing the correction data (Vp) described above and the operation of inputting the image data (Vs) may be successively performed, but the operation of inputting the image data (Vs) is preferably performed after the correction data (Vp) is written into all the pixels. In one embodiment of the present invention, since the same image data can be supplied to a plurality of pixels at the same time, the operating speed can be increased by writing the correction data (Vp) into all the pixels first; the details are described above.

This embodiment can be implemented in an appropriate combination with any of the structures described in the other embodiments and the like.

Embodiment 2

In this embodiment, structure examples of a display device including a liquid crystal element will be described.

Note that the operation and the functions for the correction described in Embodiment 1 are not repeatedly described in this embodiment.

Figure 13A:
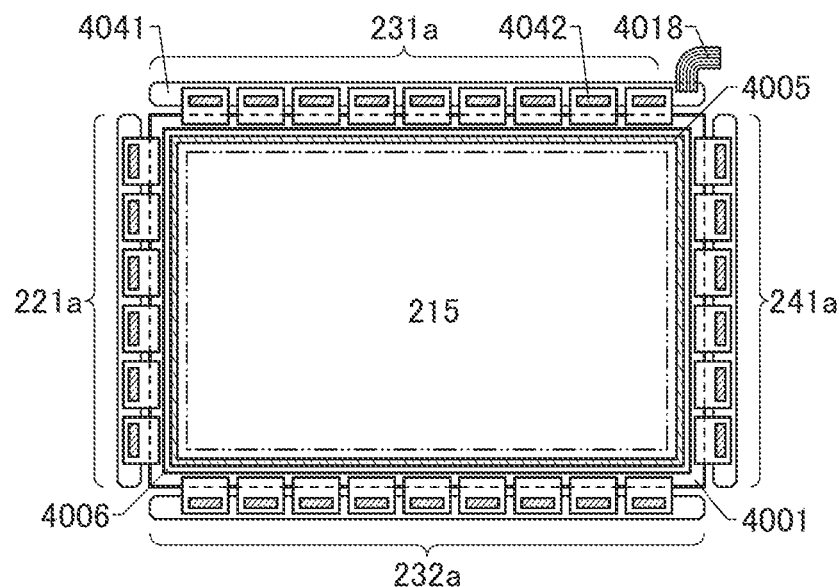
FIGS. 13A to 13C illustrate display devices.
Figure 13B:
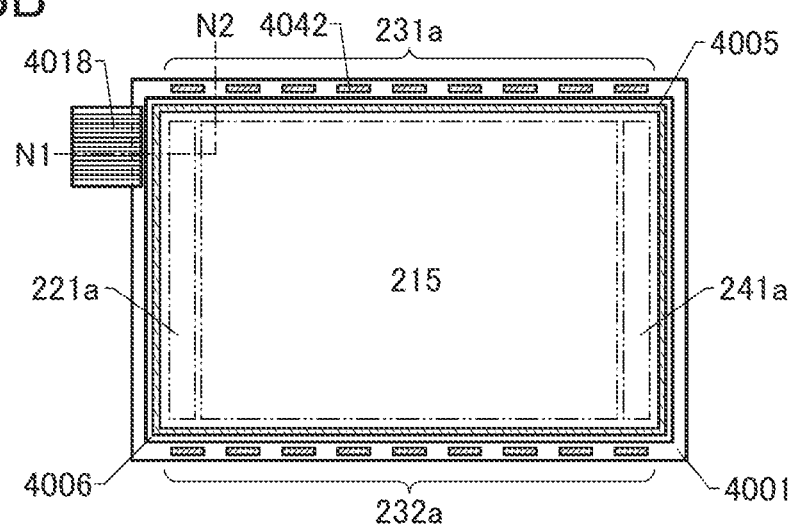
Figure 13C:
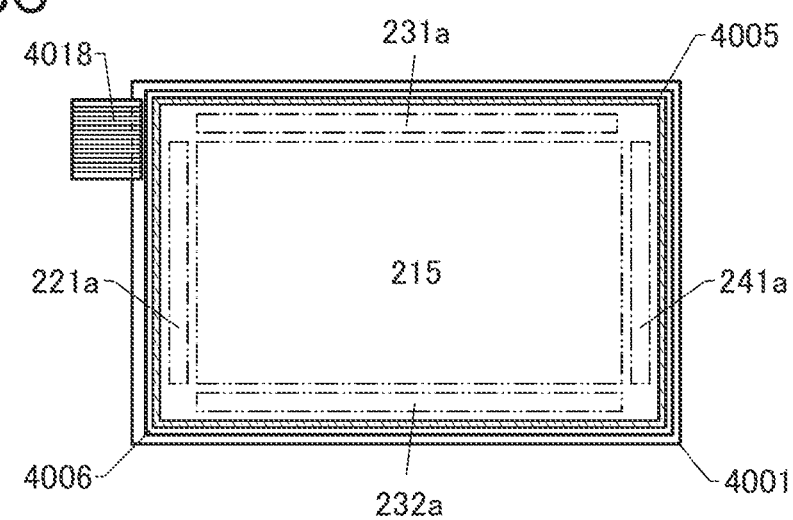

FIGS. 13A to 13C are diagrams each illustrating a structure of a display device to which one embodiment of the present invention can be applied.

In FIG. 13A, a sealant 4005 is provided so as to surround a display portion 215 provided over a first substrate 4001, and the display portion 215 is sealed by the sealant 4005 and a second substrate 4006.

A pixel array including the pixels described in Embodiment 1 is provided in the display portion 215.

In FIG. 13A, each of a scan line driver circuit 221a, a signal line driver circuit 231a, a signal line driver circuit 232a, and a common line driver circuit 241a includes a plurality of integrated circuits 4042 provided over a printed circuit board 4041. The integrated circuits 4042 are each formed using a single crystal semiconductor or a polycrystalline semiconductor. The signal line driver circuit 231a and the signal line driver circuit 232a have a function of the column driver described in Embodiment 1. The scan line driver circuit 221a has a function of the row driver described in Embodiment 1. The common line driver circuit 241a has a function of supplying a predetermined potential to the common wiring described in Embodiment 1.

Signals and potentials are supplied from a flexible printed circuit (FPC) 4018 to the scan line driver circuit 221a, the common line driver circuit 241a, the signal line driver circuit 231a, and the signal line driver circuit 232a.

The integrated circuits 4042 included in the scan line driver circuit 221a and the common line driver circuit 241a each have a function of supplying a selection signal to the display portion 215. The integrated circuits 4042 included in the signal line driver circuit 231a and the signal line driver circuit 232a each have a function of supplying image data to the display portion 215. The integrated circuits 4042 are mounted in a region different from a region surrounded by the sealant 4005 over the first substrate 4001.

Note that there is no particular limitation on the connection method of the integrated circuit 4042; a wire bonding method, a chip on glass (COG) method, a tape carrier package (TCP) method, a chip on film (COF) method, or the like can be used.

FIG. 13B illustrates an example of mounting the integrated circuits 4042 included in the signal line driver circuit 231a and the signal line driver circuit 232a by a COG method. Moreover, some or all of the driver circuits can be formed over the substrate where the display portion 215 is formed, whereby a system-on-panel can be obtained.

In the example shown in FIG. 13B, the scan line driver circuit 221a and the common line driver circuit 241a are formed over the substrate where the display portion 215 is formed. When the driver circuits are formed concurrently with the pixel circuit in the display portion 215, the number of components can be reduced. Accordingly, the productivity can be increased.

In FIG. 13B, the sealant 4005 is provided to surround the display portion 215, the scan line driver circuit 221a, and the common line driver circuit 241a over the first substrate 4001. The second substrate 4006 is provided over the display portion 215, the scan line driver circuit 221a, and the common line driver circuit 241a. Consequently, the display portion 215, the scan line driver circuit 221a, and the common line driver circuit 241a are sealed together with a display element by the first substrate 4001, the sealant 4005, and the second substrate 4006.

Although the signal line driver circuit 231a and the signal line driver circuit 232a are formed separately and mounted on the first substrate 4001 in the example illustrated in FIG. 13B, one embodiment of the present invention is not limited to this structure. The scan line driver circuit may be separately formed and then mounted, or part of the signal line driver circuit or part of the scan line driver circuit may be separately formed and then mounted. As illustrated in FIG. 13C, the signal line driver circuit 231a and the signal line driver circuit 232a may be formed over the substrate where the display portion 215 is formed.

In some cases, the display device encompasses a panel in which a display element is sealed, and a module in which an IC or the like including a controller is mounted on the panel.

The display portion and the scan line driver circuit over the first substrate include a plurality of transistors.

A transistor included in a peripheral driver circuit and a transistor included in the pixel circuit of the display portion may have the same structure or different structures. Transistors included in the peripheral driver circuit may have the same structure, or transistors having two or more kinds of structures may be used. Similarly, transistors included in the pixel circuit may have the same structure or a combination of two or more kinds of structures.

An input device 4200 can be provided over the second substrate 4006. The display device which is illustrated in each of FIGS. 13A and 13B and provided with the input device 4200 can serve as a touch panel.

There is no particular limitation on a sensing element (also referred to as a sensor element) included in the touch panel of one embodiment of the present invention. A variety of sensors capable of sensing an approach or a contact of an object such as a finger or a stylus can be used as the sensor element.

For example, a variety of types such as a capacitive type, a resistive type, a surface acoustic wave type, an infrared type, an optical type, and a pressure-sensitive type can be used for the sensor.

In this embodiment, a touch panel including a capacitive sensor element is described as an example.

Examples of the capacitive touch sensor element include a surface capacitive touch sensor element, a projected capacitive touch sensor element, and the like. Examples of the projected capacitive sensor element include a self-capacitive sensor element and a mutual capacitive sensor element. The use of a mutual capacitive sensor element is preferable because multiple points can be sensed simultaneously.

The touch panel of one embodiment of the present invention can have any of a variety of structures, including a structure in which a display device and a sensor element that are separately formed are attached to each other and a structure in which an electrode and the like included in a sensor element are provided on one or both of a substrate supporting a display element and a counter substrate.

Figure 14A:
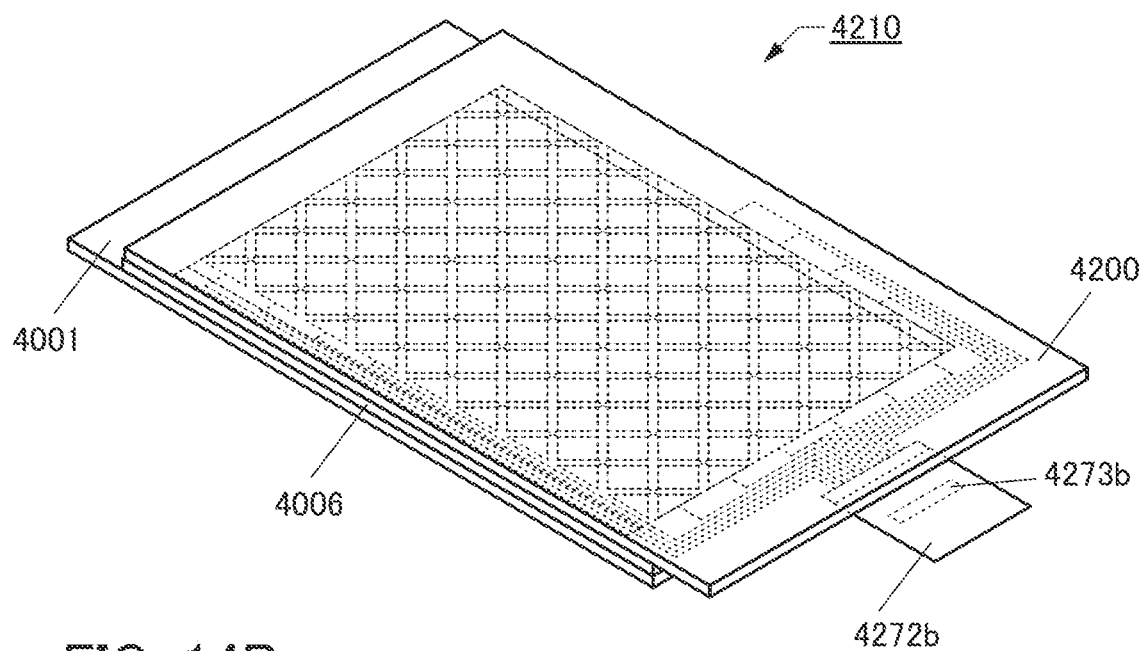
FIGS. 14A and 14B illustrate a touch panel.
Figure 14B:
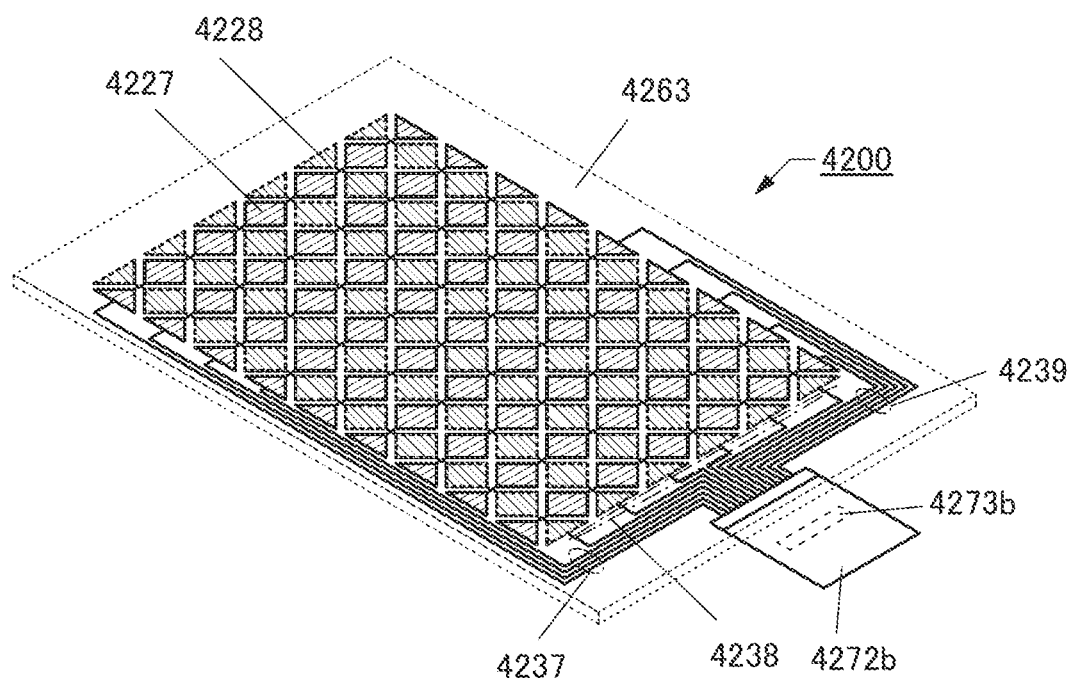

FIGS. 14A and 14B illustrate an example of a touch panel. FIG. 14A is a perspective view of a touch panel 4210. FIG. 14B is a perspective schematic view of the input device 4200. Note that for simplicity, FIGS. 14A and 14B illustrate only the major components.

The touch panel 4210 has a structure in which a display device and a sensor element that are separately formed are attached to each other.

The touch panel 4210 includes the input device 4200 and the display device which are provided to overlap each other.

The input device 4200 includes a substrate 4263, an electrode 4227, an electrode 4228, a plurality of wirings 4237, a plurality of wirings 4238, and a plurality of wirings 4239. For example, the electrode 4227 can be electrically connected to the wiring 4237 or the wiring 4239. In addition, the electrode 4228 can be electrically connected to the wiring 4239. An FPC 4272b is electrically connected to each of the plurality of wirings 4237 and the plurality of wirings 4238. An IC 4273b can be provided on the FPC 4272b.

A touch sensor may be provided between the first substrate 4001 and the second substrate 4006 in the display device. In the case where a touch sensor is positioned between the first substrate 4001 and the second substrate 4006, an optical touch sensor including a photoelectric conversion element as well as a capacitive touch sensor may be used.

Figure 15:
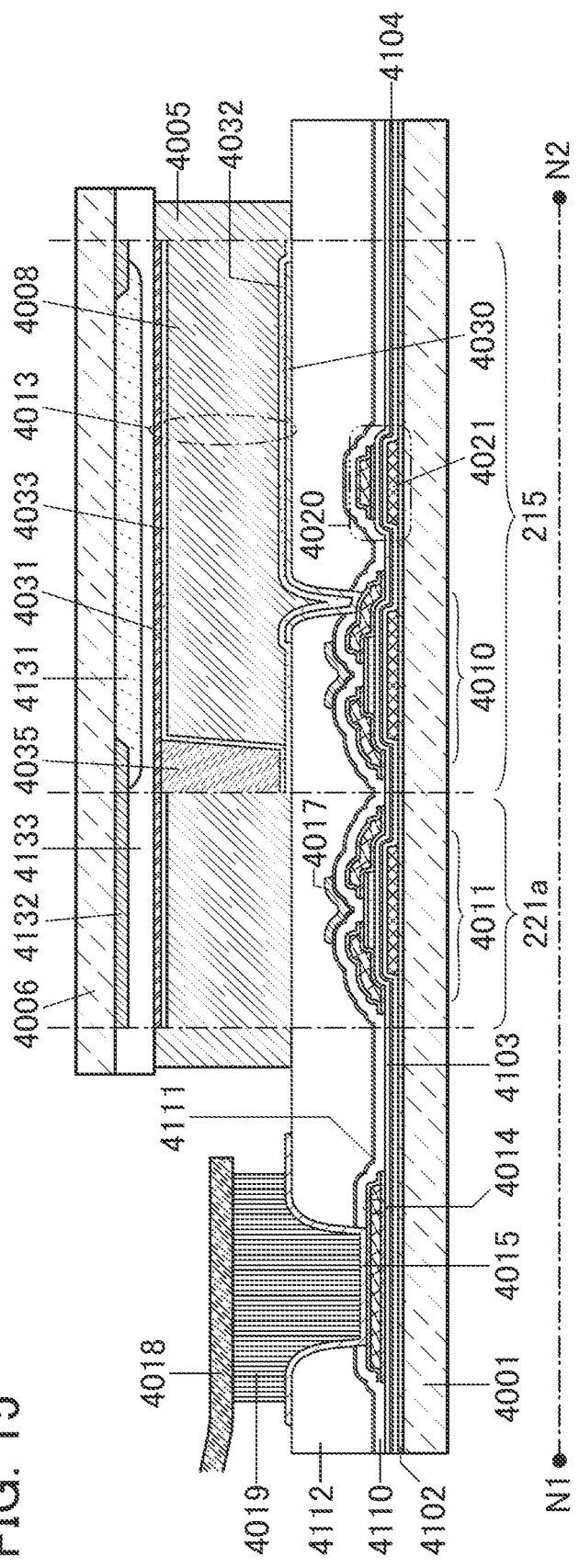
FIG. 15 illustrates a display device.

FIG. 15 is a cross-sectional view of a portion taken along chain line N1-N2 in FIG. 13B. As illustrated in FIG. 15, the display device includes an electrode 4015, and the electrode 4015 is electrically connected to a terminal included in the FPC 4018 through an anisotropic conductive layer 4019. In FIG. 15, the electrode 4015 is electrically connected to a wiring 4014 in an opening formed in insulating layers 4112, 4111, and 4110.

The electrode 4015 is formed of the same conductive layer as a first electrode layer 4030, and the wiring 4014 is formed of the same conductive layer as source and drain electrodes of transistors 4010 and 4011.

The display portion 215 and the scan line driver circuit 221a provided over the first substrate 4001 include a plurality of transistors. In FIG. 15, the transistor 4010 included in the display portion 215 and the transistor 4011 included in the scan line driver circuit 221a are illustrated as an example. Note that in the example of FIG. 15, the transistor 4010 and the transistor 4011 are bottom-gate transistors but may be top-gate transistors.

In FIG. 15, the insulating layer 4112 is provided over the transistors 4010 and 4011.

The transistors 4010 and 4011 are provided over an insulating layer 4102. The transistors 4010 and 4011 each include an electrode 4017 formed over the insulating layer 4111. The electrode 4017 can serve as a back gate electrode.

The display device illustrated in FIG. 15 also includes a capacitor 4020. The capacitor 4020 includes an electrode 4021 formed in the same step as that for forming a gate electrode of the transistor 4010, and an electrode formed in the same step as that for forming the source electrode and the drain electrode of the transistor 4010. The electrodes overlap each other with an insulating layer 4103 provided therebetween.

In general, the capacitance of a capacitor provided in a pixel portion of a display device is set in consideration of leakage current or the like of a transistor provided in the pixel portion so that charges can be held for a predetermined period. The capacitance of the capacitor can be set in consideration of off-state current of the transistor or the like.

The transistor 4010 included in the display portion 215 is electrically connected to the display element. An example of a liquid crystal display device using a liquid crystal element as the display element is illustrated in FIG. 15. In FIG. 15, a liquid crystal element 4013 which is a display element includes the first electrode layer 4030, a second electrode layer 4031, and a liquid crystal layer 4008. Insulating layers 4032 and 4033 serving as alignment films are provided so that the liquid crystal layer 4008 is sandwiched therebetween. The second electrode layer 4031 is provided on the second substrate 4006 side, and the first electrode layer 4030 and the second electrode layer 4031 overlap each other with the liquid crystal layer 4008 positioned therebetween.

A liquid crystal element using any of a variety of modes can be used as the liquid crystal element 4013. For example, a liquid crystal element using a vertical alignment (VA) mode, a twisted nematic (TN) mode, an in-plane switching (IPS) mode, an axially symmetric aligned micro-cell (ASM) mode, an optically compensated bend (OCB) mode, a ferroelectric liquid crystal (FLC) mode, an antiferroelectric liquid crystal (AFLC) mode, an electrically controlled birefringence (ECB) mode, a VA-IPS mode, or a guest-host mode can be used.

The liquid crystal display device described in this embodiment may be a normally black liquid crystal display device such as a transmissive liquid crystal display device utilizing a vertical alignment (VA) mode. Examples of the vertical alignment mode include a multi-domain vertical alignment (MVA) mode, a patterned vertical alignment (PVA) mode, and an advanced super view (ASV) mode.

The liquid crystal element is an element that controls transmission and non-transmission of light by optical modulation action of a liquid crystal. The optical modulation action of the liquid crystal is controlled by an electric field applied to the liquid crystal (including a horizontal electric field, a vertical electric field, and an oblique electric field). As the liquid crystal used for the liquid crystal element, a thermotropic liquid crystal, a low-molecular liquid crystal, a high-molecular liquid crystal, a polymer dispersed liquid crystal (PDLC), a ferroelectric liquid crystal, an antiferroelectric liquid crystal, or the like can be used. Such a liquid crystal material exhibits a cholesteric phase, a smectic phase, a cubic phase, a chiral nematic phase, an isotropic phase, or the like depending on conditions.

Although a liquid crystal display device including a liquid crystal element with a vertical electric field mode is illustrated in the example of FIG. 15, one embodiment of the present invention can be applied to a liquid crystal display device including a liquid crystal element with a horizontal electric field mode. In the case of employing a horizontal electric field mode, a liquid crystal exhibiting a blue phase for which an alignment film is unnecessary may be used. The blue phase is one of liquid crystal phases, which is generated just before a cholesteric phase changes into an isotropic phase while the temperature of a cholesteric liquid crystal is increased. Since the blue phase is only generated within a narrow temperature range, a liquid crystal composition containing a chiral material at 5 wt % or more is used for the liquid crystal layer 4008 in order to increase the temperature range. The liquid crystal composition containing a liquid crystal exhibiting a blue phase and a chiral material has a short response time and optical isotropy; in addition, such a liquid crystal composition does not require an alignment process and has a small viewing angle dependence. Moreover, since an alignment film does not need to be provided and rubbing treatment is unnecessary, electrostatic discharge damage caused by the rubbing treatment can be prevented and defects or damage of the liquid crystal display device in the manufacturing process can be reduced.

A spacer 4035 is a columnar spacer obtained by selective etching of an insulating layer and is provided in order to control a distance between the first electrode layer 4030 and the second electrode layer 4031 (a cell gap). Alternatively, a spherical spacer may be used.

A black matrix (a light-blocking layer); a coloring layer (a color filter); an optical member (an optical substrate) such as a polarizing member, a retardation member, or an anti-reflection member; or the like may be provided appropriately as needed. For example, circular polarization may be employed by using a polarizing substrate and a retardation substrate. In addition, a backlight, a side light, or the like may be used as a light source. A micro LED or the like may be used as the backlight or side light.

In the display device illustrated in FIG. 15, a light-blocking layer 4132, a coloring layer 4131, and an insulating layer 4133 are provided between the second substrate 4006 and the second electrode layer 4031.

Examples of a material that can be used for the light-blocking layer 4132 include carbon black, titanium black, a metal, a metal oxide, and a composite oxide containing a solid solution of a plurality of metal oxides. The light-blocking layer 4132 may be a film containing a resin material or a thin film of an inorganic material such as a metal. Stacked films containing the material of the coloring layer 4131 can also be used for the light-blocking layer 4132. For example, a stacked-layer structure of a film containing a material of the coloring layer 4131 which transmits light of a certain color and a film containing a material of the coloring layer 4131 which transmits light of another color can be employed. It is preferable that the coloring layer 4131 and the light-blocking layer 4132 be formed using the same material because the same manufacturing apparatus can be used and the process can be simplified.

As examples of a material that can be used for the coloring layer 4131, a metal material, a resin material, and a resin material containing a pigment or dye can be given. The light-blocking layer 4132 and the coloring layer 4131 can be formed by a method similar to methods for forming the above-described layers. For example, an inkjet method may be used.

The display device illustrated in FIG. 15 includes the insulating layers 4111 and 4104. As the insulating layers 4111 and 4104, insulating layers through which an impurity element does not easily pass are used. A semiconductor layer of the transistor is sandwiched between the insulating layers 4111 and 4104, whereby entry of impurities from the outside can be prevented.

Since the transistor is easily broken owing to static electricity or the like, a protective circuit for protecting the driver circuit is preferably provided. The protective circuit is preferably formed using a nonlinear element.

This embodiment can be implemented in an appropriate combination with any of the structures described in the other embodiments and the like.

Embodiment 3

In this embodiment, an example of a transistor that can be used as the transistors described in the above embodiments will be described with reference to drawings.

The display device of one embodiment of the present invention can be fabricated using a transistor with any of various modes, such as a bottom-gate transistor or a top-gate transistor. Therefore, a material for a semiconductor layer or the structure of a transistor can be easily changed depending on the existing production line.

[Bottom-Gate Transistor]

FIG. 16A1 is a cross-sectional view of a channel-protective transistor 810 that is a type of bottom-gate transistor. In FIG. 16A1, the transistor 810 is formed over a substrate 771. The transistor 810 includes an electrode 746 over the substrate 771 with an insulating layer 772 therebetween. The transistor 810 includes a semiconductor layer 742 over the electrode 746 with an insulating layer 726 therebetween. The electrode 746 can serve as a gate electrode. The insulating layer 726 can serve as a gate insulating layer.

The transistor 810 includes an insulating layer 741 over a channel formation region in the semiconductor layer 742. The transistor 810 includes an electrode 744a and an electrode 744b which are partly in contact with the semiconductor layer 742 and over the insulating layer 726. The electrode 744a can serve as one of a source electrode and a drain electrode. The electrode 744b can serve as the other of the source electrode and the drain electrode. Part of the electrode 744a and part of the electrode 744b are formed over the insulating layer 741.

The insulating layer 741 can serve as a channel protective layer. With the insulating layer 741 provided over the channel formation region, the semiconductor layer 742 can be prevented from being exposed at the time of forming the electrodes 744a and 744b. Thus, the channel formation region in the semiconductor layer 742 can be prevented from being etched at the time of forming the electrodes 744a and 744b. According to one embodiment of the present invention, a transistor with favorable electrical characteristics can be provided.

The transistor 810 includes an insulating layer 728 over the electrode 744a, the electrode 744b, and the insulating layer 741 and further includes an insulating layer 729 over the insulating layer 728.

In the case where an oxide semiconductor is used for the semiconductor layer 742, a material capable of removing oxygen from part of the semiconductor layer 742 to generate oxygen vacancies is preferably used at least for regions of the electrodes 744a and 744b that are in contact with the semiconductor layer 742. The carrier concentration in the regions of the semiconductor layer 742 where oxygen vacancies are generated is increased, so that the regions become n-type regions ($n^+$ layers). Accordingly, the regions can serve as a source region and a drain region. When an oxide semiconductor is used for the semiconductor layer 742, examples of the material capable of removing oxygen from the semiconductor layer 742 to generate oxygen vacancies include tungsten and titanium.

Formation of the source region and the drain region in the semiconductor layer 742 makes it possible to reduce contact resistance between the semiconductor layer 742 and each of the electrodes 744a and 744b. Accordingly, the electrical characteristics of the transistor, such as the field-effect mobility and the threshold voltage, can be favorable.

In the case where a semiconductor such as silicon is used for the semiconductor layer 742, a layer that functions as an n-type semiconductor or a p-type semiconductor is preferably provided between the semiconductor layer 742 and each of the electrodes 744a and 744b. The layer that functions as an n-type semiconductor or a p-type semiconductor can function as the source region or the drain region in the transistor.

The insulating layer 729 is preferably formed using a material that can prevent or reduce diffusion of impurities into the transistor from the outside. The insulating layer 729 is not necessarily formed.

A transistor 811 illustrated in FIG. 16A2 is different from the transistor 810 in including, over the insulating layer 729, an electrode 723 that can serve as a back gate electrode. The electrode 723 can be formed using a material and a method similar to those of the electrode 746.

In general, a back gate electrode is formed using a conductive layer and positioned so that a channel formation region in a semiconductor layer is positioned between a gate electrode and the back gate electrode. Thus, the back gate electrode can function in a manner similar to that of the gate electrode. The potential of the back gate electrode may be the same as that of the gate electrode or may be a ground (GND) potential or a predetermined potential. By changing a potential of the back gate electrode independently of the potential of the gate electrode, the threshold voltage of the transistor can be changed.

The electrode 746 and the electrode 723 can each serve as a gate electrode. Thus, the insulating layers 726, 728, and 729 can each serve as a gate insulating layer. The electrode 723 may be provided between the insulating layers 728 and 729.

In the case where one of the electrodes 746 and 723 is referred to as a "gate electrode", the other is referred to as a "back gate electrode". For example, in the transistor 811, in the case where the electrode 723 is referred to as a "gate electrode", the electrode 746 is referred to as a "back gate electrode". In the case where the electrode 723 is used as a "gate electrode", the transistor 811 can be regarded as a kind of top-gate transistor. Alternatively, one of the electrodes 746 and 723 may be referred to as a "first gate electrode", and the other may be referred to as a "second gate electrode".

By providing the electrodes 746 and 723 with the semiconductor layer 742 therebetween and setting the potentials of the electrodes 746 and 723 to be the same, a region of the semiconductor layer 742 through which carriers flow is enlarged in the film thickness direction; thus, the number of transferred carriers is increased. As a result, the on-state current and field-effect mobility of the transistor 811 are increased.

Therefore, the transistor 811 has a high on-state current for its area. That is, the area of the transistor 811 can be small for a required on-state current. According to one embodiment of the present invention, the area of a transistor can be reduced. Therefore, according to one embodiment of the present invention, a semiconductor device having a high degree of integration can be provided.

The gate electrode and the back gate electrode are formed using conductive layers and thus each have a function of preventing an electric field generated outside the transistor from influencing the semiconductor layer in which the channel is formed (in particular, an electric field blocking function against static electricity and the like). When the back gate electrode is formed larger than the semiconductor layer to cover the semiconductor layer, the electric field blocking function can be enhanced.

When the back gate electrode is formed using a light-blocking conductive film, light can be prevented from entering the semiconductor layer from the back gate electrode side. Therefore, photodegradation of the semiconductor layer and deterioration in electrical characteristics of the transistor, such as a shift of the threshold voltage, can be prevented.

According to one embodiment of the present invention, a transistor with favorable reliability can be provided. Moreover, a semiconductor device with favorable reliability can be provided.

FIG. 16B1 is a cross-sectional view of a channel-protective transistor 820 that is a type of bottom-gate transistor. The transistor 820 has substantially the same structure as the transistor 810 but is different from the transistor 810 in that the insulating layer 741 covers end portions of the semiconductor layer 742. The semiconductor layer 742 is electrically connected to the electrode 744a through an opening formed by selectively removing part of the insulating layer 741 that overlaps the semiconductor layer 742. The semiconductor layer 742 is electrically connected to the electrode 744b in another opening formed by selectively removing part of the insulating layer 741 that overlaps the semiconductor layer 742. A region of the insulating layer 741 that overlaps the channel formation region can function as a channel protective layer.

A transistor 821 illustrated in FIG. 16B2 is different from the transistor 820 in including, over the insulating layer 729, the electrode 723 that can serve as a back gate electrode.

With the insulating layer 741, the semiconductor layer 742 can be prevented from being exposed at the time of forming the electrodes 744a and 744b. Thus, the semiconductor layer 742 can be prevented from being reduced in thickness at the time of forming the electrodes 744a and 744b.

The distance between the electrode 744a and the electrode 746 and the length between the electrode 744b and the electrode 746 in the transistors 820 and 821 are larger than those in the transistors 810 and 811. Thus, the parasitic capacitance generated between the electrode 744a and the electrode 746 can be reduced. The parasitic capacitance generated between the electrode 744b and the electrode 746 can also be reduced. According to one embodiment of the present invention, a transistor with favorable electrical characteristics can be provided.

A transistor 825 illustrated in FIG. 16C1 is a channel-etched transistor that is a type of bottom-gate transistor. In the transistor 825, the electrodes 744a and 744b are formed without providing the insulating layer 741. Thus, part of the semiconductor layer 742 that is exposed at the time of forming the electrodes 744a and 744b is etched in some cases. However, since the insulating layer 741 is not provided, the productivity of the transistor can be increased.

A transistor 826 illustrated in FIG. 16C2 is different from the transistor 825 in that the electrode 723 that can serve as a back gate electrode is provided over the insulating layer 729.

[Top-Gate Transistor]

A transistor 842 illustrated in FIG. 17A1 is a type of top-gate transistor. The electrodes 744a and 744b are electrically connected to the semiconductor layer 742 through openings formed in the insulating layers 728 and 729.

As illustrated in FIG. 17A3, part of the insulating layer 726 that does not overlap the electrode 746 is removed, an impurity 755 is introduced into the semiconductor layer 742 using the electrode 746 and the insulating layer 726 that is left as a mask, so that an impurity region can be formed in the semiconductor layer 742 in a self-aligned manner. The transistor 842 includes a region where the insulating layer 726 extends beyond end portions of the electrode 746. The semiconductor layer 742 in a region into which the impurity 755 is introduced through the insulating layer 726 has a lower impurity concentration than the semiconductor layer 742 in a region into which the impurity 755 is introduced without through the insulating layer 726. Thus, a lightly doped drain (LDD) region is formed in a region of the semiconductor layer 742 which does not overlap the electrode 746.

A transistor 843 illustrated in FIG. 17A2 is different from the transistor 842 in that the electrode 723 is included. The transistor 843 includes the electrode 723 that is formed over the substrate 771, and the electrode 723 has a region overlapping the semiconductor layer 742 with the insulating layer 772 therebetween. The electrode 723 can serve as a back gate electrode.

As in a transistor 844 illustrated in FIG. 17B1 and a transistor 845 illustrated in FIG. 17B2, the insulating layer 726 in a region that does not overlap the electrode 746 may be completely removed. Alternatively, as in a transistor 846 illustrated in FIG. 17C1 and a transistor 847 illustrated in FIG. 17C2, the insulating layer 726 may be left.

In the transistors 842 to 847, after the formation of the electrode 746, the impurity 755 is introduced into the semiconductor layer 742 using the electrode 746 as a mask, so that an impurity region can be formed in the semiconductor layer 742 in a self-aligned manner. According to one embodiment of the present invention, a transistor with favorable electrical characteristics can be provided. According to one embodiment of the present invention, a semiconductor device having a high degree of integration can be provided.

This embodiment can be implemented in an appropriate combination with any of the structures described in the other embodiments and the like.

Embodiment 4

This embodiment will show a semiconductor device that can be used in the row driver 12, the column drivers 13 and 17, and the circuits 14 and 15, which are described in Embodiment 1. The semiconductor device described below is capable of functioning as a memory device.

In this embodiment, a DOSRAM (registered trademark) is described as an example of a memory device using an oxide semiconductor. Note that DOSRAM stands for dynamic oxide semiconductor random access memory. A DOSRAM is a memory device composed of one-transistor one-capacitor (1T1C) memory cells in which the write transistor contains an oxide semiconductor.

An example of a layered structure of a DOSRAM 1000 is described with reference to FIG. 18. In the DOSRAM 1000, a sense amplifier unit 1002 for reading data and a cell array unit 1003 for storing data are stacked.

Figure 18:
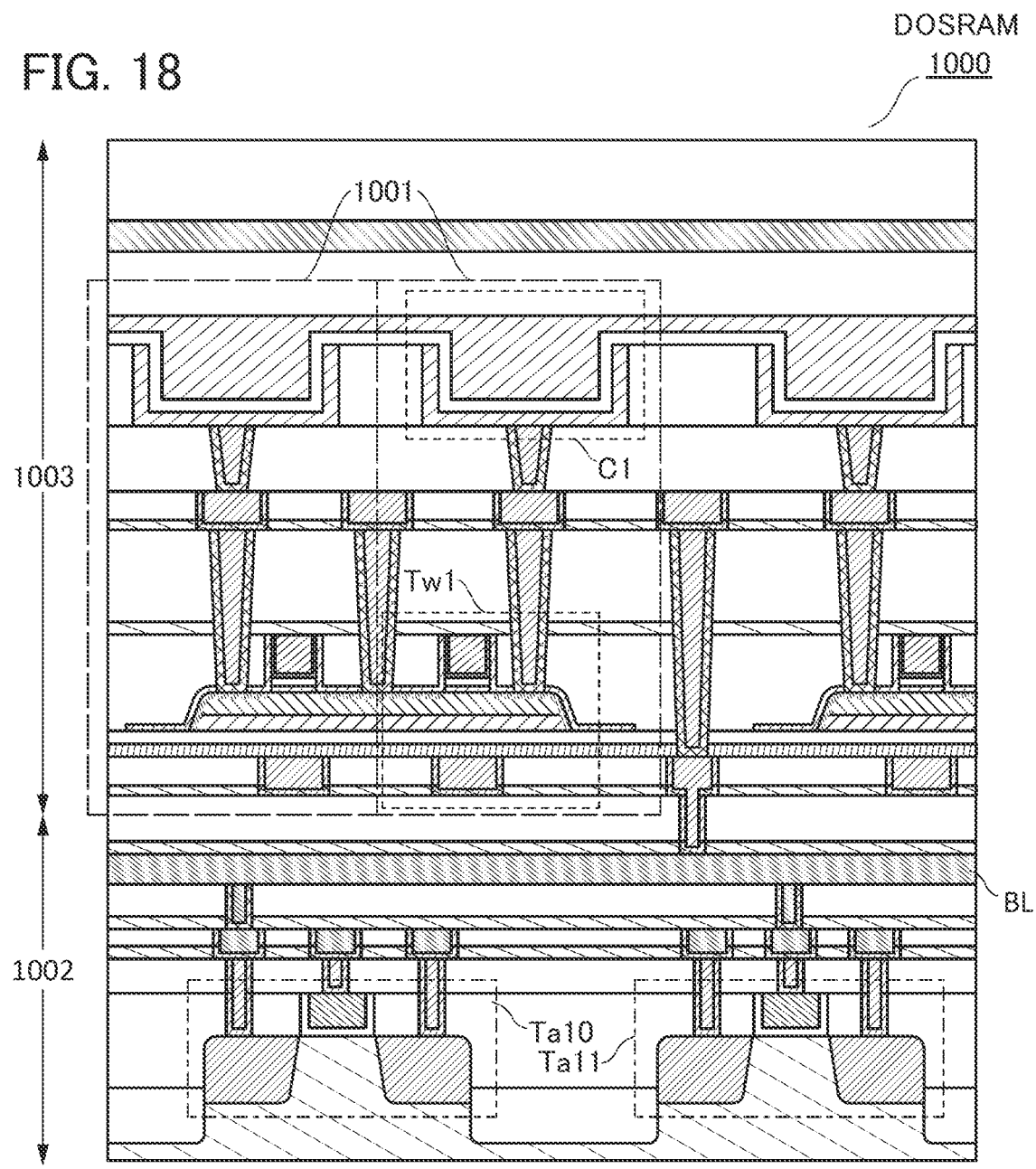
FIG. 18 is a cross-sectional view illustrating a structure example of a DOSRAM.

As illustrated in FIG. 18, a bit line BL and Si transistors Ta10 and Ta11 are provided in the sense amplifier unit 1002. The Si transistors Ta10 and Ta11 have a semiconductor layer in a single crystal silicon wafer. The Si transistors Ta10 and Ta11 constitute a sense amplifier and are electrically connected to the bit line BL.

The cell array unit 1003 includes a plurality of memory cells 1001. The memory cell 1001 includes a transistor Tw1 and a capacitor C1. In the cell array unit 1003, two transistors Tw1 share a semiconductor layer. The semiconductor layer is electrically connected to the bit line BL through a conductor that is not shown in FIG. 18.

The layered structure illustrated in FIG. 18 can be applied to a variety of semiconductor devices configured with a stack of circuits each including a group of transistors.

Metal oxides, insulators, conductors, and the like in FIG. 18 may each have a single-layer structure or a stacked-layer structure. They can be formed by any of a variety of deposition methods such as a sputtering method, a molecular beam epitaxy (MBE) method, a pulsed laser ablation (PLA) method, a chemical vapor deposition (CVD) method, and an atomic layer deposition (ALD) method. Examples of a CVD method include a plasma CVD method, a thermal CVD method, and a metal organic CVD method.

Here, the semiconductor layer of the transistor Tw1 contains a metal oxide (oxide semiconductor) and is composed of three metal oxide layers as an example. The semiconductor layer is preferably formed using a metal oxide containing In, Ga, and Zn.

When an element that forms an oxygen vacancy or an element that is bonded to an oxygen vacancy is added to a metal oxide, the carrier density of the metal oxide is increased and the resistance thereof is lowered in some cases. For example, when the resistance of part of a semiconductor layer containing a metal oxide is selectively lowered, a source region and a drain region can be provided in the semiconductor layer.

Typical examples of an element that lowers the resistance of a metal oxide are boron and phosphorus. Moreover, hydrogen, carbon, nitrogen, fluorine, sulfur, chlorine, titanium, a rare gas, or the like may be used. Typical examples of a rare gas element include helium, neon, argon, krypton, and xenon. The concentration of such an element can be measured by secondary ion mass spectrometry (SIMS) or the like.

The use of boron or phosphorus is preferable, in which case the apparatus for a manufacturing line using amorphous silicon or low-temperature polysilicon can be employed. The utilization of the existing equipment leads to less capital expenditure.

A transistor including a semiconductor layer part of which has a lower resistance can be formed with the use of a dummy gate, for example. Specifically, a dummy gate is provided over a semiconductor layer, and an element that lowers the resistance of the semiconductor layer is added with the dummy gate as a mask. Thus, the element is added to a region of the semiconductor layer that is not overlapped by the dummy gate, whereby a low-resistance region is formed. To add the element, it is possible to use, for example, an ion implantation method by which an ionized source gas is subjected to mass separation and then added, an ion doping method by which an ionized source gas is added without mass separation, or a plasma immersion ion implantation method.

Examples of conductive materials used for the conductors include a semiconductor typified by polycrystalline silicon doped with an impurity element such as phosphorus; silicide such as nickel silicide; a metal such as molybdenum, titanium, tantalum, tungsten, aluminum, copper, chromium, neodymium, and scandium; and a metal nitride containing any of the above metals as its component (tantalum nitride, titanium nitride, molybdenum nitride, and tungsten nitride). It is also possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Examples of insulating materials used for the insulators include aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, and aluminum silicate. Note that in this specification and the like, an oxynitride refers to a compound that contains more oxygen than nitrogen, and a nitride oxide refers to a compound that contains more nitrogen than oxygen.

This embodiment can be implemented in an appropriate combination with any of the structures described in the other embodiments and the like.

Embodiment 5

This embodiment will show a configuration example of a semiconductor device functioning as a neural network that can be used, for example, for the circuit 14 described in Embodiment 1.

Figure 19A:
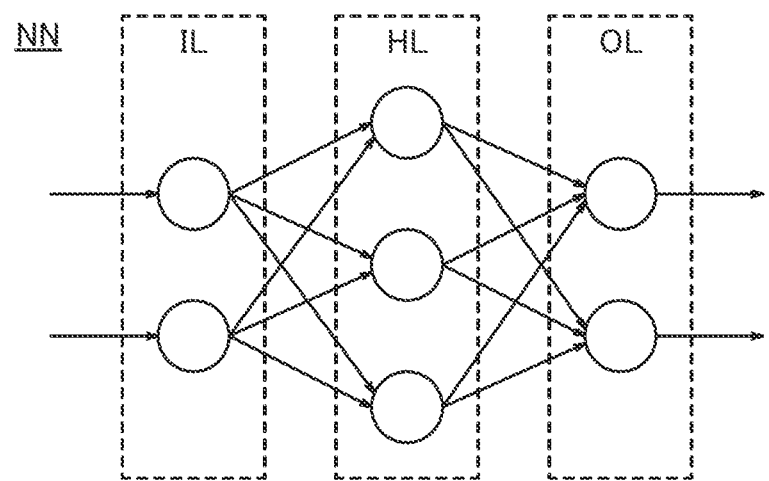
FIGS. 19A and 19B illustrate a configuration example of a neural network.

As illustrated in FIG. 19A, a neural network NN can be formed of an input layer IL, an output layer OL, and a middle layer (hidden layer) HL. The input layer IL, the output layer OL, and the middle layer HL each include one or more neurons (units). Note that the middle layer HL may be one layer or two or more layers. A neural network including two or more middle layers HL can be referred to as a deep neural network (DNN), and learning using a deep neural network can be referred to as deep learning.

Input data is input to the neurons of the input layer IL, output signals of the neurons in the previous layer or the subsequent layer are input to the neurons of the middle layer HL, and output signals of the neurons in the previous layer are input to the neurons of the output layer OL. Note that each neuron may be connected to all the neurons in the previous and subsequent layers (i.e., full connection) or may be connected to some of the neurons.

Figure 19B:
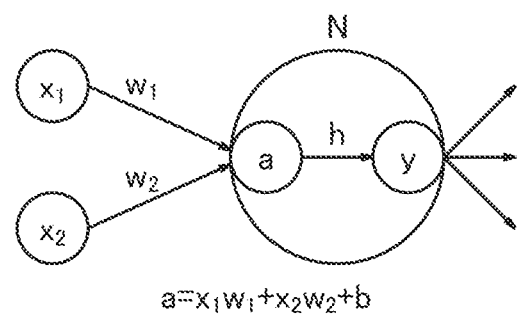

FIG. 19B illustrates an example of an operation with neurons. Here, a neuron N and two neurons in the previous layer that output signals to the neuron N are illustrated. An output $x_1$ of one neuron in the previous layer and an output X2 of the other neuron in the previous layer are input to the neuron N. Subsequently, in the neuron N, a total sum $x_1w_1 \pm x_2w_2$ of a multiplication result $(x_1w_1)$ of the output $x_1$ and a weight $w_1$ and a multiplication result $(x_2w_2)$ of the output $x_2$ and a weight $w_2$ is calculated, and then a bias b is added as necessary, so that the value $a=x_1w_1+x_2w_2+b$ is obtained. Then, the value a is converted with an activation function h, and an output signal y=h(a) is output from the neuron N.

In this manner, the operation with the neurons includes the operation that sums the products of the outputs and the weights of the neurons in the previous layer, that is, the product-sum operation ($x_1w_1+x_2w_2$ described above). This product-sum operation may be performed using a program on software or using hardware. When the product-sum operation is performed by hardware, a product-sum operation circuit (a multiplier-accumulator, or MAC) can be used. The product-sum operation circuit can be a digital circuit or an analog circuit.

When an analog circuit is used as the product-sum operation circuit, the circuit scale of the product-sum operation circuit can be reduced, or higher processing speed and lower power consumption can be achieved by reduced frequency of access to a memory.

The product-sum operation circuit may be configured with Si transistors or OS transistors. An OS transistor is particularly suitable as a transistor included in an analog memory of the product-sum operation circuit because of its extremely low off-state current. Note that the product-sum operation circuit may be formed using both Si transistors and OS transistors. A configuration example of a semiconductor device having a function of the product-sum operation circuit is described below.

<Configuration Example of Semiconductor Device>

Figure 20:
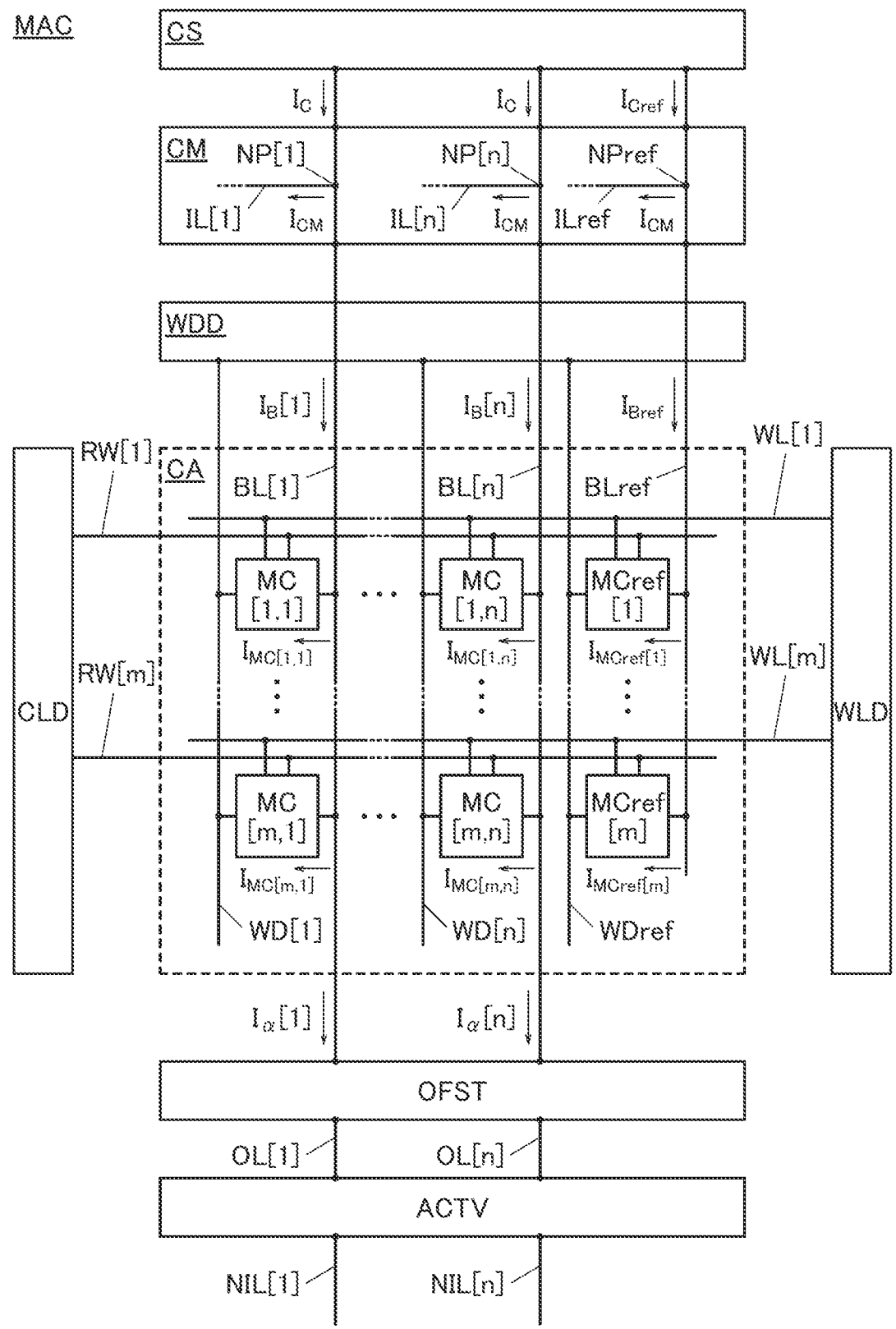
FIG. 20 illustrates a configuration example of a semiconductor device.

FIG. 20 illustrates a configuration example of a semiconductor device MAC configured to perform an operation in a neural network. The semiconductor device MAC has a function of performing a product-sum operation of first data corresponding to the strength of connection between the neurons (i.e., the weight) and second data corresponding to input data. Note that the first data and the second data can each be analog data or multilevel data (discrete data). The semiconductor device MAC is also configured to convert, with the activation function, data obtained from the product-sum operation.

The semiconductor device MAC includes a cell array CA, a current source circuit CS, a current mirror circuit CM, a circuit WDD, a circuit WLD, a circuit CLD, an offset circuit OFST, and an activation function circuit ACTV.

The cell array CA includes a plurality of memory cells MC and a plurality of memory cells MCref. In the configuration example illustrated in FIG. 20, the cell array CA includes memory cells MC in m rows and n columns (memory cells MC[1,1] to MC[m,n]) and m memory cells MCref (memory cells MCref[1] to MCref[m]), where m and n are each an integer of 1 or more. The memory cell MC has a function of storing the first data. The memory cell MCref has a function of storing reference data used for the product-sum operation. Note that the reference data can be analog data or multilevel digital data.

The memory cell MC[i,j] is connected to a wiring WL[i], a wiring RW[i], a wiring WD[j], and a wiring BL[j], where i is an integer of 1 to m inclusive and j is an integer of 1 to n inclusive. The memory cell MCref[i] is connected to the wiring WL[i], the wiring RW[i], a wiring WDref, and a wiring BLref. Here, a current flowing between the memory cell MC[i,j] and the wiring BL[j] is denoted by $I_{MC[i,j]}$, and a current flowing between the memory cell MCref[i] and the wiring BLref is denoted by $I_{MCref[i]}$.

Figure 21:
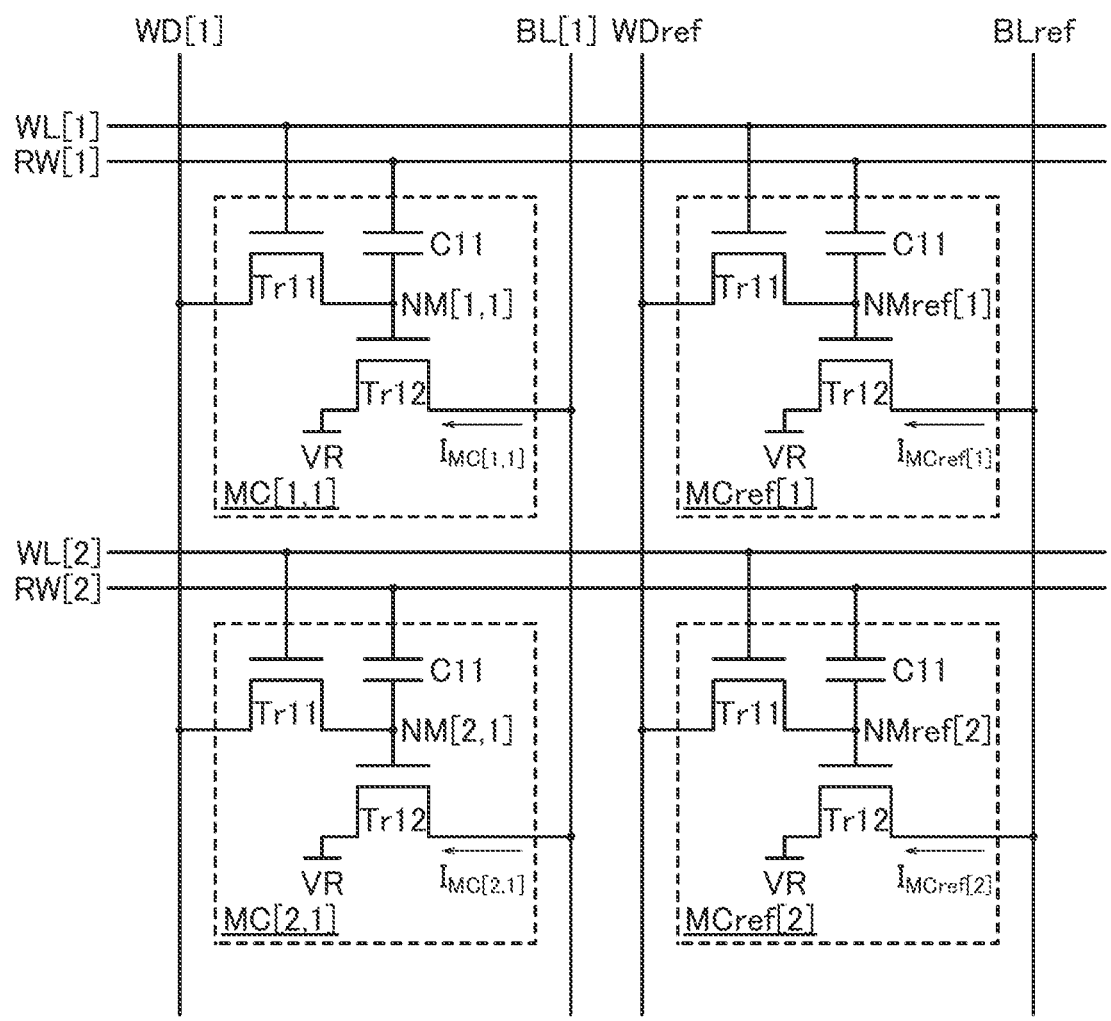
FIG. 21 illustrates a configuration example of memory cells.

FIG. 21 illustrates a specific configuration example of the memory cell MC and the memory cell MCref. Although the memory cells MC[1,1] and MC[2,1] and the memory cells MCref[1] and MCref[2] are shown in FIG. 21 as a typical example, a similar configuration can also be applied to the other memory cells MC and MCref. The memory cells MC and the memory cells MCref each include a transistor Tr11, a transistor Tr12, and a capacitor C11. Here, the case where the transistors Tr11 and Tr12 are n-channel transistors is described.

In the memory cell MC, a gate of the transistor Tr11 is connected to the wiring WL, one of a source and a drain of the transistor Tr11 is connected to a gate of the transistor Tr12 and a first electrode of the capacitor C11, and the other of the source and the drain of the transistor Tr11 is connected to the wiring WD. One of a source and a drain of the transistor Tr12 is connected to the wiring BL, and the other of the source and the drain thereof is connected to a wiring VR. A second electrode of the capacitor C11 is connected to the wiring RW. The wiring VR has a function of supplying a predetermined potential. In this example, a low power supply potential (e.g., a ground potential) is supplied from the wiring VR.

A node NM refers to a node connected to the one of the source and the drain of the transistor Tr11, the gate of the transistor Tr12, and the first electrode of the capacitor C11. A node NM[1,1] refers to the node NM in the memory cell MC[1,1], and a node NM[2,1] refers to the node NM in the memory cell MC[2,1].

The configuration of the memory cell MCref is the same as that of the memory cell MC except that the memory cell MCref is connected to the wiring WDref instead of the wiring WD and connected to the wiring BLref instead of the wiring BL. A node NMref[1] refers to a node connected to the one of the source and the drain of the transistor Tr11, the gate of the transistor Tr12, and the first electrode of the capacitor C11 in the memory cell MCref[1]; a node NMref[2] refers to the corresponding node in the memory cell MCref[2].

The node NM and the node NMref function as retention nodes of the memory cell MC and the memory cell MCref, respectively. The first data is held in the node NM, and the reference data is held in the node NMref. A current $I_{MC[1,1]}$ and a current $I_{MC[2,1]}$ flow from the wiring BL[1] to the transistors Tr12 in the memory cell MC[1,1] and the memory cell MC[2,1], respectively. A current $I_{MCref[1]}$ and a current $I_{MCref[2]}$ flow from the wiring BLref to the transistors Tr12 in the memory cell MCref[1] and the memory cell MCref[2], respectively.

Since the transistor Tr11 has a function of holding the potential of the node NM or the node NMref, the off-state current of the transistor Tr11 is preferably low. Thus, it is preferable to use an OS transistor, which has an extremely low off-state current, as the transistor Tr11. This reduces a change in the potential of the node NM or the node NMref, resulting in higher operation accuracy. Furthermore, refreshing the potential of the node NM or the node NMref can be less frequent, leading to a reduction in power consumption.

There is no particular limitation on the transistor Tr12, and a Si transistor or an OS transistor can be used, for example. When an OS transistor is used as the transistor Tr12, the transistor Tr12 can be manufactured with the same manufacturing apparatus as the transistor Tr11, and accordingly manufacturing cost can be reduced. Note that the transistor Tr12 can be an n-channel transistor or a p-channel transistor.

The current source circuit CS is connected to the wirings BL[1] to BL[n] and the wiring BLref. The current source circuit CS has a function of supplying currents to the wirings BL[1] to BL[n] and the wiring BLref. Note that the value of the current supplied to the wirings BL[1] to BL[n] may be different from that of the current supplied to the wiring BLref. Here, the current supplied from the current source circuit CS to the wirings BL[1] to BL[n] is denoted by $I_C$, and the current supplied from the current source circuit CS to the wiring BLref is denoted by $I_{Cref}$.

The current mirror circuit CM includes wirings IL[1] to IL [n] and a wiring ILref. The wirings IL[1] to IL[n] are connected to the respective wirings BL[1] to BL[n], and the wiring ILref is connected to the wiring BLref. Here, portions where the wirings IL[1] to IL[n] are connected to the respective wirings BL[1] to BL[n] are referred to as nodes NP[1] to NP[n]. A portion where the wiring ILref is connected to the wiring BLref is referred to as a node NPref.

The current mirror circuit CM has a function of making the current $I_{CM}$ corresponding to the potential of the node NPref flow to the wiring ILref and a function of making this current $I_{CM}$ flow also to the wirings IL[1] to IL[n]. In the example illustrated in FIG. 20, the current $I_{CM}$ is discharged from the wiring BLref to the wiring ILref, and the current $I_{CM}$ is discharged from the wirings BL[1] to BL[n] to the wirings IL[1] to IL[n]. Currents flowing from the current mirror circuit CM to the cell array CA through the wirings BL[1] to BL[n] are denoted by $I_B[1]$ to $I_B[n]$. A current flowing from the current mirror circuit CM to the cell array CA through the wiring BLref is denoted by $I_{Bref}$.

The circuit WDD is connected to wirings WD[1] to WD[n] and the wiring WDref. The circuit WDD has a function of supplying a potential corresponding to the first data stored in the memory cells MC to the wirings WD[1] to WD[n]. The circuit WDD also has a function of supplying a potential corresponding to the reference data stored in the memory cell MCref to the wiring WDref. The circuit WLD is connected to wirings WL[1] to WL[m]. The circuit WLD has a function of supplying, to the wirings WL[1] to WL[m], a signal for selecting the memory cell MC or the memory cell MCref to which data is to be written. The circuit CLD is connected to wirings RW[1] to RW[m]. The circuit CLD has a function of supplying a potential corresponding to the second data to the wirings RW[1] to RW[m].

The offset circuit OFST is connected to the wirings BL[1] to BL[n] and wirings OL[1] to OL[n]. The offset circuit OFST has a function of measuring the amount of current flowing from the wirings BL[1] to BL[n] to the offset circuit OFST and/or the amount of change in current flowing from the wirings BL[1] to BL[n] to the offset circuit OFST. The offset circuit OFST also has a function of outputting the measurement results to the wirings OL[1] to OL[n]. Note that the offset circuit OFST may output a current corresponding to the measurement result to the wiring OL, or may convert the current corresponding to the measurement result into a voltage to output the voltage to the wiring OL. The currents flowing between the cell array CA and the offset circuit OFST are denoted by $I_\alpha[1]$ to $I_\alpha[n]$.

Figure 22:
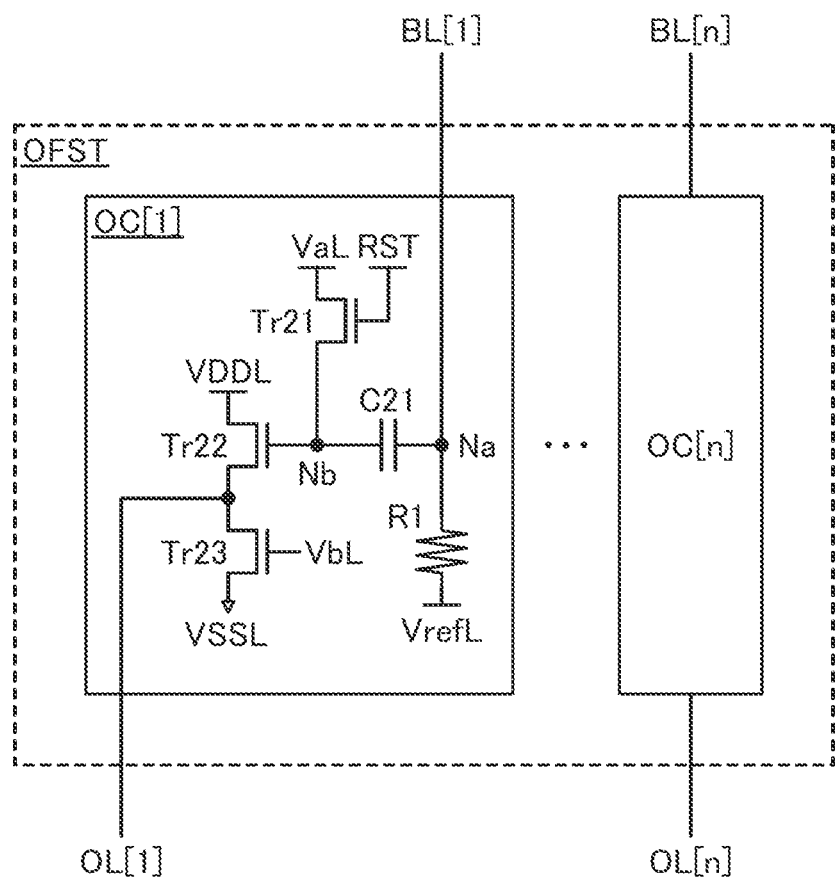
FIG. 22 illustrates a configuration example of an offset circuit.

FIG. 22 illustrates a configuration example of the offset circuit OFST. The offset circuit OFST illustrated in FIG. 22 includes circuits OC[1] to OC[n]. Each of the circuits OC[1] to OC[n] includes a transistor Tr21, a transistor Tr22, a transistor Tr23, a capacitor C21, and a resistor R1. Connection relations of the components are as illustrated in FIG. 22. Note that a node connected to a first electrode of the capacitor C21 and a first terminal of the resistor R1 is referred to as a node Na. A node connected to a second electrode of the capacitor C21, one of a source and a drain of a transistor Tr21, and a gate of the transistor Tr22 is referred to as a node Nb.

A wiring VrefL has a function of supplying a potential Vref, a wiring VaL has a function of supplying a potential Va, and a wiring VbL has a function of supplying a potential Vb. A wiring VDDL has a function of supplying a potential VDD, and a wiring VSSL has a function of supplying a potential VSS. Here, the case where the potential VDD is a high power supply potential and the potential VSS is a low power supply potential is described. A wiring RST has a function of supplying a potential for controlling the on/off state of the transistor Tr21. The transistor Tr22, the transistor Tr23, the wiring VDDL, the wiring VSSL, and the wiring VbL form a source follower circuit.

Next, an operation example of the circuits OC[1] to OC[n] is described. Although an operation example of the circuit OC[1] is described here as a typical example, the circuits OC[2] to OC[n] can be operated in a manner similar to that of the circuit OC[1]. First, when a first current flows to the wiring BL[1], the potential of the node Na becomes a potential corresponding to the first current and the resistance of the resistor R1. At this time, the transistor Tr21 is on, and thus the potential Va is supplied to the node Nb. Then, the transistor Tr21 is turned off.

Next, when a second current flows to the wiring BL[1], the potential of the node Na becomes a potential corresponding to the second current and the resistance of the resistor R1. Since the transistor Tr21 is off and the node Nb is floating at this time, the potential of the node Nb is changed owing to capacitive coupling, following the change in the potential of the node Na. Here, given that the amount of change in the potential of the node Na is $\Delta V_{Na}$ and the capacitive coupling coefficient is 1, the potential of the node Nb is $Va+\Delta V_{Na}$. Given also that the threshold voltage of the transistor Tr22 is $V_{th}$, a potential $Va+\Delta V_{Na}-V_{th}$ is output from the wiring OL[1]. Here, when Va is set equal to $V_{th}$, the potential $\Delta V_{Na}$ can be output from the wiring OL[1].

The potential $\Delta V_{Na}$ is determined by the amount of change from the first current to the second current, the resistance of the resistor R1, and the potential Vref. Here, since the resistance of the resistor R1 and the potential Vref are known, the amount of change in the current flowing to the wiring BL can be found from the potential $\Delta V_{Na}$.

Signals corresponding to the amount of current and/or the amount of current change, which are measured by the offset circuit OFST as described above, are input to the activation function circuit ACTV through the wirings OL[1] to OL[n].

The activation function circuit ACTV is connected to the wirings OL[1] to OL[n] and wirings NIL[1] to NIL[n]. The activation function circuit ACTV is configured to perform an operation for converting the signal input from the offset circuit OFST in accordance with a predefined activation function. As the activation function, a sigmoid function, a tan h function, a softmax function, a ReLU function, or a threshold function can be used, for example. The signal converted by the activation function circuit ACTV is output as output data to the wirings NIL[1] to NIL[n].

<Performance Example of Semiconductor Device>

With the above semiconductor device MAC, the product-sum operation of the first data and the second data can be performed. A performance example of the semiconductor device MAC at the time of performing the product-sum operation is described below.

Figure 23:
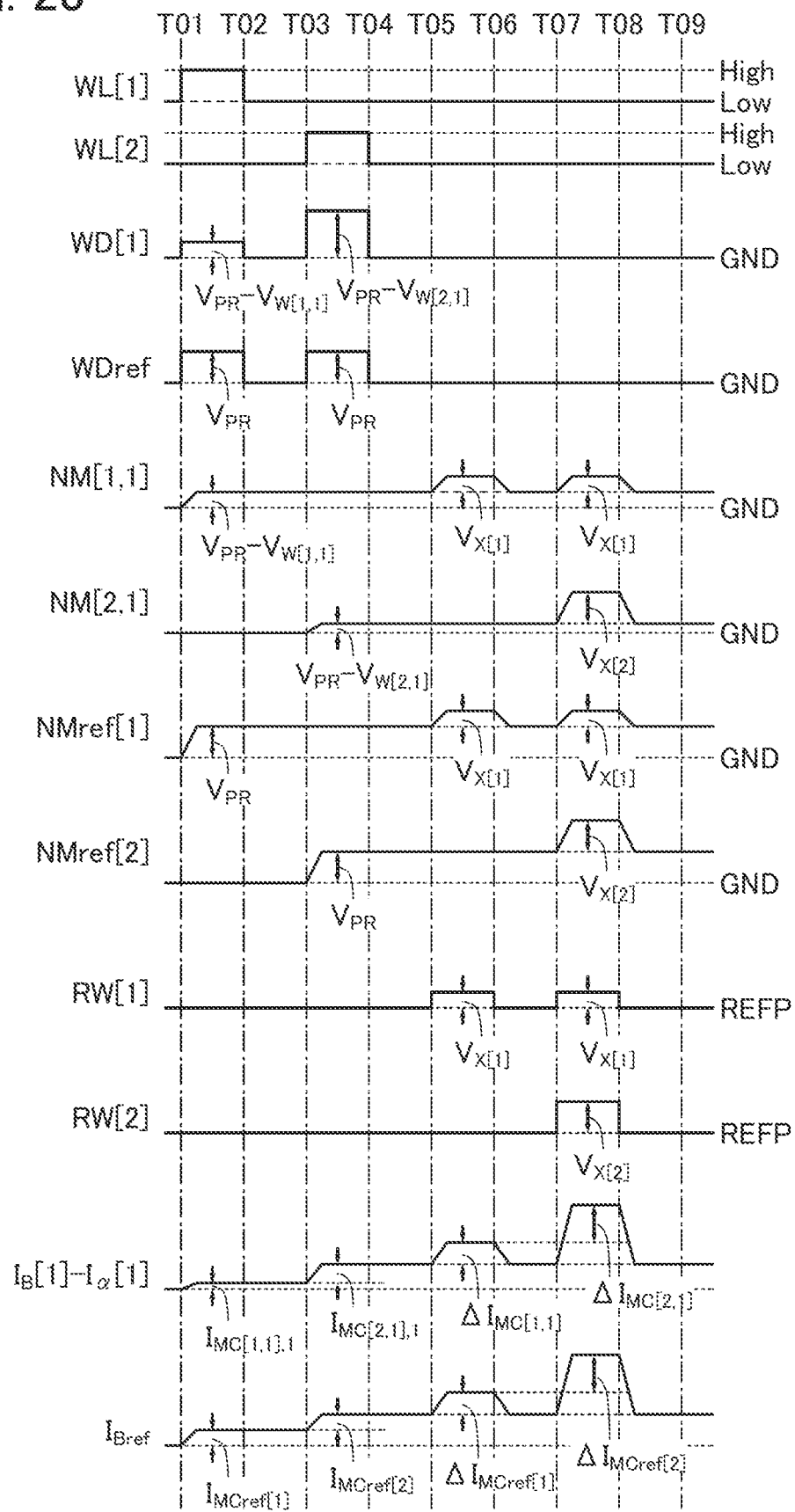
FIG. 23 is a timing chart illustrating operation of a semiconductor device.

FIG. 23 is a timing chart showing the operation example of the semiconductor device MAC. FIG. 23 shows changes in potentials of the wirings WL[1], WL[2], WD[1], and WDref, the nodes NM[1,1], NM[2,1], NMref[1], and NMref[2], and the wirings RW[1] and RW[2] in FIG. 21 and changes in values of a current $I_B[1]-I_\alpha[1]$ and the current $I_{Bref}$. The current $I_B[1]-I_\alpha[1]$ corresponds to a total of the currents flowing from the wiring BL[1] through the memory cells MC[1,1] and MC[2,1].

Although the operation is described with a focus on the memory cells MC[1,1], MC[2,1], MCref[1], and MCref[2] illustrated in FIG. 21 as a typical example, the other memory cells MC and MCref can also be operated in a similar manner.

[Storage of First Data]

First, between Time T01 and Time T02, the potential of the wiring WL[1] becomes high level, the potential of the wiring WD[1] becomes higher than a ground potential (GND) by $V_{PR}-V_{W[1,1]}$, and the potential of the wiring WDref becomes higher than the ground potential by $V_{PR}$. The potentials of the wirings RW[1] and RW[2] are a reference potential (REFP). Note that the potential $V_{W[1,1]}$ is a potential corresponding to the first data stored in the memory cell MC[1,1], and the potential $V_{PR}$ is a potential corresponding to the reference data. Thus, the transistors Tr11 in the memory cells MC[1,1] and MCref[1] are turned on, and the potential of the node NM[1,1] becomes $V_{PR}-V_{W[1,1]}$ and the potential of the node NMref[1] becomes $V_{PR}$.

At this time, a current $I_{MC[1,1],0}$ flowing from the wiring BL[1] to the transistor Tr12 in the memory cell MC[1,1] can be expressed by the following formula. Here, k is a constant determined by the channel length, channel width, mobility, capacitance of a gate insulating film, and the like of the transistor Tr12. Furthermore, $V_{th}$ is the threshold voltage of the transistor Tr12.

$$I_{MC[1,1],0}=k(V_{PR}-V_{W[1,1]}-V_{th})^2 \quad (E1)$$

A current $I_{MCref[1],0}$ flowing from the wiring BLref to the transistor Tr12 in the memory cell MCref[1] can be expressed by the following formula.

$$I_{MCref[1],0}=k(V_{PR}-V_{th})^2 \quad (E2)$$

Next, between Time T02 and Time T03, the potential of the wiring WL[1] becomes low level. Consequently, the transistors Tr11 in the memory cells MC[1,1] and MCref[1] are turned off, and the potentials of the nodes NM[1,1] and NMref[1] are held.

As described above, an OS transistor is preferably used as the transistor Tr11, in which case the leakage current of the transistor Tr11 can be reduced and the potentials of the nodes NM[1,1] and NMref[1] can be precisely held as a result.

Subsequently, between Time T03 and Time T04, the potential of the wiring WL[2] becomes high level, the potential of the wiring WD[1] becomes higher than the ground potential by $V_{PR}-V_{W[2,1]}$, and the potential of the wiring WDref becomes higher than the ground potential by $V_{PR}$. Note that the potential $V_{W[2,1]}$ is a potential corresponding to the first data stored in the memory cell MC[2,1]. Thus, the transistors Tr11 in the memory cells MC[2,1] and MCref[2] are turned on, and the potential of the node NM[2,1] becomes $V_{PR}-V_{W[2,1]}$ and the potential of the node NMref[2] becomes $V_{PR}$.

Here, a current $I_{MC[2,1],0}$ flowing from the wiring BL[1] to the transistor Tr12 in the memory cell MC[2,1] can be expressed by the following formula.

$$I_{MC[2,1],0}=k(V_{PR}-V_{W[2,1]}-V_{th})^2 \quad (E3)$$

A current $I_{MCref[2],0}$ flowing from the wiring BLref to the transistor Tr12 in the memory cell MCref[2] can be expressed by the following formula.

$$I_{MCref[2],0}=k(V_{PR}-V_{th})^2 \quad (E4)$$

Next, between Time T04 and Time T05, the potential of the wiring WL[2] becomes low level. Consequently, the transistors Tr11 in the memory cells MC[2,1] and MCref[2] are turned off, and the potentials of the nodes NM[2,1] and NMref[2] are held.

Through the above operation, the first data is stored in the memory cells MC[1,1] and MC[2,1], and the reference data is stored in the memory cells MCref[1] and MCref[2].

Here, currents flowing through the wirings BL[1] and BLref between Time T04 and Time T05 are considered. The current from the current source circuit CS is supplied to the wiring BLref. The current flowing through the wiring BLref is discharged to the current mirror circuit CM and the memory cells MCref[1] and MCref[2]. A formula shown below holds where $I_{Cref}$ is the current supplied from the current source circuit CS to the wiring BLref and $I_{CM,0}$ is the current discharged from the wiring BLref to the current mirror circuit CM.

$$I_{Cref}-I_{CM,0}=I_{MCref[1],0}+I_{MCref[2],0} \quad (E5)$$

The current from the current source circuit CS is supplied to the wiring BL[1]. The current flowing through the wiring BL[1] is discharged to the current mirror circuit CM and the memory cells MC[1,1] and MC[2,1]. Furthermore, the current flows from the wiring BL[1] to the offset circuit OFST. A formula shown below holds where $I_{C,0}$ is the current supplied from the current source circuit CS to the wiring BL[1] and $I_{\alpha,0}$ is the current flowing from the wiring BL[1] to the offset circuit OFST.

$$I_C-I_{CM,0}=I_{MC[1,1],0}+I_{MC[2,1],0}+I_{\alpha,0} \quad (E6)$$

[Product-Sum Operation of First Data and Second Data]

Next, between Time T05 and Time T06, the potential of the wiring RW[1] becomes higher than the reference potential by $V_{X[1]}$. At this time, the potential $V_{X[1]}$ is supplied to the capacitors C11 in the memory cells MC[1,1] and MCref[1], so that the potentials of the gates of the transistors Tr12 increase owing to capacitive coupling. Note that the potential $V_{X[1]}$ is a potential corresponding to the second data supplied to the memory cells MC[1,1] and MCref[1].

The amount of change in the gate potential of the transistor Tr12 corresponds to the value obtained by multiplying the amount of change in the potential of the wiring RW by a capacitive coupling coefficient determined by the memory cell configuration. The capacitive coupling coefficient is calculated on the basis of the capacitance of the capacitor C11, the gate capacitance of the transistor Tr12, the parasitic capacitance, and the like. For convenience, the amount of change in the potential of the wiring RW is equal to the amount of change in the gate potential of the transistor Tr12, that is, the capacitive coupling coefficient is 1 in the following description. In practice, the potential $V_X$ can be determined in consideration of the capacitive coupling coefficient.

When the potential $V_{X[1]}$ is supplied to the capacitors C11 in the memory cells MC[1,1] and MCref[1], the potentials of the nodes NM[1,1] and NMref[1] increase by $V_{X[1]}$.

Here, a current $I_{MC[1,1],1}$ flowing from the wiring BL[1] to the transistor Tr12 in the memory cell MC[1,1] between Time T05 and Time T06 can be expressed by the following formula.

$$I_{MC[1,1],1} = k(V_{PR} - V_{W[1,1]} + V_{X[1]} - V_{th})^2 \quad (E7)$$

Accordingly, when the potential $V_{X[1]}$ is supplied to the wiring RW[1], the current flowing from the wiring BL[1] to the transistor Tr12 in the memory cell MC[1,1] increases by $\Delta I_{MC[1,1]}(=I_{MC[1,1],1} - I_{MC[1,1],0})$.

Here, a current $I_{MCref[1],1}$ flowing from the wiring BLref to the transistor Tr12 in the memory cell MCref[1] between Time T05 and Time T06 can be expressed by the following formula.

$$I_{MCref[1],1} = k(V_{PR} - V_{X[1]} - V_{th})^2 \quad (E8)$$

Accordingly, when the potential $V_{X[1]}$ is supplied to the wiring RW[1], the current flowing from the wiring BLref to the transistor Tr12 in the memory cell MCref[1] increases by $\Delta I_{MCref[1]}(=I_{MCref[1],1} - I_{MCref[1],0})$.

Currents flowing through the wirings BL[1] and BLref are considered. The current $I_{Cref}$ is supplied from the current source circuit CS to the wiring BLref. The current flowing through the wiring BLref is discharged to the current mirror circuit CM and the memory cells MCref[1] and MCref[2]. The following formula holds where $I_{CM,1}$ is the current discharged from the wiring BLref to the current mirror circuit CM.

$$I_{Cref} - I_{CM,1} = I_{MCref[1],1} + I_{MCref[2],1} \quad (E9)$$

The current $I_C$ is supplied from the current source circuit CS to the wiring BL[1]. The current flowing through the wiring BL[1] is discharged to the current mirror circuit CM and the memory cells MC[1,1] and MC[2,1]. Moreover, the current flows from the wiring BL[1] to the offset circuit OFST. The following formula holds where $I_{\alpha,1}$ is the current flowing from the wiring BL[1] to the offset circuit OFST.

$$I_C - I_{CM,1} = I_{MC[1,1],1} + I_{MC[2,1],1} + I_{\alpha,1} \quad (E10)$$

From Formulae (E1) to (E10), a difference between the current $I_{\alpha,0}$ and the current $I_{\alpha,1}$ (a differential current $\Delta I_\alpha$) can be expressed by the following formula.

$$\Delta I_\alpha = I_{\alpha,1} - I_{\alpha,0} = 2k V_{W[1,1]} V_{X[1]} \quad (E11)$$

As shown above, the differential current $\Delta I_\alpha$ depends on the product of the potentials $V_{W[1,1]}$ and $V_{X[1]}$.

After that, between Time T06 and Time T07, the potential of the wiring RW[1] becomes the reference potential, and the potentials of the nodes NM[1,1] and NMref[1] become the same as those between Time T04 and Time T05.

Next, between Time T07 and Time T08, the potential of the wiring RW[1] becomes higher than the reference potential by $V_{X[1]}$, and the potential of the wiring RW[2] becomes higher than the reference potential by $V_{X[2]}$. Thus, the potential $V_{X[1]}$ is supplied to the capacitors C11 in the memory cells MC[1,1] and MCref[1], and the potentials of the nodes NM[1,1] and NMref[1] increase by $V_{X[1]}$ owing to capacitive coupling. Moreover, the potential $V_{X[2]}$ is supplied to the capacitors C11 in the memory cells MC[2,1] and MCref[2], and the potentials of the nodes NM[2,1] and NMref[2] increase by $V_{X[2]}$ owing to capacitive coupling.

Here, a current $I_{MC[2,1],1}$ flowing from the wiring BL[1] to the transistor Tr12 in the memory cell MC[2,1] between Time T07 and Time T08 can be expressed by the following formula.

$$I_{MC[2,1],1} = k(V_{PR} - V_{W[2,1]} + V_{X[2]} - V_{th})^2 \quad (E12)$$

Accordingly, when the potential $V_{X[2]}$ is supplied to the wiring RW[2], the current flowing from the wiring BL[1] to the transistor Tr12 in the memory cell MC[2,1] increases by $\Delta I_{MC[2,1]}(=I_{MC[2,1],1} - I_{MC[2,1],0})$.

Here, a current $I_{MCref[2],1}$ flowing from the wiring BLref to the transistor Tr12 in the memory cell MCref[2] between Time T07 and Time T08 can be expressed by the following formula.

$$I_{MCref[2],1} = k(V_{PR} + V_{X[2]} - V_{th})^2 \quad (E13)$$

Accordingly, when the potential $V_{X[2]}$ is supplied to the wiring RW[2], the current flowing from the wiring BLref to the transistor Tr12 in the memory cell MCref[2] increases by $\Delta I_{MCref[2]}(=I_{MCref[2],1} - I_{MCref[2],0})$.

Furthermore, currents flowing through the wirings BL[1] and BLref are considered. The current $I_{Cref}$ is supplied from the current source circuit CS to the wiring BLref. The current flowing through the wiring BLref is discharged to the current mirror circuit CM and the memory cells MCref[1] and MCref[2]. The following formula holds where $I_{CM,2}$ is the current discharged from the wiring BLref to the current mirror circuit CM.

$$I_{Cref} - I_{CM,2} = I_{MCref[1],1} + I_{MCref[2],1} \quad (E14)$$

The current $I_C$ is supplied from the current source circuit CS to the wiring BL[1]. The current flowing through the wiring BL[1] is discharged to the current mirror circuit CM and the memory cells MC[1,1] and MC[2,1]. Moreover, the current flows from the wiring BL[1] to the offset circuit OFST. The following formula holds where $I_{\alpha,2}$ is the current flowing from the wiring BL[1] to the offset circuit OFST.

$$I_C - I_{CM,2} = I_{MC[1,1],1} + I_{MC[2,1],1} + I_{\alpha,2} \quad (E15)$$

From Formulae (E1) to (E8) and Formulae (E12) to (E15), a difference between the current $I_{\alpha,0}$ and the current $I_{\alpha,2}$ (the differential current $\Delta I_\alpha$) can be expressed by the following formula.

$$\Delta I_\alpha = I_{\alpha,2} - I_{\alpha,0} = 2k(V_{W[1,1]} V_{X[1]} + V_{W[2,1]} V_{X[2]}) \quad (E16)$$

As shown above, the differential current $\Delta I_\alpha$ depends on the sum of the product of the potentials $V_{W[1,1]}$ and $V_{X[1]}$ and the product of the potentials $V_{W[2,1]}$ and $V_{X[2]}$.

Then, between Time T08 and Time T09, the potentials of the wirings RW[1] and RW[2] become the reference potential, and the potentials of the nodes NM[1,1], NM[2,1], NMref[1], and NMref[2] become the same as those between Time T04 and Time T05.

As represented by Formulae (E11) and (E16), the differential current $\Delta I_\alpha$ input to the offset circuit OFST can be calculated from the formula including a product term of the potential $V_W$ corresponding to the first data (weight) and the potential $V_X$ corresponding to the second data (input data). Consequently, measurement of the differential current $\Delta I_\alpha$ with the offset circuit OFST gives the result of the product-sum operation of the first data and the second data.

Note that although the above description focuses on the memory cells MC[1,1], MC[2,1], MCref[1], and MCref[2], the number of memory cells MC and MCref can be any number. The differential current $\Delta I_\alpha$ can be expressed by the following formula where the number m of rows of the memory cells MC and MCref is a given number i.

$$\Delta I_\alpha = 2k\Sigma_i V_{W[i,1]} V_{X[i]} \tag{E17}$$

With an increasing number n of columns of the memory cells MC and MCref, the number of product-sum operations executed in parallel can be increased.

The product-sum operation of the first data and the second data can be performed using the semiconductor device MAC as described above. Note that the use of the configuration of the memory cells MC and MCref shown in FIG. 21 allows the product-sum operation circuit to be formed of fewer transistors. Accordingly, the circuit scale of the semiconductor device MAC can be reduced.

When the semiconductor device MAC is used for the operation in the neural network, the number m of rows of the memory cells MC can correspond to the number of input data supplied to one neuron and the number n of columns of the memory cells MC can correspond to the number of neurons. The case where a product-sum operation using the semiconductor device MAC is performed in the middle layer HL in FIG. 19A is considered, for example. In this case, the number m of rows of the memory cells MC can be set to the number of input data supplied from the input layer IL (the number of neurons in the input layer IL), and the number n of columns of the memory cells MC can be set to the number of neurons in the middle layer HL.

Note that there is no particular limitation on the structure of the neural network for which the semiconductor device MAC is used. For example, the semiconductor device MAC can also be used for a convolutional neural network (CNN), a recurrent neural network (RNN), an autoencoder, or a Boltzmann machine (including a restricted Boltzmann machine).

The product-sum operation in the neural network can be performed using the semiconductor device MAC as described above. Furthermore, the use of the memory cells MC and MCref illustrated in FIG. 21 in the cell array CA can provide an integrated circuit with higher operation accuracy, lower power consumption, or a smaller circuit scale.

This embodiment can be implemented in an appropriate combination with any of the structures described in the other embodiments and the like.

Embodiment 6

Examples of electronic devices that can use the display device in one embodiment of the present invention include display devices, personal computers, image storage devices or image reproducing devices provided with storage media, cellular phones, game machines (including portable game machines), portable data terminals, e-book readers, cameras such as video cameras and digital still cameras, goggle-type displays (head mounted displays), navigation systems, audio reproducing devices (e.g., car audio players and digital audio players), copiers, facsimiles, printers, multifunction printers, automated teller machines (ATM), and vending machines. FIGS. 24A to 24F illustrate specific examples of these electronic devices.

Figure 24A:
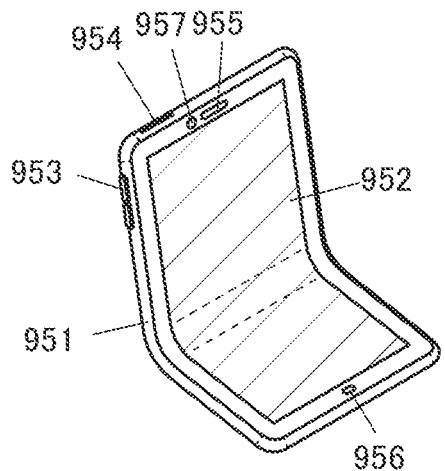
FIGS. 24A to 24F illustrate electronic devices.

FIG. 24A illustrates a cellular phone which includes a housing 951, a display portion 952, an operation button 953, an external connection port 954, a speaker 955, a microphone 956, a camera 957, and the like. The display portion 952 of the cellular phone includes a touch sensor. Operations such as making a call and inputting text can be performed by touch on the display portion 952 with a finger, a stylus, or the like. The housing 951 and the display portion 952 have flexibility and can be bent when used as illustrated in FIG. 24A. When the display device of one embodiment of the present invention is used for the display portion 952, high-quality display can be performed.

Figure 24B:
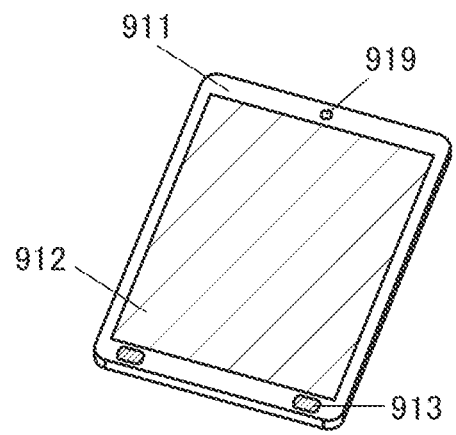

FIG. 24B illustrates a portable information terminal, which includes a housing 911, a display portion 912, a speaker 913, a camera 919, and the like. A touch panel function of the display portion 912 enables input and output of information. When the display device of one embodiment of the present invention is used for the display portion 912, high-quality display can be performed.

Figure 24C:
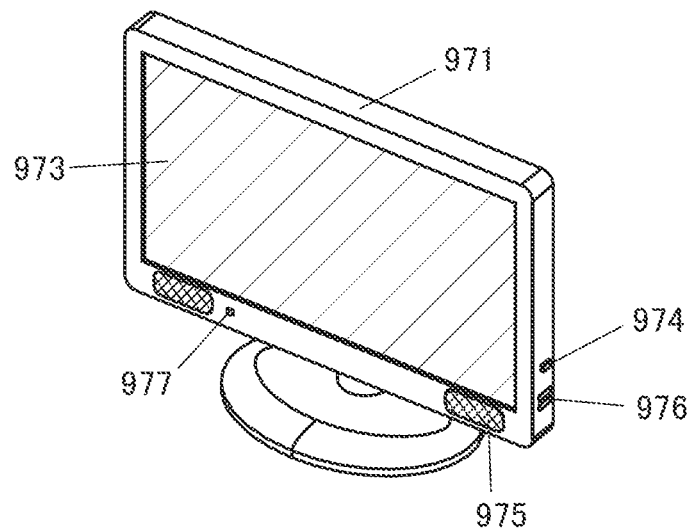

FIG. 24C illustrates a television, which includes a housing 971, a display portion 973, an operation key 974, speakers 975, a communication connection terminal 976, an optical sensor 977, and the like. The display portion 973 includes a touch sensor that enables input operation. When the display device of one embodiment of the present invention is used for the display portion 973, high-quality display can be performed.

Figure 24D:
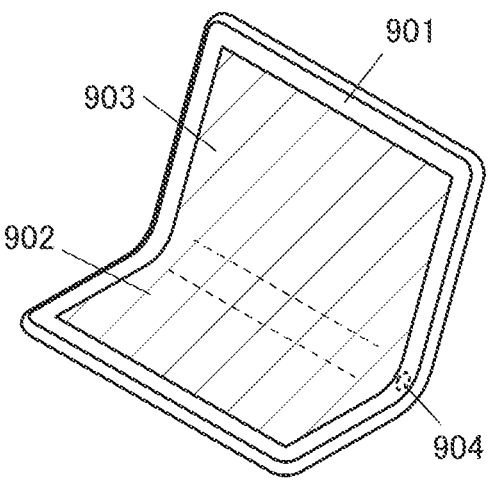

FIG. 24D illustrates an information processing terminal which includes a housing 901, a display portion 902, a display portion 903, a sensor 904, and the like. The display portions 902 and 903 are formed using one display panel and are flexible. The housing 901 is also flexible, can be bent when used illustrated in FIG. 24D, and can also be used in a flat plate-like shape like a tablet terminal. The sensor 904 can sense the shape of the housing 901, and for example, it is possible to switch display on the display portions 902 and 903 when the housing 901 is bent. When the display device of one embodiment of the present invention is used for the display portions 902 and 903, high-quality display can be performed.

Figure 24E:
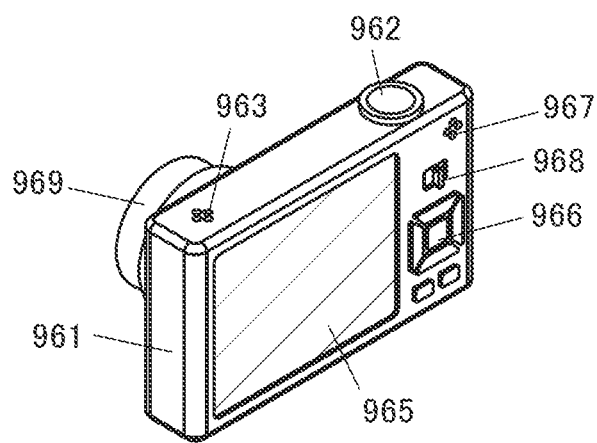

FIG. 24E illustrates a digital camera, which includes a housing 961, a shutter button 962, a microphone 963, a display portion 965, operation keys 966, a speaker 967, a zoom lever 968, a lens 969, and the like. When the display device of one embodiment of the present invention is used for the display portion 965, display with high display quality can be performed.

Figure 24F:
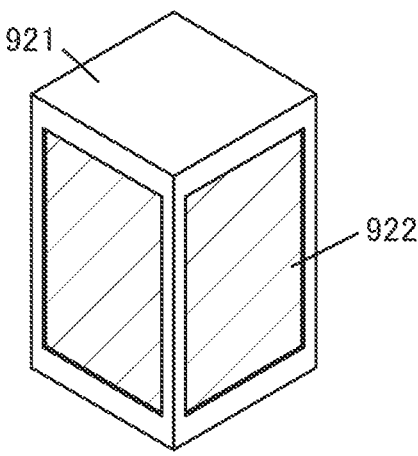

FIG. 24F illustrates a digital signage, which has large display portions 922. The digital signage can be installed on the side surface of a pillar 921, for example. When the display device of one embodiment of the present invention is used for the display portion 922, display with high display quality can be performed.

This embodiment can be implemented in an appropriate combination with any of the structures described in the other embodiments and the like.

REFERENCE NUMERALS

11: pixel, 11a: pixel, 11b: pixel, 11c: pixel, 11d: pixel, 11e: pixel, 12: row driver, 13: column driver, 14: circuit, 15: circuit, 17: column driver, 101: transistor, 102: transistor, 103: transistor, 104: capacitor, 105: capacitor, 106: liquid crystal element, 107: transistor, 112: transistor, 121: wiring, 122: wiring, 124: wiring, 125: wiring, 126: wiring, 130: wiring, 131: power supply line, 132: common wiring, 133: common wiring, 141: switch, 142: switch, 143: switch, 144: switch, 215: display portion, 221a: scan line driver circuit, 231a: signal line driver circuit, 232a: signal line driver circuit, 241a: common line driver circuit, 723: electrode, 726: insulating layer, 728: insulating layer, 729: insulating layer, 741: insulating layer, 742: semiconductor layer, 744a: electrode, 744b: electrode, 746: electrode, 755: impurity, 771: substrate, 772: insulating layer, 810: transistor, 811: transistor, 820: transistor, 821: transistor, 825: transistor, 830: transistor, 840: transistor, 842: transistor, 843: transistor, 844: transistor, 845: transistor, 846: transistor, 847: transistor, 901: housing, 902: display portion, 903: display portion, 904: sensor, 911: housing, 912: display portion, 913: speaker, 919: camera, 921: column, 922: display portion, 951: housing, 952: display portion, 953: operation button, 954: external connection port, 955: speaker, 956: microphone, 957: camera, 961: housing, 962: shutter button, 963: microphone, 965: display portion, 966: operation key, 967: speaker, 968: zoom lever, 969: lens, 971: housing, 973: display portion, 974: operation key, 975: speaker, 976: communication connection terminal, 977: optical sensor, 1000: DOSRAM, 1001: memory cell, 1002: sense amplifier unit, 1003: cell array unit, 4001: substrate, 4005: sealant, 4006: substrate, 4008: liquid crystal layer, 4010: transistor, 4011: transistor, 4013: liquid crystal element, 4014: wiring, 4015: electrode, 4017: electrode, 4018: FPC, 4019: anisotropic conductive layer, 4020: capacitor, 4021: electrode, 4030: electrode layer, 4031: electrode layer, 4032: insulating layer, 4033: insulating layer, 4035: spacer, 4041: printed circuit board, 4042: integrated circuit, 4102: insulating layer, 4103: insulating layer, 4104: insulating layer, 4110: insulating layer, 4111: insulating layer, 4112: insulating layer, 4131: coloring layer, 4132: light-blocking layer, 4133: insulating layer, 4200: input device, 4210: touch panel, 4227: electrode, 4228: electrode, 4237: wiring, 4238: wiring, 4239: wiring, 4263: substrate, 4272b: FPC, 4273b: IC This application is based on Japanese Patent Application Serial No. 2017-177462 filed with Japan Patent Office on Sep. 15, 2017, Japanese Patent Application Serial No. 2017-199264 filed with Japan Patent Office on Oct. 13, 2017, Japanese Patent Application Serial No. 2018-029287 filed with Japan Patent Office on Feb. 22, 2018, and Japanese Patent Application Serial No. 2018-075819 filed with Japan Patent Office on Apr. 11, 2018, the entire contents of which are hereby incorporated by reference.

The invention claimed is:

1. A display device comprising a pixel, the pixel comprising:
a first transistor, a second transistor, a third transistor, a first capacitor, a second capacitor, and a display element,
wherein one of a source and a drain of the first transistor is electrically connected to one electrode of the first capacitor,
wherein the other electrode of the first capacitor is electrically connected to one of a source and a drain of the second transistor and one of a source and a drain of the third transistor,
wherein the other of the source and the drain of the third transistor is electrically connected to one electrode of the second capacitor and the display element,
wherein the third transistor is positioned between the other electrode of the first capacitor and the one electrode of the second capacitor,
wherein the other of the source and the drain of the first transistor is electrically connected to a first wiring configured to supply image data, and
wherein the other of the source and the drain of the second transistor is electrically connected to a second wiring configured to supply correction data.

2. The display device according to claim 1,
wherein the pixel further comprises a fourth transistor,
wherein one of a source and a drain of the fourth transistor is electrically connected to the display element, and
wherein the other of the source and the drain of the fourth transistor is electrically connected to a wiring configured to supply a constant potential.

3. The display device according to claim 1, wherein a channel formation region of the third transistor comprises a metal oxide comprising In and Zn.

4. The display device according to claim 1, wherein a channel formation region of the second transistor comprises a metal oxide comprising In and Zn.

5. The display device according to claim 1, wherein the display element is a liquid crystal element.

6. An electronic device comprising the display device according to claim 1.

7. The display device according to claim 1, wherein the other of the source and the drain of the third transistor is directly connected to the display element.

8. A display device comprising a pixel, the pixel comprising:
a first transistor, a second transistor, a first capacitor, a second capacitor, and a display element,
wherein one of a source and a drain of the first transistor is electrically connected to one electrode of the first capacitor,
wherein the other electrode of the first capacitor is electrically connected to one of a source and a drain of the second transistor, one electrode of the second capacitor, and the display element,
wherein the one of the source and the drain of the second transistor is directly connected to the display element,
wherein the other of the source and the drain of the first transistor is electrically connected to a first wiring configured to supply image data, and
wherein the other of the source and the drain of the second transistor is electrically connected to a second wiring configured to supply correction data.

9. The display device according to claim 8, wherein a channel formation region of the second transistor comprises a metal oxide comprising In and Zn.

10. The display device according to claim 8, wherein the display element is a liquid crystal element.

11. An electronic device comprising the display device according to claim 8.

12. A display device comprising a pixel, the pixel comprising:
a first transistor, a second transistor, a first capacitor, and a display element,
wherein one of a source and a drain of the first transistor is electrically connected to one electrode of the first capacitor,
wherein the other electrode of the first capacitor is electrically connected to one of a source and a drain of the second transistor and the display element,
wherein the one of the source and the drain of the second transistor is directly connected to the display element,
wherein the other of the source and the drain of the first transistor is electrically connected to a first wiring configured to supply image data, and wherein the other of the source and the drain of the second transistor is electrically connected to a second wiring configured to supply correction data.

13. The display device according to claim 12, wherein a channel formation region of the second transistor comprises a metal oxide comprising In and Zn.

14. The display device according to claim 12, wherein the display element is a liquid crystal element.

15. An electronic device comprising the display device according to claim 12.

* * * * *